United States Patent
Zilber et al.

(10) Patent No.: US 7,192,796 B2
(45) Date of Patent: Mar. 20, 2007

(54) METHODS AND APPARATUS FOR PACKAGING INTEGRATED CIRCUIT DEVICES

(75) Inventors: Gil Zilber, Ramat Gan (IL); Julia Aksenton, Jerusalem (IL); Vage Oganesian, Bet-Shemesh (IL)

(73) Assignee: Tessera Technologies Hungary Kft. (HU)

( * ) Notice: Subject to any disclaimer, the term of this patent is extended or adjusted under 35 U.S.C. 154(b) by 0 days.

(21) Appl. No.: 10/884,058

(22) Filed: Jul. 2, 2004

(65) Prior Publication Data
US 2005/0104179 A1    May 19, 2005

Related U.S. Application Data

(60) Provisional application No. 60/485,036, filed on Jul. 3, 2003.

(51) Int. Cl.
*H01L 21/44* (2006.01)
*H01L 21/48* (2006.01)
*H01L 21/50* (2006.01)

(52) U.S. Cl. ................. 438/26; 438/64; 438/113; 257/E21.499

(58) Field of Classification Search ............ 438/26, 438/64, 113
See application file for complete search history.

(56) References Cited

U.S. PATENT DOCUMENTS

| | | | |
|---|---|---|---|
| 2,507,956 A | 5/1950 | Bruno et al. | |
| 2,796,370 A | 6/1957 | Ostrander et al. | |
| 2,851,385 A | 9/1958 | Spruance et al. | |
| 3,648,131 A * | 3/1972 | Stuby | 257/622 |
| 3,761,782 A * | 9/1973 | Youmans | 257/778 |
| 3,981,023 A | 9/1976 | King et al. | |
| 4,259,679 A | 3/1981 | Knibb et al. | |
| 4,279,690 A | 7/1981 | Dierschke | |
| 4,339,689 A | 7/1982 | Yamanaka et al. | |
| 4,551,629 A | 11/1985 | Carson et al. | |
| 4,764,846 A | 8/1988 | Go | |
| 4,794,092 A | 12/1988 | Solomon | |
| 4,797,179 A | 1/1989 | Watson et al. | |
| 4,862,249 A | 8/1989 | Carlson | |

(Continued)

FOREIGN PATENT DOCUMENTS

JP    11 326366    2/2000

(Continued)

OTHER PUBLICATIONS

Patent Abstract of Japan vol. 2000, No. 02, Feb. 29, 2000, & JP 11 326366.

(Continued)

*Primary Examiner*—David A. Zarneke
(74) *Attorney, Agent, or Firm*—Lerner, David, Littenberg, Krumholz & Mentlik, LLP

(57) ABSTRACT

An integrally packaged integrated circuit device including an integrated circuit die including a crystalline substrate having first and second generally planar surfaces and edge surfaces and semiconductor circuitry formed over the first generally planar surface, at least one chip scale packaging layer formed over the semiconductor circuitry and the first generally planar surface, an insulation layer formed over the second generally planar surface and the edge surfaces and at least one electrical conductor formed directly on the insulation layer overlying the second generally planar surface, the at least one electrical conductor being connected to the circuitry by at least one pad formed directly on the first generally planar surface.

23 Claims, 57 Drawing Sheets

U.S. PATENT DOCUMENTS

| | | | |
|---|---|---|---|
| 4,933,601 A | 6/1990 | Sagawa et al. | |
| 4,984,358 A | 1/1991 | Nelson | |
| 5,037,779 A | 8/1991 | Whalley et al. | |
| 5,104,820 A | 4/1992 | Go et al. | |
| 5,118,924 A | 6/1992 | Mehra et al. | |
| 5,124,543 A | 6/1992 | Kawashima | |
| 5,126,286 A | 6/1992 | Chance | |
| 5,177,753 A | 1/1993 | Tanaka | |
| 5,250,462 A | 10/1993 | Sasaki et al. | |
| 5,266,501 A | 11/1993 | Imai | |
| 5,266,833 A | 11/1993 | Capps | |
| 5,321,303 A | 6/1994 | Kawahara et al. | |
| 5,455,386 A | 10/1995 | Brathwaite et al. | |
| 5,500,540 A | 3/1996 | Jewell et al. | |
| 5,526,449 A | 6/1996 | Meade et al. | |
| 5,546,654 A | 8/1996 | Wojnarowski et al. | |
| 5,567,657 A | 10/1996 | Wojnarowski et al. | |
| 5,595,930 A | 1/1997 | Baek | |
| 5,612,570 A | 3/1997 | Eide et al. | |
| 5,657,206 A | 8/1997 | Pedersen et al. | |
| 5,661,087 A | 8/1997 | Pedersen et al. | |
| 5,672,519 A | 9/1997 | Song et al. | |
| 5,675,180 A | 10/1997 | Pedersen et al. | |
| 5,677,200 A | 10/1997 | Park et al. | |
| 5,703,400 A | 12/1997 | Wojnarowski et al. | |
| 5,814,894 A | 9/1998 | Igarashi et al. | |
| 5,817,541 A | 10/1998 | Averkiou et al. | |
| 5,837,562 A | 11/1998 | Cho | |
| 5,837,566 A | 11/1998 | Pedersen et al. | |
| 5,849,623 A | 12/1998 | Wojnarowski et al. | |
| 5,857,858 A | 1/1999 | Gorowitz et al. | |
| 5,859,475 A | 1/1999 | Freyman et al. | |
| 5,869,353 A | 2/1999 | Levy et al. | |
| 5,888,884 A | 3/1999 | Wojnarowski | |
| 5,891,761 A | 4/1999 | Vindasius et al. | |
| 5,900,674 A | 5/1999 | Wojnarowski et al. | |
| 5,909,052 A | 6/1999 | Ohta et al. | |
| 5,910,687 A * | 6/1999 | Chen et al. | 257/784 |
| 5,938,452 A | 8/1999 | Wojnarowski | |
| 5,952,712 A | 9/1999 | Ikuina et al. | |
| 5,965,933 A | 10/1999 | Young et al. | |
| 5,985,695 A | 11/1999 | Freyman et al. | |
| 5,986,746 A | 11/1999 | Metz et al. | |
| 5,993,981 A | 11/1999 | Askinazi et al. | |
| 6,002,163 A | 12/1999 | Wojnarowski | |
| 6,020,217 A | 2/2000 | Kuisi et al. | |
| 6,046,410 A | 4/2000 | Wojnarowski et al. | |
| 6,072,236 A | 6/2000 | Akram et al. | |
| 6,080,596 A | 6/2000 | Vintasius et al. | |
| 6,083,766 A | 7/2000 | Chen | |
| 6,087,586 A | 7/2000 | Chen | |
| 6,092,280 A | 7/2000 | Wojnarowski | |
| 6,098,278 A | 8/2000 | Vindasius et al. | |
| 6,106,735 A | 8/2000 | Kurle et al. | |
| 6,124,179 A * | 9/2000 | Adamic, Jr. | 438/309 |
| 6,124,637 A | 9/2000 | Freyman et al. | |
| 6,134,118 A | 10/2000 | Pedersen et al. | |
| 6,221,751 B1 * | 4/2001 | Chen et al. | 438/612 |
| 6,235,141 B1 | 5/2001 | Feldman et al. | |
| 6,265,763 B1 | 7/2001 | Jao et al. | |
| 6,326,689 B1 * | 12/2001 | Thomas | 257/734 |
| 6,429,036 B1 * | 8/2002 | Nixon et al. | 438/57 |
| 6,548,911 B2 | 4/2003 | Yu et al. | |
| 6,562,647 B2 * | 5/2003 | Zandman et al. | 438/33 |
| 6,607,941 B2 * | 8/2003 | Prabhu et al. | 438/113 |
| 6,624,505 B2 | 9/2003 | Badehi | |
| 6,646,289 B1 | 11/2003 | Badehi | |
| 6,768,190 B2 | 7/2004 | Yang et al. | |
| 6,903,012 B2 * | 6/2005 | Geefay et al. | 438/667 |
| 6,982,475 B1 * | 1/2006 | MacIntyre | 257/620 |
| 2002/0016024 A1 * | 2/2002 | Thomas | 438/113 |
| 2006/0091488 A1 * | 5/2006 | Kang | 257/433 |

FOREIGN PATENT DOCUMENTS

| | | |
|---|---|---|
| WO | WO 85/02283 | 5/1985 |
| WO | WO 89/04113 | 5/1989 |
| WO | WO 95/19645 | 7/1995 |
| WO | WO 96/19645 | 6/1996 |
| WO | WO-99/40624 | 8/1999 |

OTHER PUBLICATIONS

"First Three-Chip Staked CSP Developed", Semiconductor International, Jan. 2000, p. 22.

"High Density Pixel Detector Module Using Flip Chip and Thin Film Technology", J. Wolf, et al, International System Packaging Symposium, Jan. 1999, San Diego.

A. Fan, et al, "Copper Wafer Bonding", Electrochemical and Solid-State Letters 2(10) 534-536, 1999.

* cited by examiner

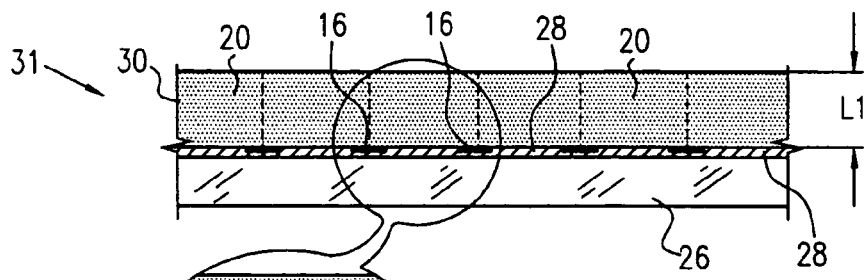
FIG. 3A
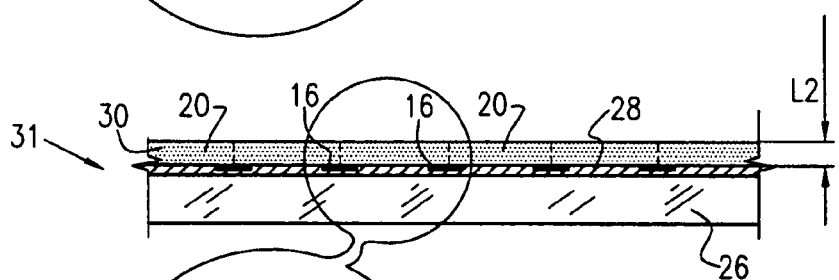
FIG. 3B
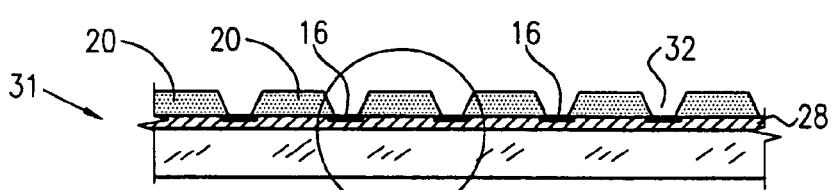
FIG. 3C
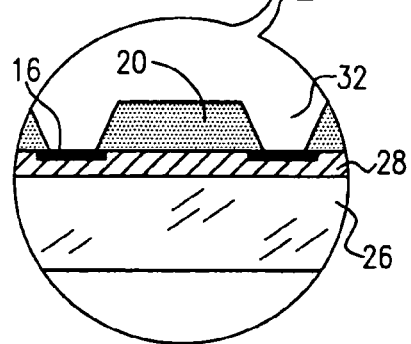

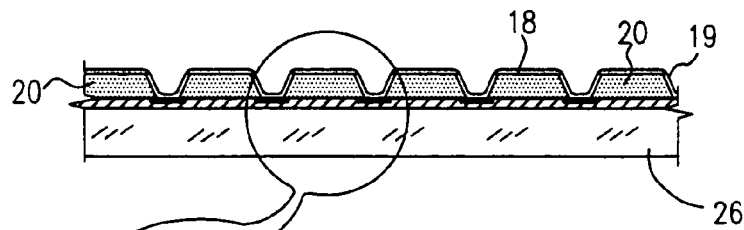
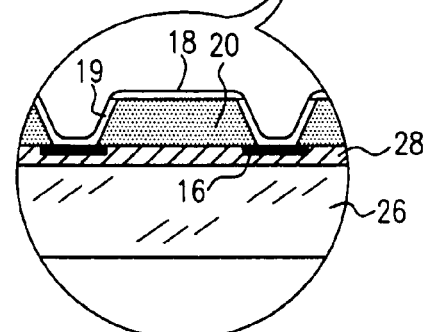
FIG. 3D
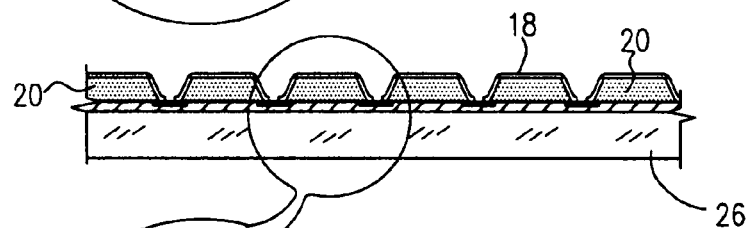
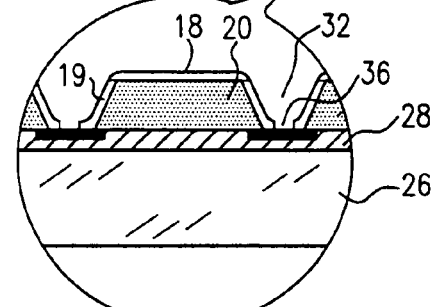
FIG. 3E
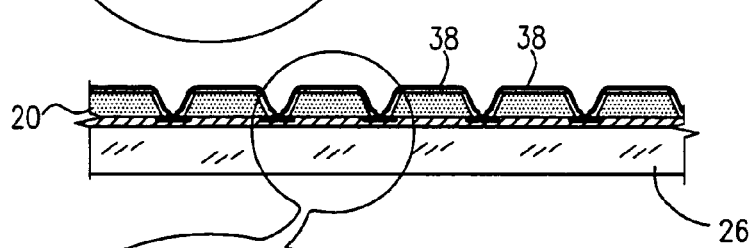
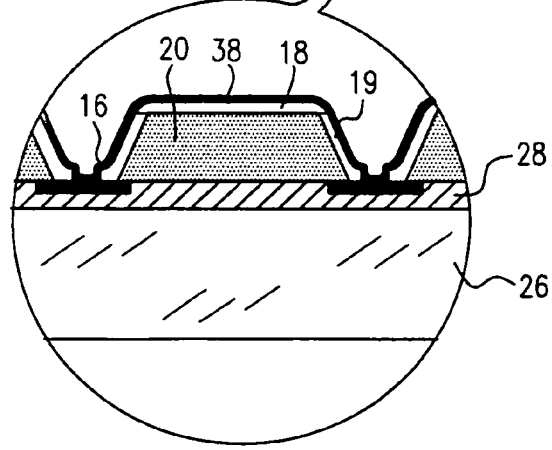
FIG. 3F

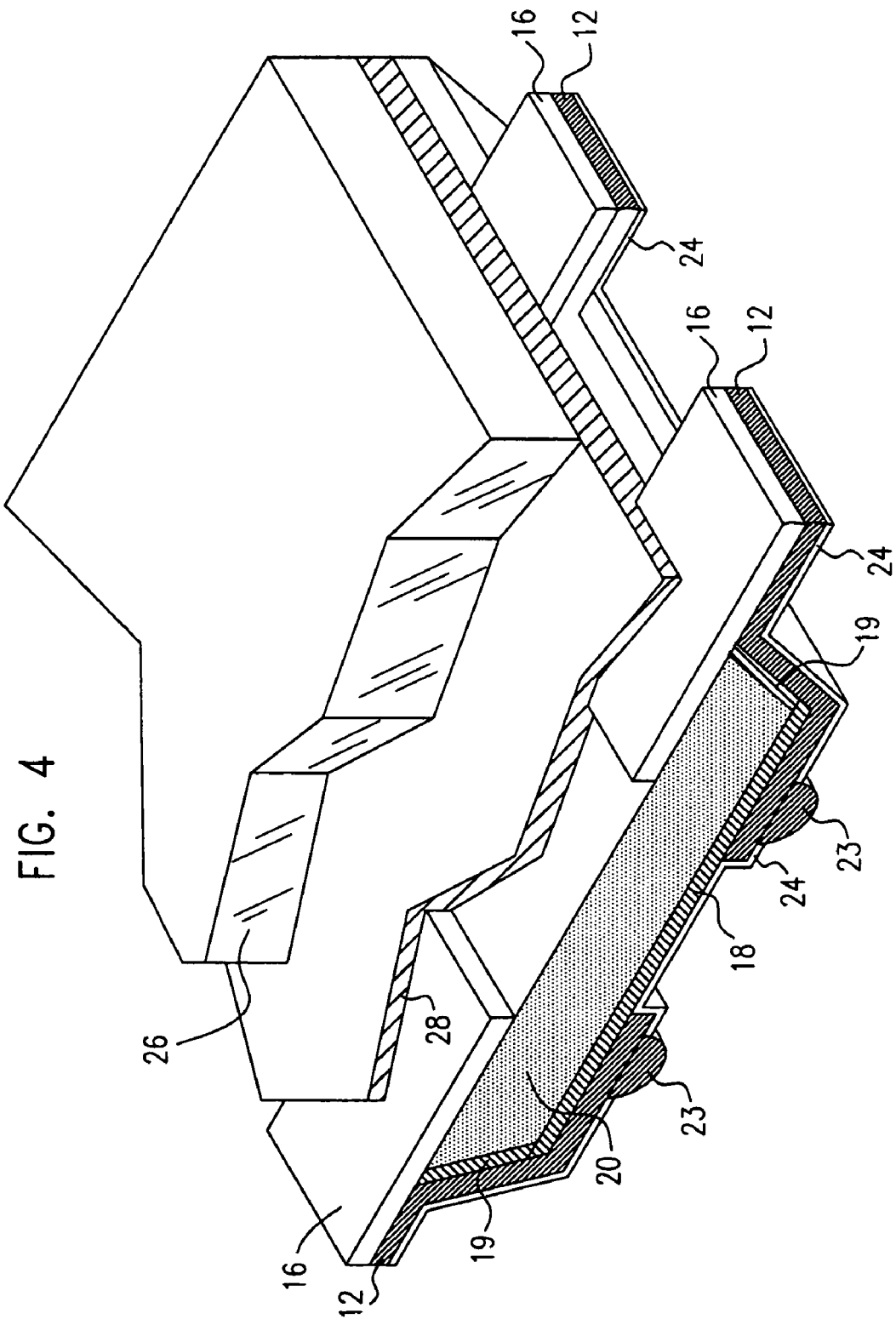

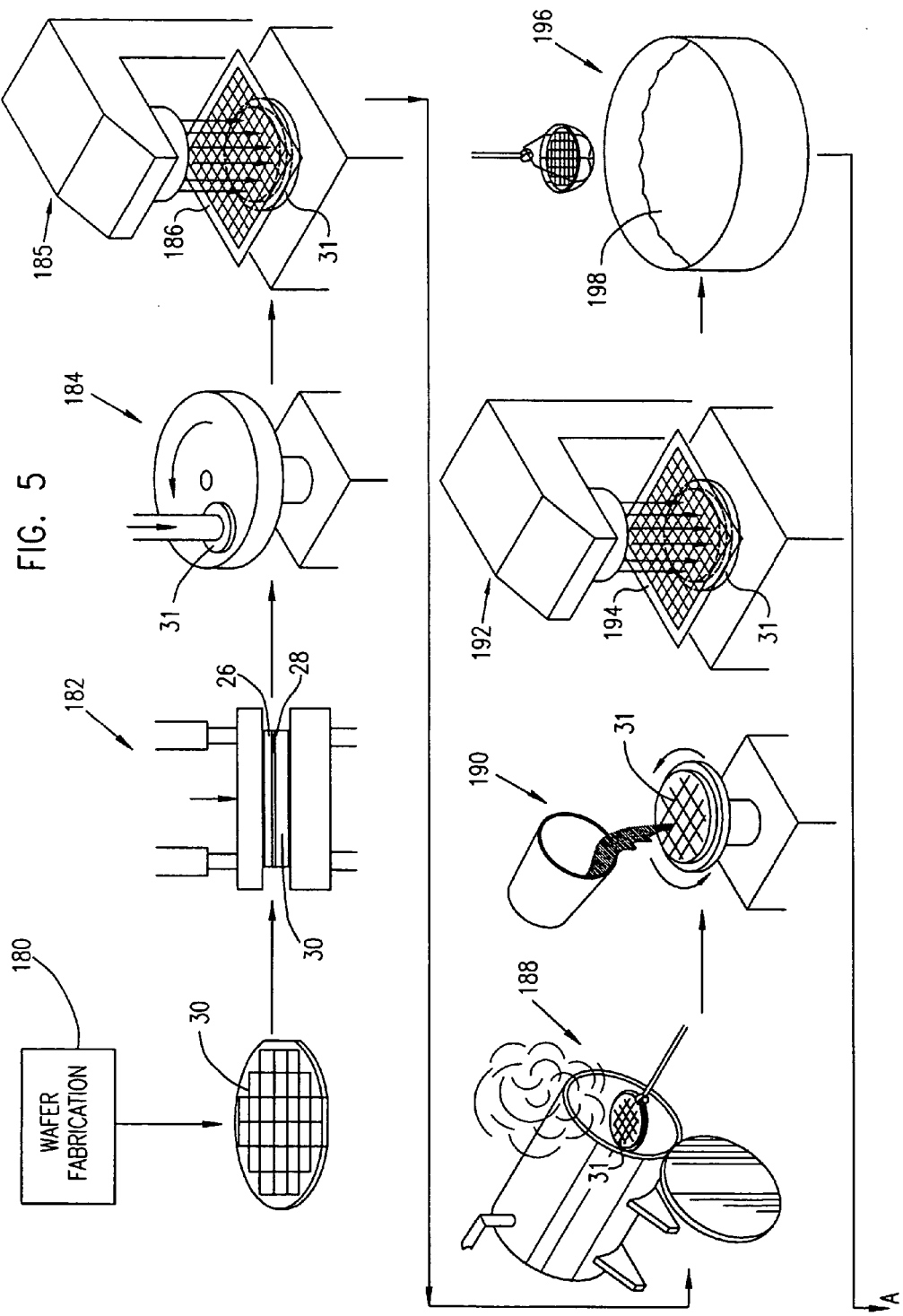

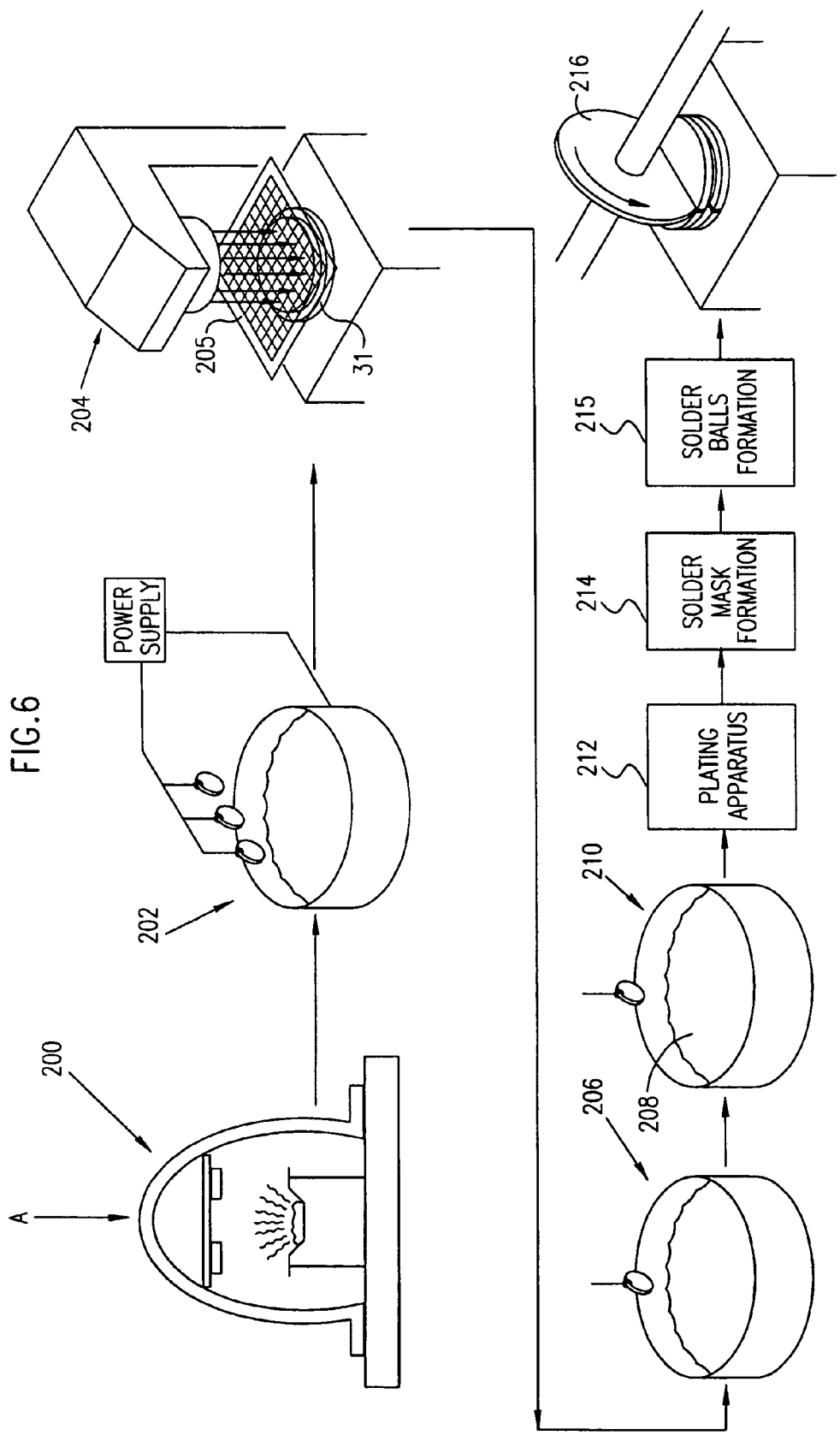

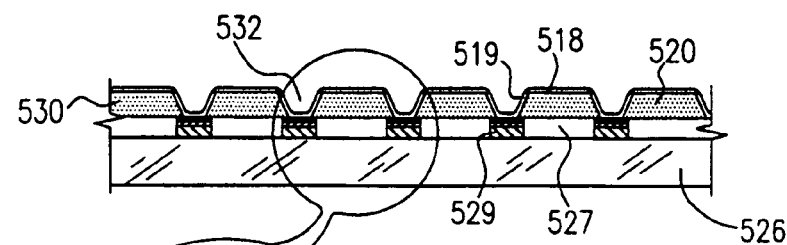
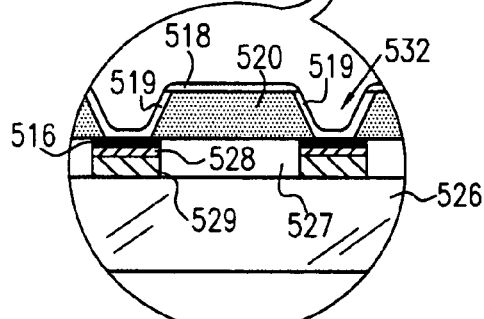
FIG. 13D
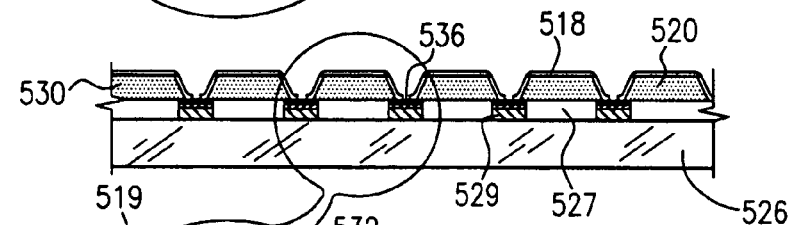
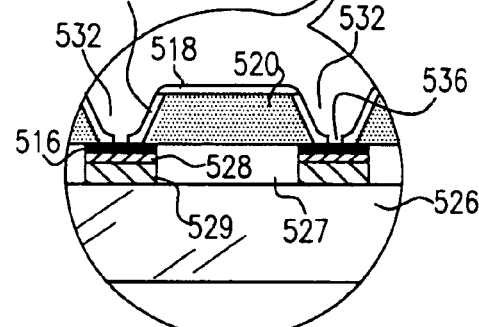
FIG. 13E
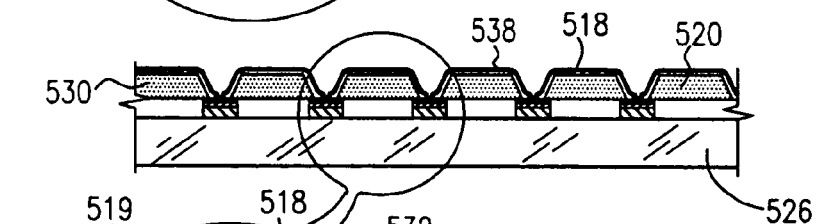
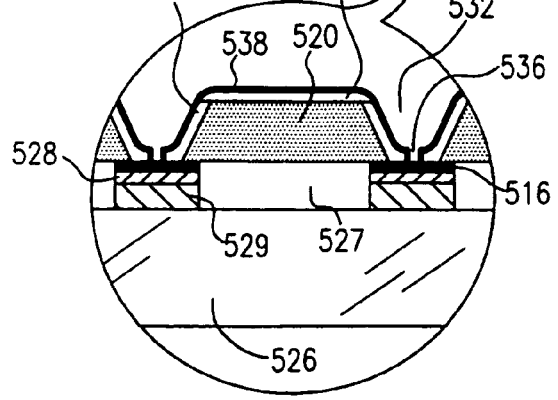
FIG. 13F

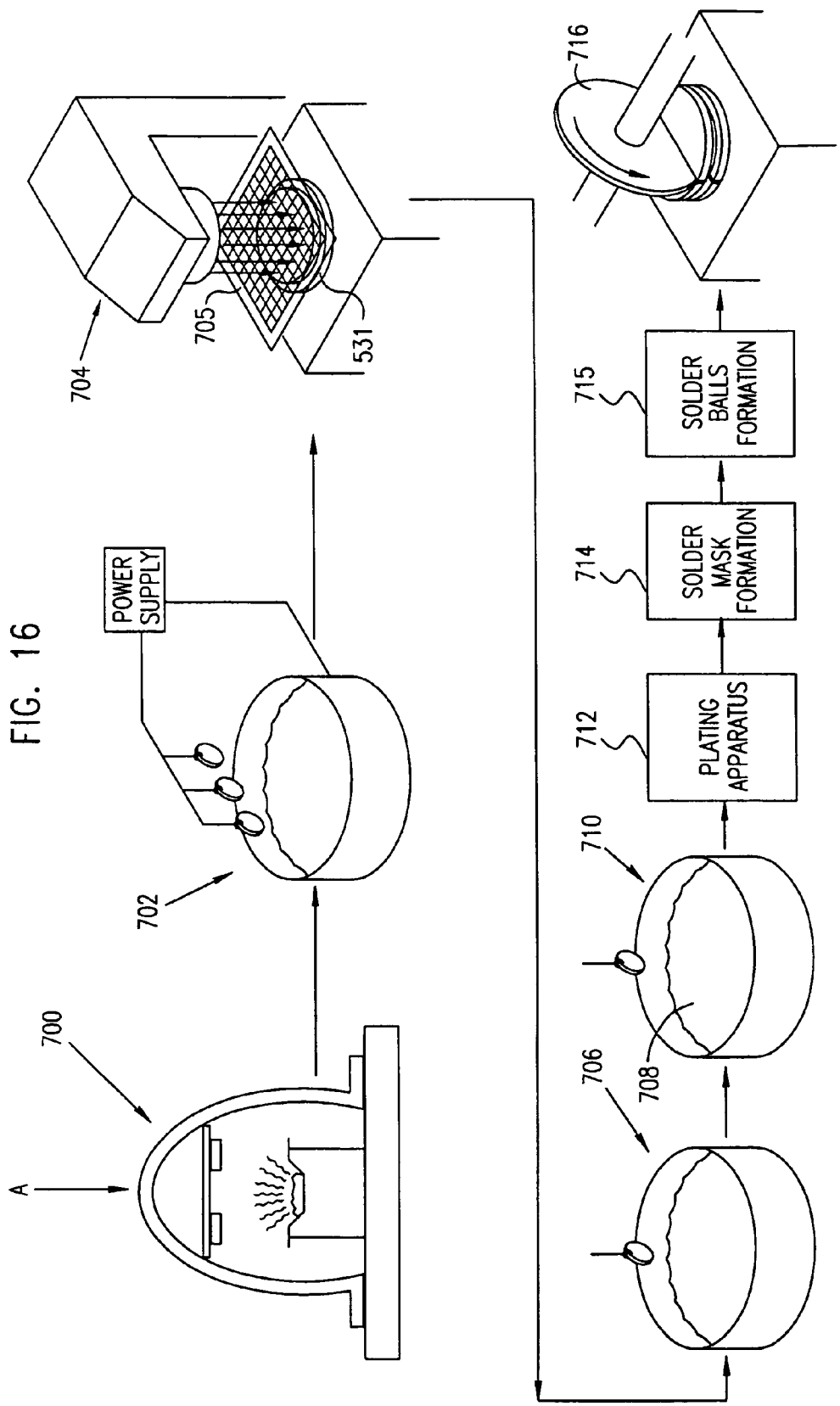

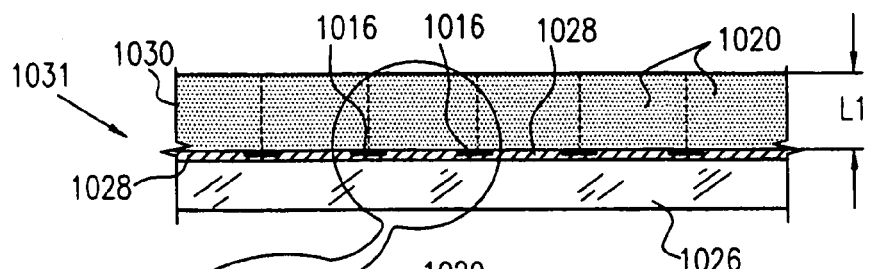
FIG. 23A
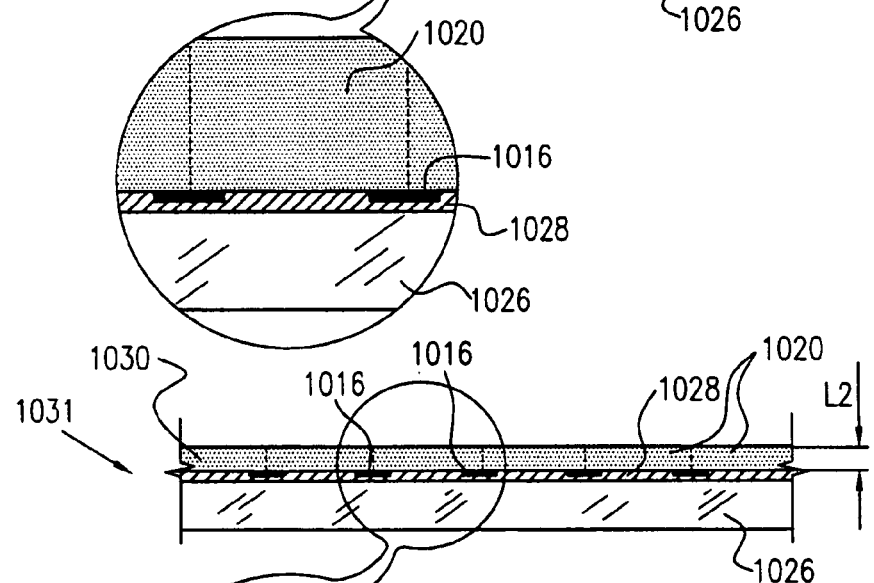
FIG. 23B
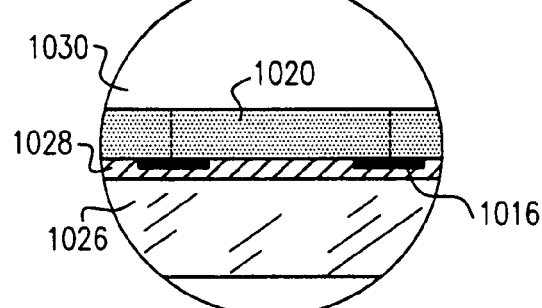
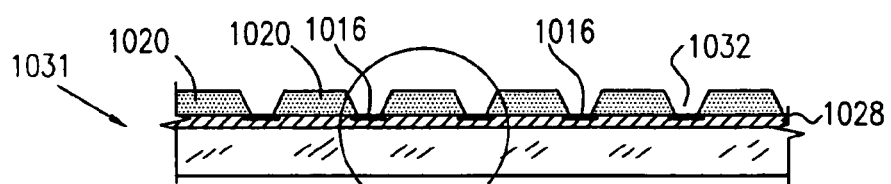
FIG. 23C
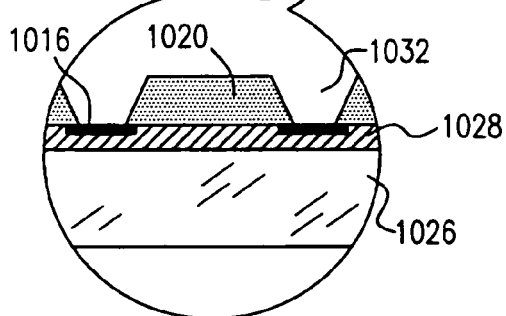

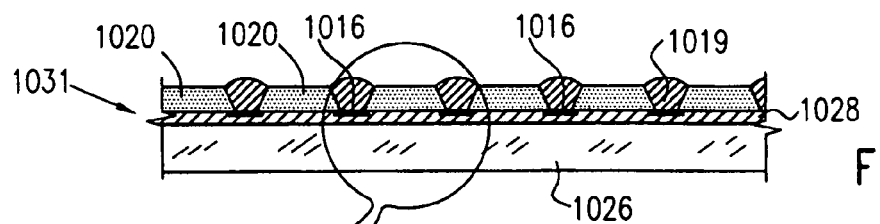
FIG. 23D
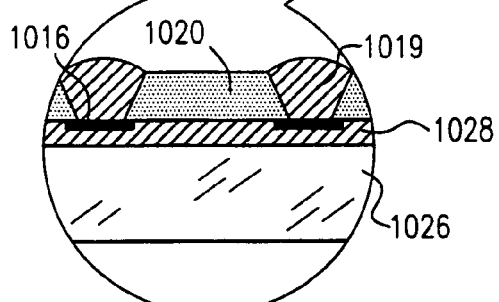
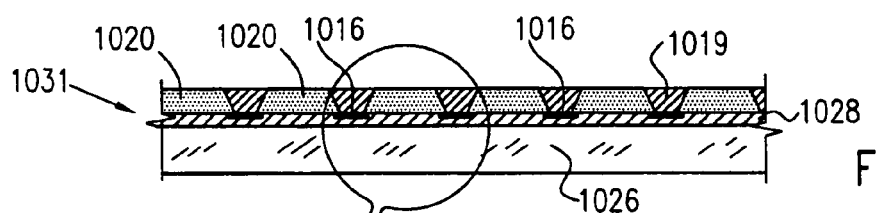
FIG. 23E
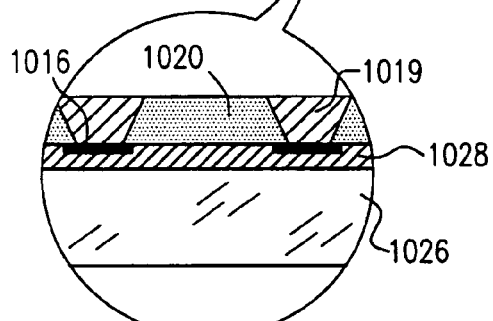
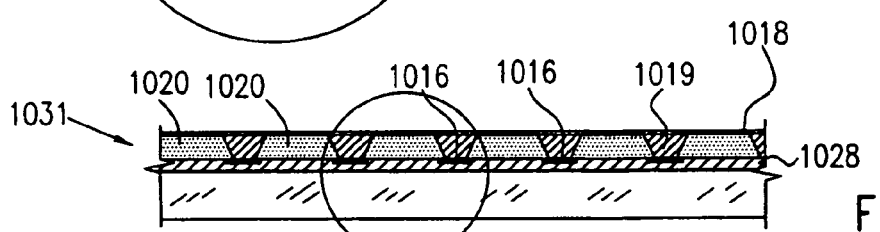
FIG. 23F
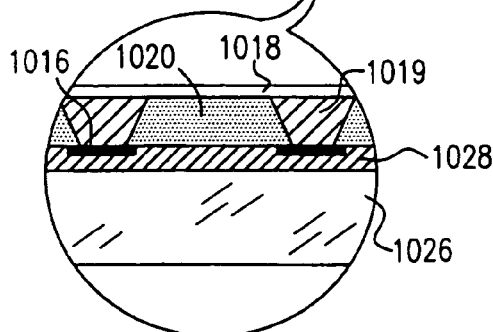

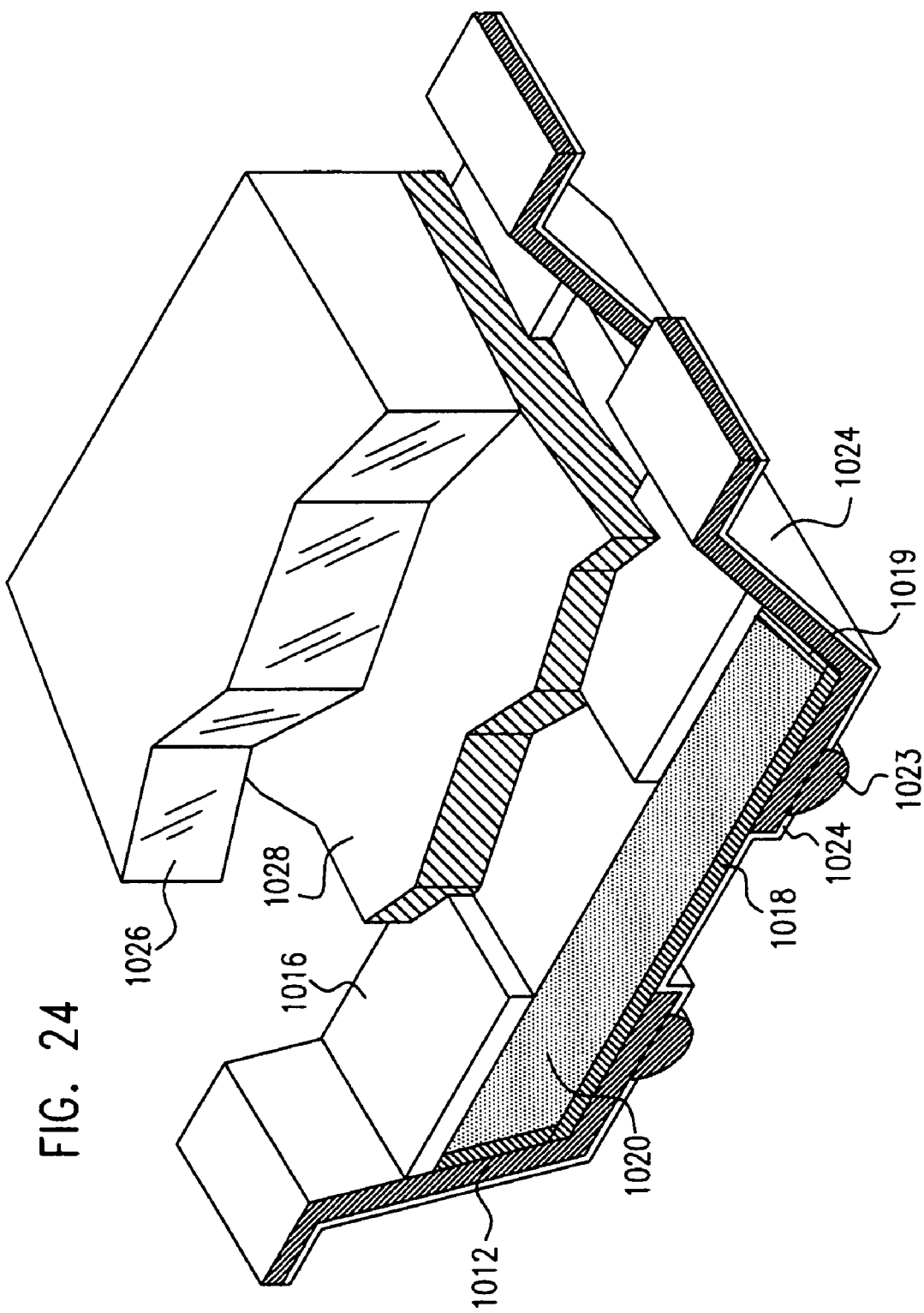

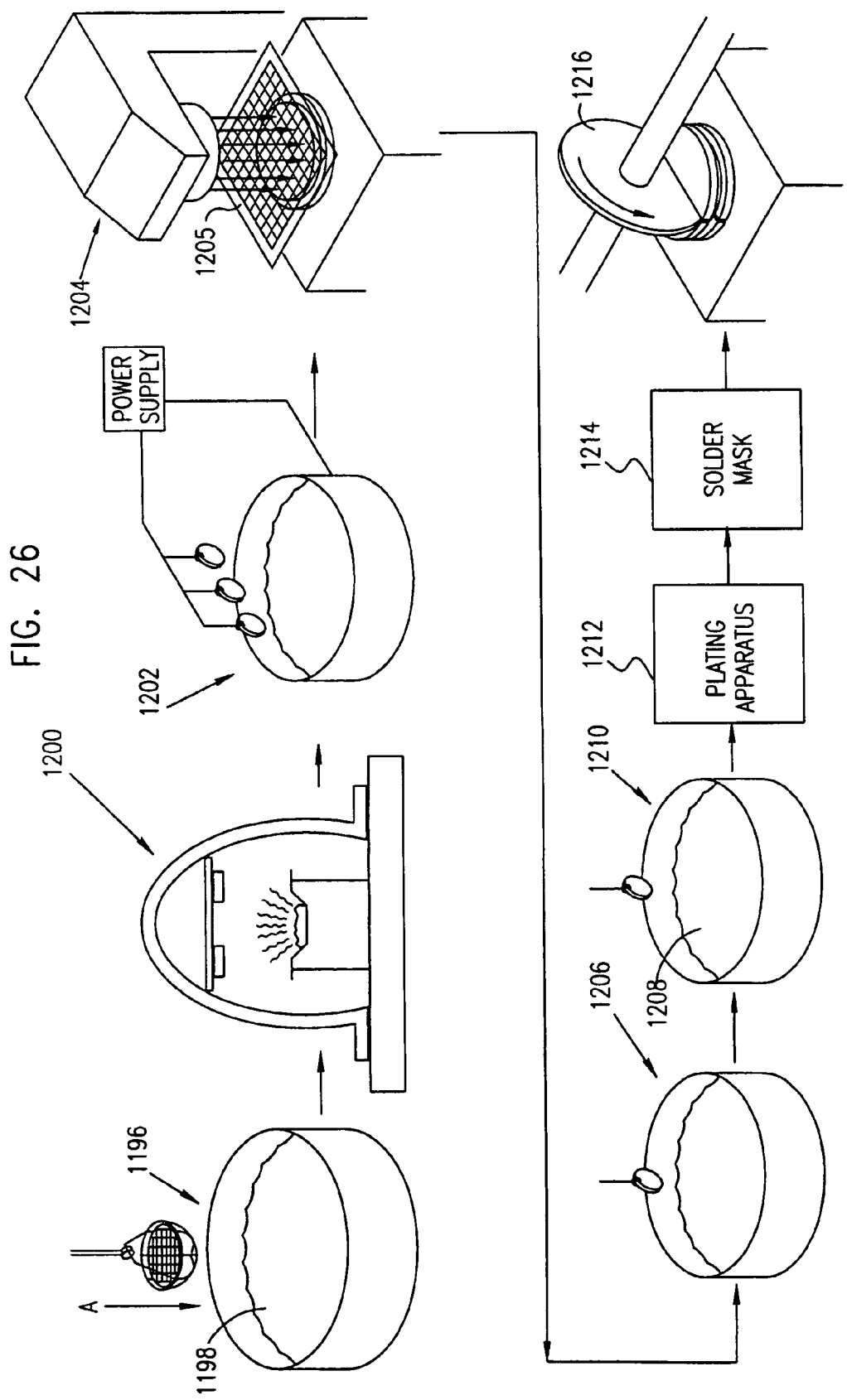

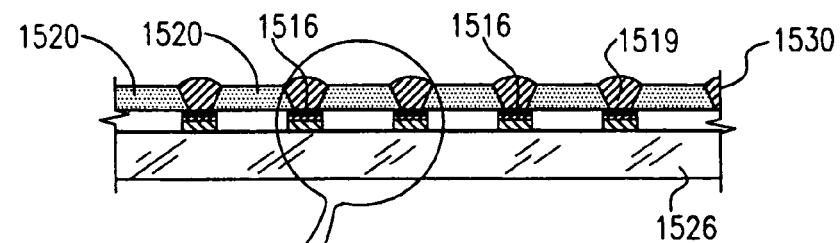
FIG. 33D
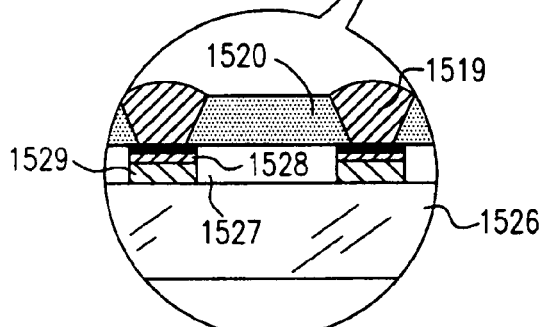
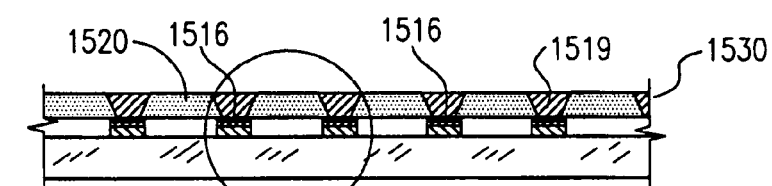
FIG. 33E
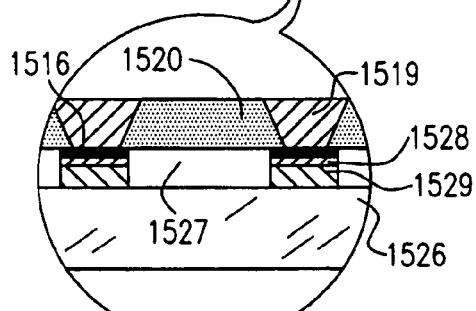
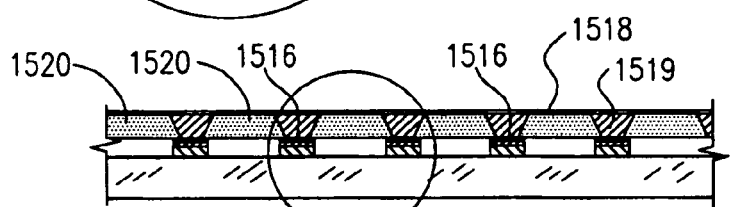
FIG. 33F
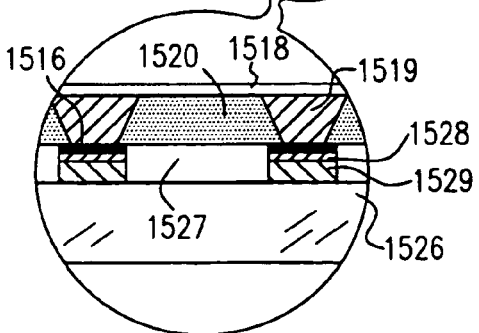

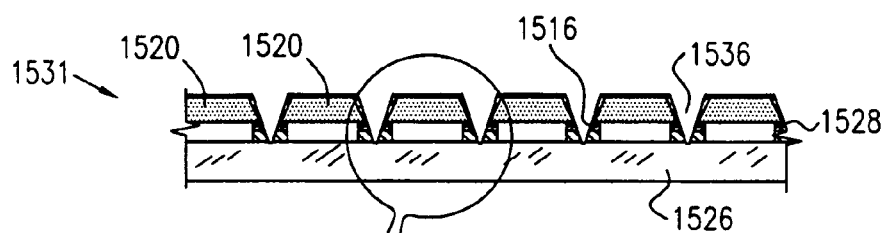
FIG. 33G
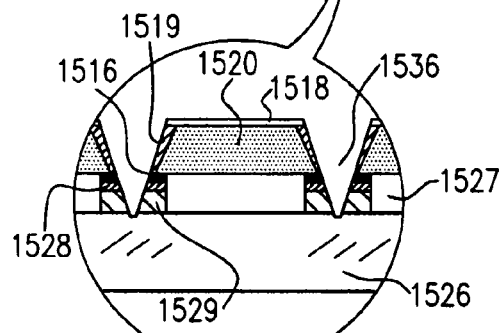
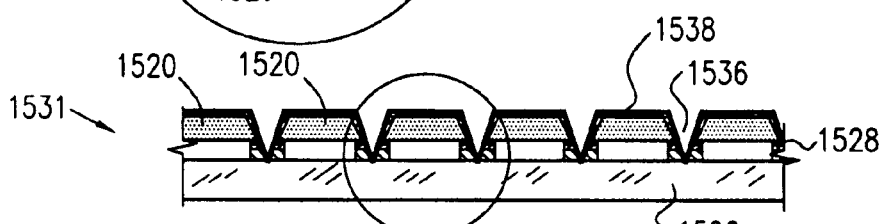
FIG. 33H
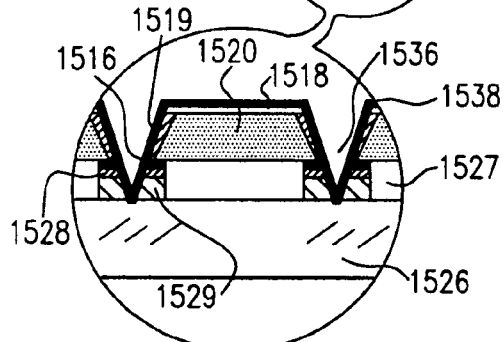
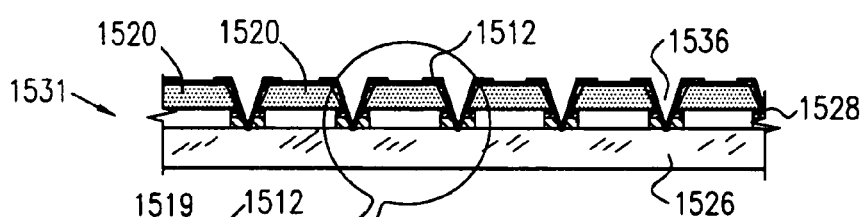
FIG. 33I

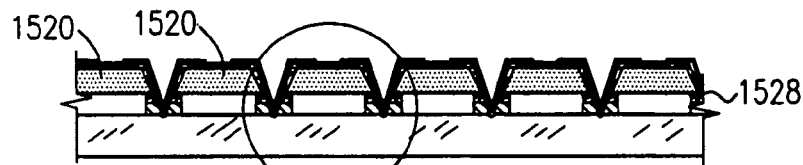
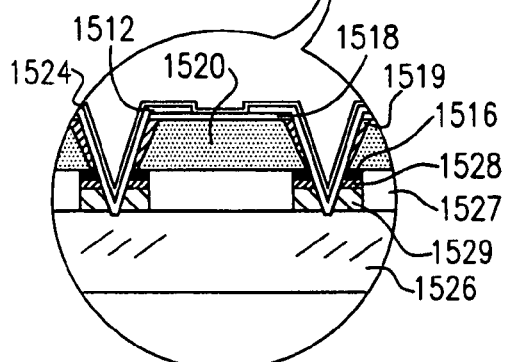
FIG. 33J
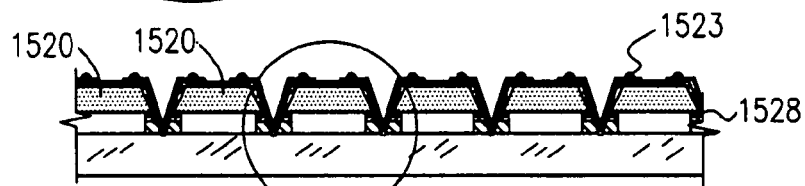
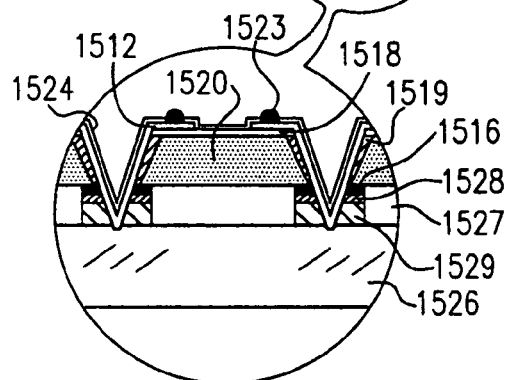
FIG. 33K
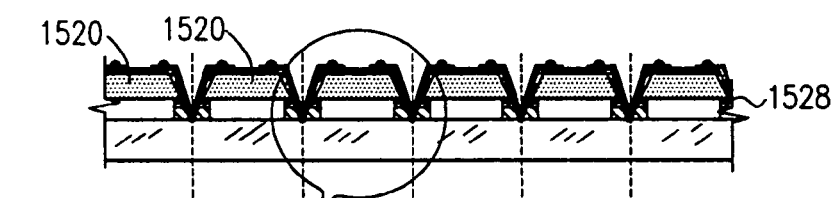
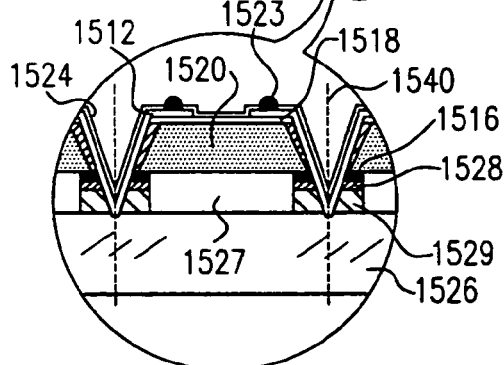
FIG. 33L

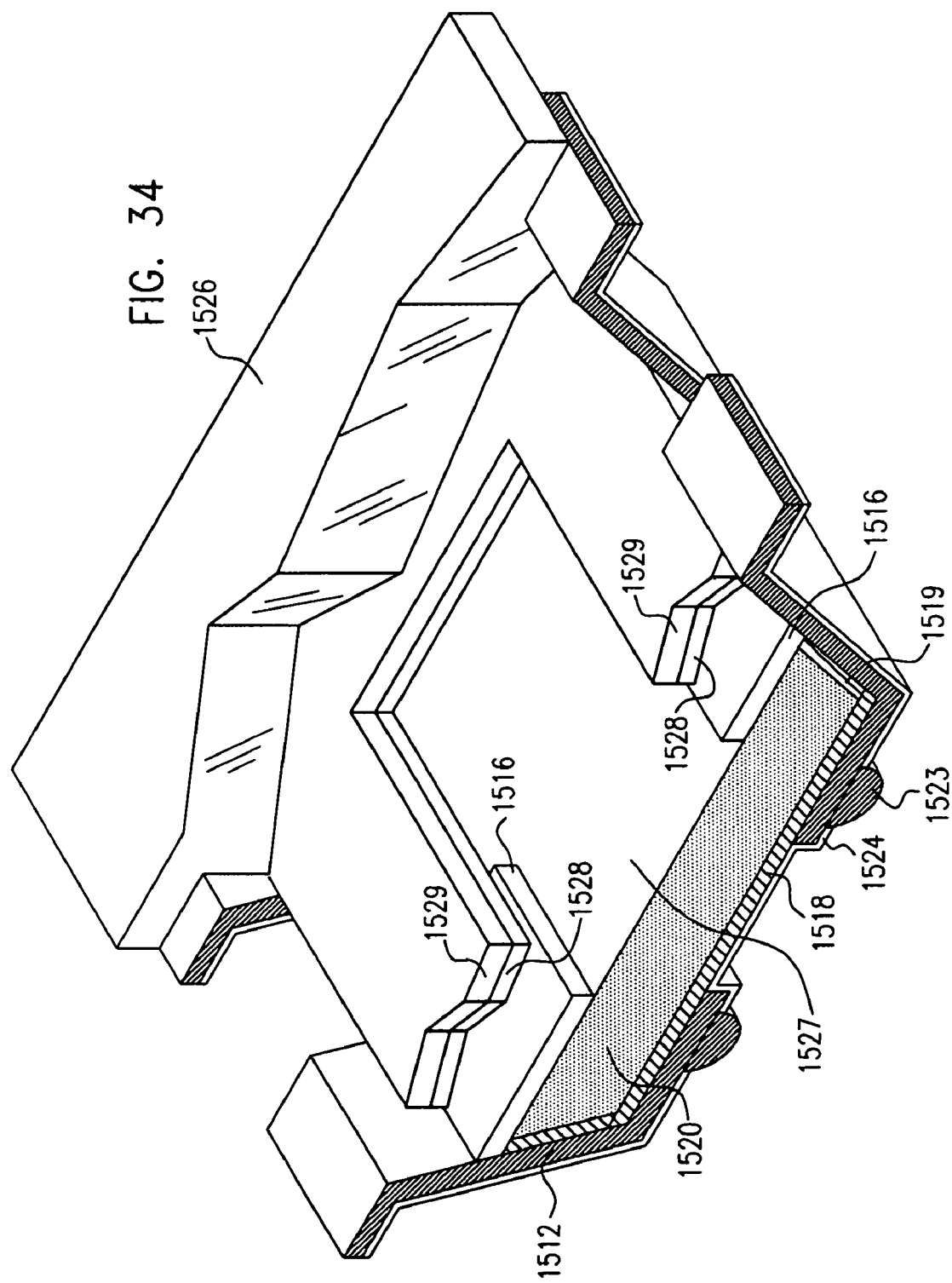

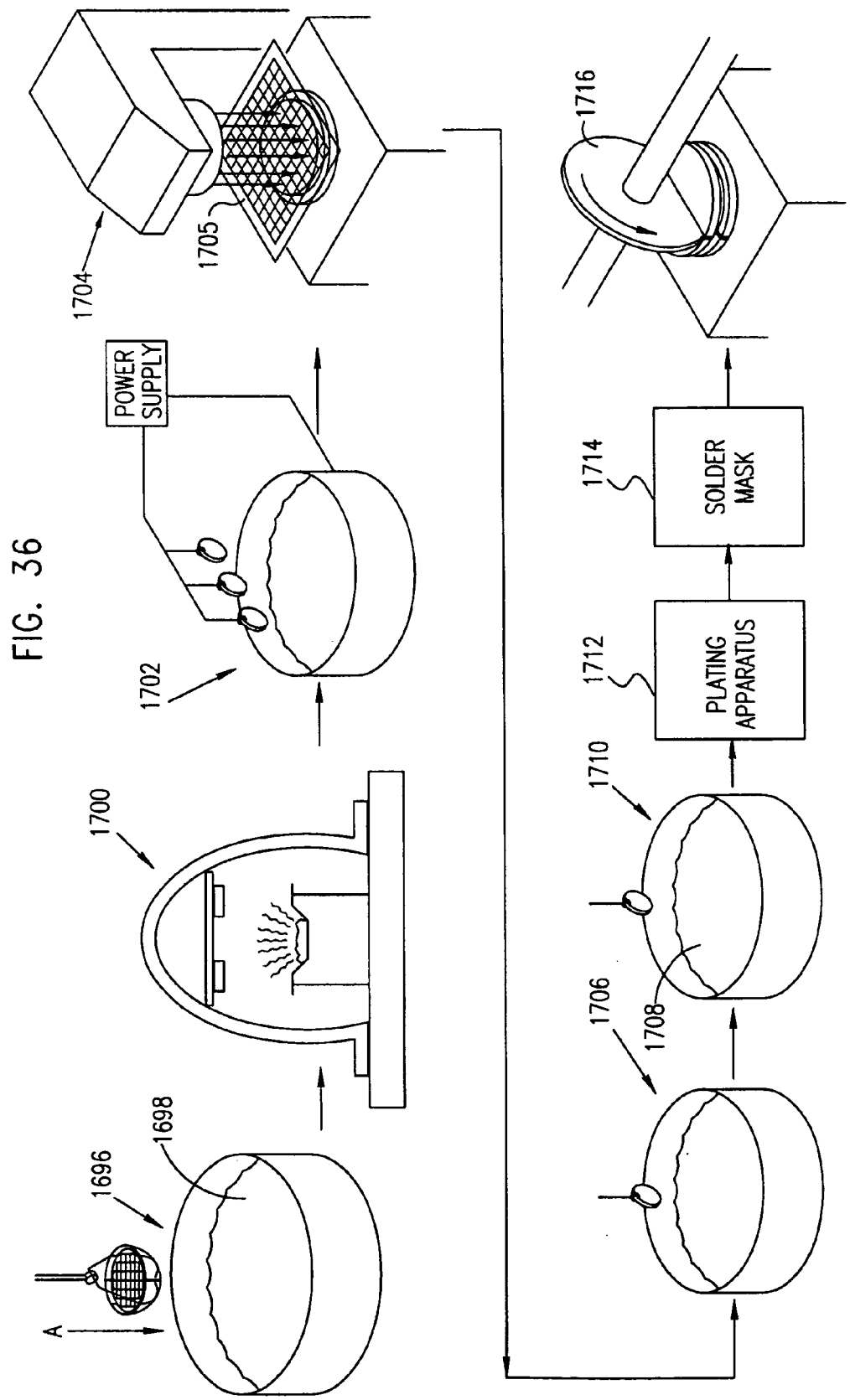

METHODS AND APPARATUS FOR PACKAGING INTEGRATED CIRCUIT DEVICES

FIELD OF THE INVENTION

The present invention relates to methods and apparatus for producing integrated circuit devices and to integrated circuit devices produced thereby and more particularly to an integrally packaged die.

BACKGROUND OF THE INVENTION

An essential step in the manufacture of all integrated circuit devices is known as "packaging" and involves mechanical and environmental protection of a silicon chip that is at the heart of the integrated circuit as well as electrical interconnection between predetermined locations on the silicon chip and external electrical terminals.

At present three principal technologies are employed for packaging semiconductors: wire bonding, tape automatic bonding (TAB) and flip chip.

Wire bonding employs heat and ultrasonic energy to weld gold bonding wires between bond pads on the chip and contacts on the package.

Tape automatic bonding (TAB) employs a copper foil tape instead of bonding wire. The copper foil tape is configured for each specific die and package combination and includes a pattern of copper traces suited thereto. The individual leads may be connected individually or as a group to the various bond pads on the chip.

Flip chips are integrated circuit dies which have solder balls formed on top of the bonding pads, thus allowing the die to be "flipped" circuit side down and directly soldered to a substrate. Wire bonds are not required and considerable savings in package spacing may be realized.

The above-described technologies each have certain limitations. Both wire bonding and TAB bonding are prone to bad bond formation and subject the die to relatively high temperatures and mechanical pressures. Both wire bond and TAB technologies are problematic from a package size viewpoint, producing integrated circuit devices having a die-to-package area ratio ranging from about 10% to 60%.

The flip-chip does not provide packaging but rather only interconnection. The interconnection encounters problems of uniformity in the solder balls as well as in thermal expansion mismatching, which limits available substrates to silicon or to materials which have thermal expansion characteristics similar to those of silicon.

Optronic packages for semiconductors are known. Conventional optronic packages used for imaging employ a ceramic housing onto which is sealingly mounted a transparent window. Optronic packages used for low-level imaging, light emission and radiation detection, including light detection, employ a clear plastic enclosure.

Conventional semiconductor packaging terminology has defined the term chip scale packaging to include any packaging process with a ratio of packaging to die less than or equal to 1.2:1. Additionally, the packaging layer conventionally provides protection to the encased semiconductor or integrated circuit.

Described in applicant's published PCT Application WO 95/19645 are methods and apparatus for producing integrated circuit devices, including, inter alia, integrally packaged dies having a radiation transparent protective layer.

SUMMARY OF THE INVENTION

The present invention seeks to provide optronic integrated circuit devices that are extremely compact as well as apparatus and techniques for the production thereof.

There is thus provided in accordance with a preferred embodiment of the present invention an integrally packaged optronic integrated circuit device including an integrated circuit die, at least one chip scale packaging layer formed over the semiconductor circuitry and the first generally planar surface and at least one electrical conductor overlying the second generally planar surface, the at least one electrical conductor being connected to the circuitry by at least one pad formed directly on the first generally planar surface. The integrated circuit die includes a crystalline substrate having first and second generally planar surfaces and edge surfaces and optronic semiconductor circuitry formed over the first generally planar surface;

There is also provided in accordance with another preferred embodiment of the present invention an integrally packaged optronic integrated circuit device including an integrated circuit die, the integrated circuit die including a crystalline substrate having first and second generally planar surfaces and edge surfaces and optronic semiconductor circuitry formed over the first generally planar surface, at least one chip scale packaging layer formed over the semiconductor circuitry and the first generally planar surface and at least one electrical conductor overlying at least one of the edge surfaces, the at least one electrical conductor being connected to the circuitry by at least one pad formed directly on the first generally planar surface.

In accordance with a preferred embodiment of the present invention the at least one chip scale packaging layer is formed of at least one of glass, quartz and sapphire.

In accordance with a preferred embodiment of the present invention the integrally packaged optronic integrated circuit device also includes an insulation layer formed over the second generally planar surface and the edge surfaces and underlying the at least one electrical conductor. In accordance with another preferred embodiment of the present invention the insulation layer includes a mechanically conforming layer In accordance with yet another preferred embodiment of the present invention the at least one electrical conductor is connected to the at least one pad via a portion of the electrical conductor which extends generally parallel to and in touching electrical engagement with a planar surface of the at least one pad. Alternatively, the at least one electrical conductor is connected to the at least one pad via a portion of the electrical conductor which extends in touching electrical engagement with an edge of the at least one pad.

In accordance with a further preferred embodiment of the present invention the at least one chip scale packaging layer is adhered to the first generally planar surface by bonding layer. In accordance with a still further preferred embodiment of the present invention the bonding layer has spectral filter functionality.

In accordance with a preferred embodiment of the present invention the integrally packaged optronic integrated circuit device also includes at least one spectral filter associated with a radiation transparent protective surface. Preferably, the radiation transparent protective surface includes at least one of a top surface and an edge surface. In accordance with another preferred embodiment of the present invention the integrally packaged optronic integrated circuit device also includes color array filters. In accordance with yet another preferred embodiment of the present invention the integrally packaged optronic integrated circuit device also includes at least one lens integrally formed on a transparent protective surface thereof. In accordance with still another preferred embodiment of the present invention the at least one chip scale packaging layer comprises at least one lens. In accordance with a further preferred embodiment of the present invention the at least one lens is maintained at a precisely fixed distance with respect to the optronic semiconductor circuitry In accordance with a still further preferred embodiment of the present invention the integrally packaged optronic integrated circuit device also includes light coupling bumps formed on a transparent protective surface thereof. In accordance with yet a further preferred embodiment of the present invention the integrally packaged optronic integrated circuit device also includes a waveguide and other optical components integrally formed on a transparent protective surface thereof.

In accordance with another preferred embodiment of the present invention the integrally packaged optronic integrated circuit device also includes an optical grating formed onto a transparent protective surface thereof. In accordance with yet another preferred embodiment of the present invention the integrally packaged optronic integrated circuit device also includes a polarizer integrated therewith.

In accordance with a still another preferred embodiment of the present invention the integrally packaged optronic integrated circuit device also includes a trench formed between different elements on the integrated circuit die. In accordance with a further preferred embodiment of the present invention the integrally packaged optronic integrated circuit device also includes at least one gap formed between the crystalline substrate and the at least one packaging layer.

In accordance with a still further preferred embodiment of the present invention the at least one electrical conductor is connected to the at least one pad via a portion of the electrical conductor which extends generally parallel to and in touching electrical engagement with a planar surface of the at least one pad. Alternatively, in accordance with a preferred embodiment of the present invention the at least one electrical conductor is connected to the at least one pad via a portion of the electrical conductor which extends in touching electrical engagement with an edge of the at least one pad.

In accordance with another preferred embodiment of the present invention the integrally packaged optronic integrated circuit device also includes at least one spectral filter associated with a radiation transparent protective surface. In accordance with yet another preferred embodiment of the present invention the integrally packaged optronic integrated circuit device also includes color array filters. In accordance with still another preferred embodiment of the present invention the integrally packaged optronic integrated circuit device also includes at least one lens integrally formed on a transparent protective surface thereof. In accordance with a further preferred embodiment of the present invention the integrally packaged optronic integrated circuit device also includes light coupling bumps formed on a transparent protective surface thereof. In accordance with a still further preferred embodiment of the present invention the integrally packaged optronic integrated circuit device also includes a waveguide and other optical components integrally formed on a transparent protective surface thereof. In accordance with yet a further preferred embodiment of the present invention the integrally packaged optronic integrated circuit device also includes an optical grating formed onto a transparent protective surface thereof. In accordance with a still further preferred embodiment of the present invention the integrally packaged optronic integrated circuit device also includes a polarizer integrated therewith.

There is also provided in accordance with another preferred embodiment of the present invention a method of producing integrally packaged optronic integrated circuit devices including providing a plurality of integrated circuit dies formed on a wafer having first and second generally planar surfaces and optronic semiconductor circuitry formed over the first generally planar surface, forming at least one chip scale packaging layer over the semiconductor circuitry and the first generally planar surface, separating the integrated circuit dies from each other along dice lines defined in the second generally planar surface, so as to define edge surfaces of the dies while the dies remain attached to the packaging layer, forming at least one electrical conductor overlying the second generally planar surface, the at least one electrical conductor being connected to the circuitry by at least one pad formed directly on the first generally planar surface and subsequently dicing the wafer to define a plurality of packaged optronic integrated circuit devices.

There is further provided in accordance with another preferred embodiment of the present invention a method of producing integrally packaged optronic integrated circuit devices including providing a plurality of integrated circuit dies formed on a wafer having first and second generally planar surfaces and optronic semiconductor circuitry formed over said first generally planar surface, forming at least one chip scale packaging layer over the semiconductor circuitry and the first generally planar surface, separating the integrated circuit dies from each other along dice lines defined in the second generally planar surface, so as to define edge surfaces of the dies while the dies remain attached to the packaging layer, forming at least one electrical conductor overlying at least one of the edge surfaces, the at least one electrical conductor being connected to the circuitry by at least one pad formed directly on the first generally planar surface and subsequently dicing the wafer to define a plurality of packaged optronic integrated circuit devices.

In accordance with a preferred embodiment of the present invention the method of producing integrally packaged optronic integrated circuit devices also includes forming an insulation layer over the second generally planar surface and the edge surfaces and underlying the at least one electrical conductor. In accordance with another preferred embodiment of the present invention the insulation layer includes a mechanically conforming layer.

In accordance with yet another preferred embodiment of the present invention the forming at least one electrical conductor includes forming a portion of the at least one electrical conductor to be in touching electrical engagement with an edge of the at least one pad. Alternatively, said forming at least one electrical conductor includes forming a portion of said at least one electrical conductor generally parallel to and in touching electrical engagement with a planar surface of the at least one pad. In accordance with still another preferred embodiment of the present invention the forming at least one chip scale packaging layer comprises adhering the at least one chip scale packaging layer to the first generally planar surface using a bonding layer. Preferably, the bonding layer has spectral filter functionality. In accordance with yet another preferred embodiment of the present invention the forming the chip scale packaging layer also includes forming at least one spectral filter on a radiation transparent protective surface of the chip scale packaging layer. In accordance with still another preferred embodiment of the present invention the forming the chip scale packaging layer also includes forming color array filters on the chip scale packaging layer.

In accordance with a further preferred embodiment of the present invention the forming the chip scale packaging layer also includes integrally forming at least one lens on a radiation transparent protective surface of the chip scale packaging layer. In accordance with yet a further preferred embodiment of the present invention the forming the at least one lens comprises maintaining the at least one lens at a precise distance at a precisely fixed distance with respect to the optronic semiconductor circuitry.

In accordance with another further preferred embodiment of the present invention the forming the chip scale packaging layer also includes forming light coupling bumps on a radiation transparent protective surface of the chip scale packaging layer. In accordance with a still further preferred embodiment of the present invention the forming the chip scale packaging layer also includes forming a waveguide and other optical components on a radiation transparent protective surface of the chip scale packaging layer.

In accordance with yet a further preferred embodiment of the present invention the forming the chip scale packaging layer also includes forming an optical grating on a radiation transparent protective surface of the chip scale packaging layer. In accordance with another preferred embodiment of the present invention the forming the chip scale packaging layer also includes integrally forming a polarizer thereon.

In accordance with yet another preferred embodiment of the present invention the method of producing integrally packaged optronic integrated circuit devices also includes inserting a spacer element over the semiconductor circuitry and the first generally planar surface prior to the forming the chip scale packaging layer.

In accordance with a further preferred embodiment of the present invention the method of producing integrally packaged optronic integrated circuit devices also includes forming an insulation layer over the second generally planar surface and the edge surfaces and underlying the at least one electrical conductor. In accordance with a further preferred embodiment of the present invention the insulation layer includes a mechanically conforming layer.

In accordance with yet a further preferred embodiment of the present invention the forming at least one electrical conductor includes extending a portion of the at least one electrical conductor generally parallel to and in touching electrical engagement with a planar surface of the at least one pad. In accordance with a still further preferred embodiment of the present invention the forming at least one electrical conductor includes extending a portion of the at least one electrical conductor to be in touching electrical engagement with an edge of the at least one pad.

In accordance with another preferred embodiment of the present invention the forming at least one chip scale packaging layer includes adhering the at least one chip scale packaging layer to the first generally planar surface using bonding layer. In accordance with yet another preferred embodiment of the present invention the bonding layer has spectral filter functionality.

In accordance with a further preferred embodiment of the present invention the method of producing integrally packaged optronic integrated circuit devices also includes forming a trench between different elements on the integrated circuit die.

BRIEF DESCRIPTION OF THE DRAWINGS

The present invention will be understood and appreciated more fully from the following detailed description, taken in conjunction with the drawings in which:

FIGS. 3A, 3B, 3C, 3D, 3E, 3F, 3G, 3H, 3I and 3J are sectional illustrations of various stages in the manufacture of integrally packaged optronic integrated circuit devices in accordance with a preferred embodiment of the present invention;

FIG. 4 is a partially cut away detailed pictorial illustration of an integrally packaged optronic integrated circuit device produced from the wafer of FIG. 3J;

FIGS. 5 and 6 together provide a simplified block diagram illustration of apparatus for carrying out the method of the present invention;

FIGS. 13A, 13B, 13C, 13D, 13E, 13F, 13G, 13H, 13I and 13J are sectional illustrations of various stages in the manufacture of integrally packaged optronic integrated circuit devices in accordance with a preferred embodiment of the present invention;

FIGS. 15 and 16 together provide a simplified block diagram illustration of apparatus for carrying out the method of the present invention;

FIGS. 23A, 23B, 23C, 23D, 23E, 23F, 23G, 23H, 23I, 23J, 23K and 23L are sectional illustrations of various stages in the manufacture of integrally packaged optronic integrated circuit devices in accordance with a preferred embodiment of the present invention;

FIG. 24 is a partially cut away detailed pictorial illustration of an integrally packaged optronic integrated circuit device produced from the wafer of FIG. 23L;

FIGS. 25 and 26 together provide a simplified block diagram illustration of apparatus for carrying out the method of the present invention;

FIGS. 33A, 33B, 33C, 33D, 33E, 33F, 33G, 33H, 33I, 33J, 33K and 33L are sectional illustrations of various stages in the manufacture of integrally packaged optronic integrated circuit devices in accordance with a preferred embodiment of the present invention;

FIG. 34 is a partially cut away detailed pictorial illustration of an integrally packaged optronic integrated circuit device produced from the wafer of FIG. 33L;

FIGS. 35 and 36 together provide a simplified block diagram illustration of apparatus for carrying out the method of the present invention;

DETAILED DESCRIPTION OF PREFERRED EMBODIMENTS

Figure 1A:
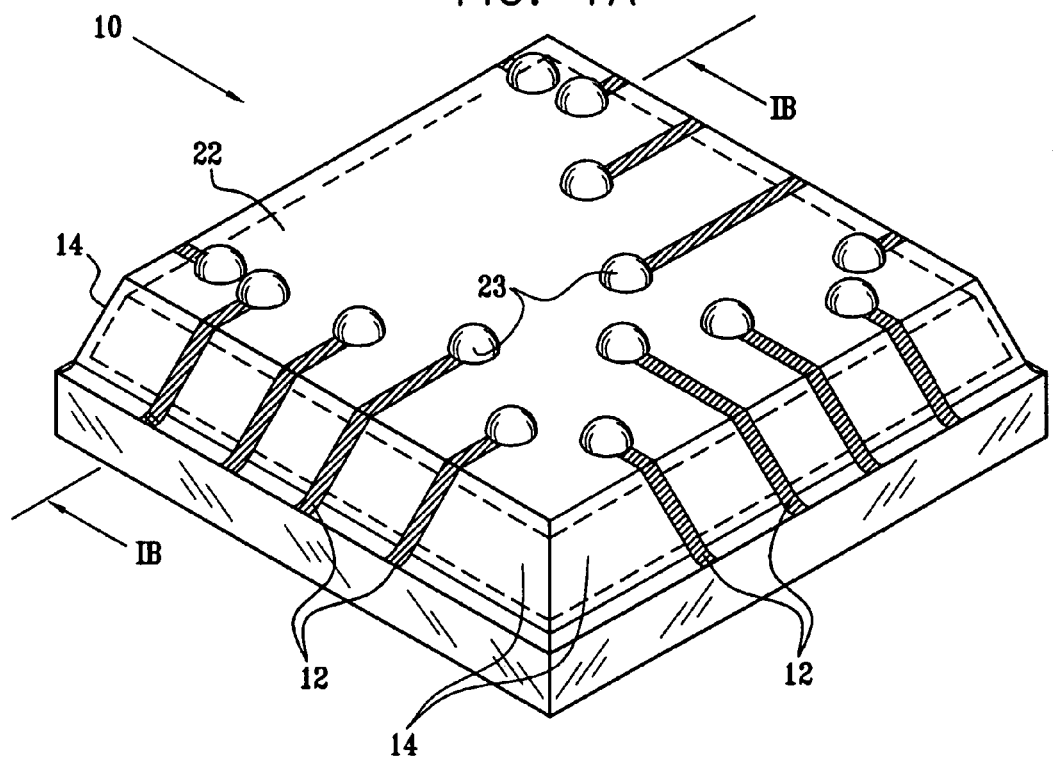
FIGS. 1A and 1B are, respectively, a simplified pictorial illustration and a simplified sectional illustration of an integrally packaged optronic integrated circuit device constructed and operative in accordance with a preferred embodiment of the present invention, the sectional illustration being taken along lines IB—IB in FIG. 1A.

Reference is now made to FIGS. 1A–3J, which illustrate integrated circuit devices, preferably optronic, integrated circuit devices, and the production thereof, in accordance with a preferred embodiment of the present invention. As seen in FIGS. 1A and 1B, the integrated circuit device includes a relatively thin and compact, environmentally protected and mechanically strengthened, integrated circuit package 10, preferably an optronic integrated circuit package, having a multiplicity of electrical conductors 12 plated along the edge surfaces 14 thereof.

It is a particular feature of the present invention that conductors 12 are electrically connected to pads 16, and preferably are formed directly over insulation layers 18 and 19 overlying a die 20, without there being an intervening packaging layer, such as a glass layer. Insulation layers 18 and 19 may each comprise one or more layers such as dielectric layers and/or passivation layers and may be different from each other in materials and/or thickness or alternatively may be identical. As a further alternative, insulation layers 18 and 19 may be obviated. The embodiments of FIGS. 1A–10C are all characterized additionally in that a planar portion of conductor 12 lies in electrically conductive contact over a planar portion of pad 16, as shown clearly in FIG. 1B. It is a particular feature of this structure that the thickness of pads 16 is less critical than in embodiments wherein connections are formed only to the cross-sectional area of the pads.

Figure 1B:
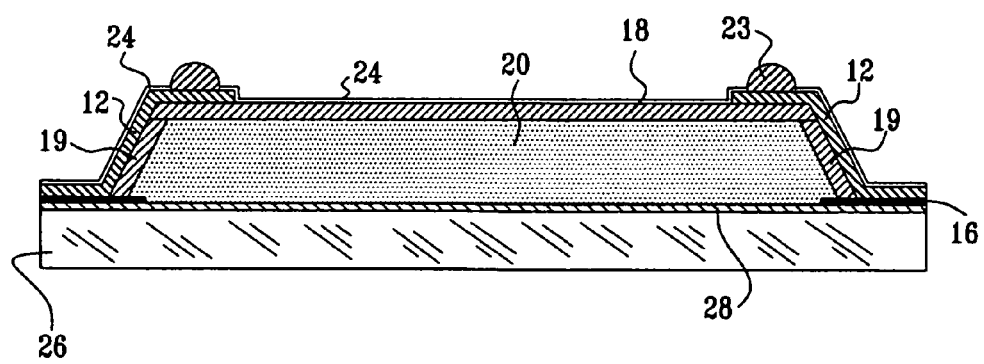

In accordance with a preferred embodiment of the invention, conductors 12 extend over edge surfaces 14 onto a planar surface 22 of the package 10. This contact arrangement permits flat surface mounting of package 10 onto a circuit board. It is noted that the integrated circuit package 10 may include one or more of the following elements (not shown): an integrally formed dichroic filter, color filter, antireflective coating, polarizer, optical grating, integrated wave guide and optical coupling bumps in an optronic embodiment. In a non-optronic embodiment, the above elements are normally not present. As seen in FIGS. 1A and 1B, optronic integrated circuit package 10 may also include contact bumps, such as solder balls 23 formed on electrical conductors 12, at apertures formed in a solder mask 24 however, solder balls 23 are not required.

Figure 1C:
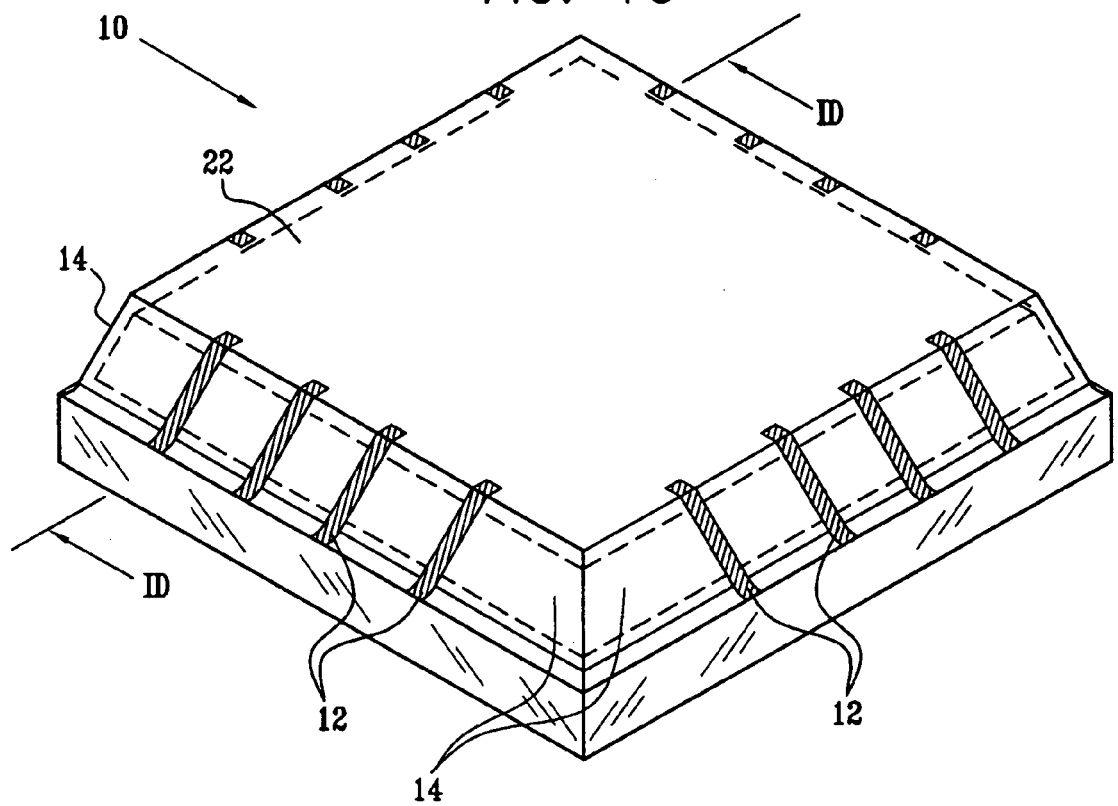
FIGS. 1C and 1D are, respectively, a simplified pictorial illustration and a simplified sectional illustration of an integrally packaged optronic integrated circuit device constructed and operative in accordance with another preferred embodiment of the present invention, the sectional illustration being taken along lines ID—ID in FIG. 1C.
Figure 1D:
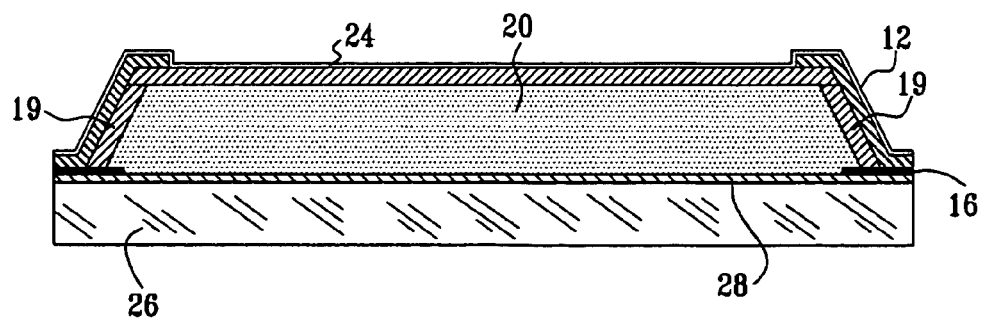

As a further alternative, as shown in FIGS 1C and 1D, the conductors 12 do not extend beyond edge surfaces 14 onto planar surface 22 or extend onto planar surface 22 only to a limited extent, thereby defining peripheral contacts. In such a case, the solder mask 24 normally does not extend onto planar surface 22 or may be obviated entirely.

As an additional alternative, the solder balls 23 may be replaced by contacts suitable for ACF engagement, or may comprise Ball Grid Array (BGA) contacts.

Insulation layers 18 and 19 may operate as mechanically conforming layers which are adapted to compensate for differences in thermal expansion coefficients of conductors 12, solder balls 23 and die 20.

The preferably optronic integrated circuit package 10, shown in FIGS. 1A and 1B, also preferably includes a radiation transparent protective cover plate 26 and a bonding layer 28, such as an epoxy layer, preferably a radiation transparent epoxy layer, used to attach cover plate 26 to die 20, as described hereinbelow.

It is appreciated that the methods described hereinbelow provide optronic integrated circuit packages 10 that are in the range defined as chip scale packages, typically no more than 20% larger in area than the size of the chip. It is also appreciated that the methods described hereinbelow provide optronic integrated circuit packages 10 in which the packaging process is carried out at wafer level up to dicing of a wafer-wise package into separate packaged dies.

Figure 2A:
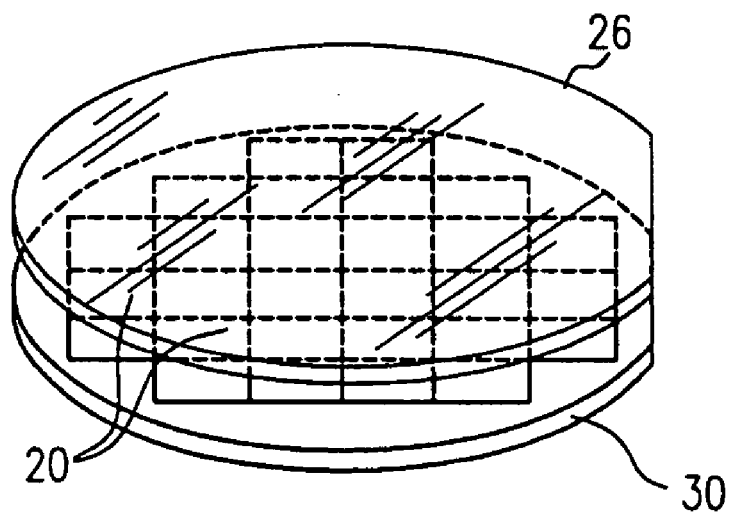
FIGS. 2A and 2B are simplified pictorial illustrations of the attachment of a transparent protective cover plate to a wafer containing a plurality of integrated circuit dies in accordance with a preferred embodiment of the present invention.
Figure 2B:
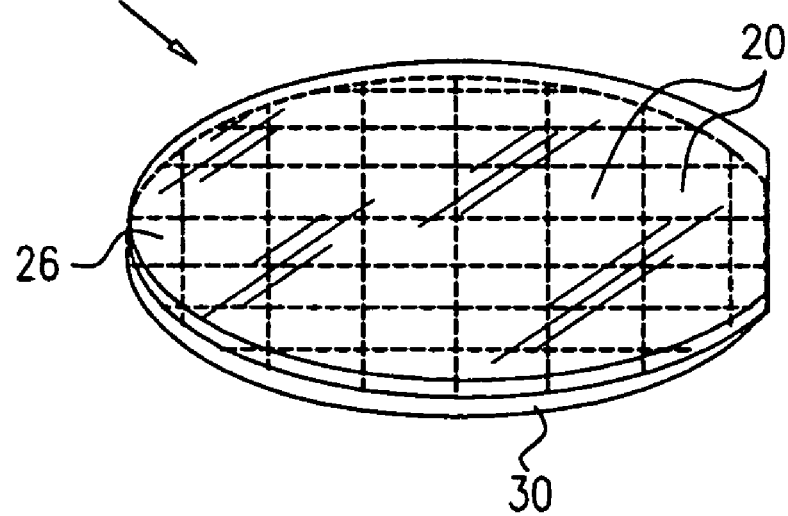

FIGS. 2A and 2B are simplified pictorial illustrations of the attachment of a transparent protective cover plate to a wafer containing a plurality of integrated circuit dies in accordance with the present invention. As seen in FIGS. 2A and 2B, a silicon wafer 30 includes a plurality of finished dies 20, having active surfaces formed thereon by conventional techniques, and is bonded at the active surfaces to cover plate 26, thereby defining a bonded wafer 31.

In accordance with a preferred embodiment of the present invention, as illustrated in FIG. 3A, wafer 30 includes a plurality of finished dies 20, having active surfaces formed thereon by conventional techniques, and is bonded at the active surfaces to cover plate 26 via bonding layer 28. The cover plate 26 typically comprises glass, quartz, sapphire or any other suitable radiation transparent substrate. As seen in FIG. 3A, electrical pads 16 are formed on the active surfaces of silicon wafer 30.

The cover plate 26 may be colored or tinted in order to operate as a spectral filter. Alternatively, a dichroic or colored spectral filter may be formed on at least one surface of the cover plate 26.

It is a particular feature of the present invention that cover plate 26 and bonding layer 28 are preferably transparent to radiation in a spectral region useful for optronic applications. Alternatively, the bonding layer 28 may also function as a spectral filter and may incorporate a suitable dye for this purpose.

It is appreciated that certain steps in the conventional fabrication of silicon wafer 30 may be eliminated when the wafer is used in accordance with the present invention. These steps include the provision of via openings above pads, wafer back grinding and wafer back metal coating.

The silicon wafer 30 may be formed with an integral color filter array by conventional lithography techniques at any suitable location therein. Prior to the bonding step of FIG. 3A, a filter may be formed and configured by conventional techniques over the cover plate 26, such that the filter plane lies between cover plate 26 and the bonding layer 28.

Following the bonding step described hereinabove, the silicon wafer 30 is preferably ground down from an original thickness L1, typically in the range of 400 to 1000 microns, to a decreased thickness L2, typically 10–250 microns, as shown in FIG. 3B. This reduction in wafer thickness is enabled by the additional mechanical strength provided by the bonding thereto of the cover plate 26. As a further alternative, the silicon wafer 30 may be removed nearly in its entirety. This is useful when using a silicon on isolator (SOI) fabrication technique.

Following the reduction in thickness of the wafer, which is optional, the wafer is etched, using a photolithography process, along its back surface along predetermined dice lines that separate the individual dies 20. Etched channels 32 are thus produced, which extend entirely through the thickness of the silicon substrate, typically 10–250 microns. The etched wafer is shown in FIG. 3C.

The aforementioned etching typically is achieved by a dry etching process using $SF_6$, $C_4F_8$ or other suitable dry etching gasses. Alternatively, the etching takes place in conventional silicon etching solution, such as a combination of 2.5% hydrofluoric acid, 50% nitric acid, 10% acetic acid and 37.5% water, so as to etch the silicon down through any field oxide layer to expose pads 16, as shown in FIG. 3C. As a further alternative, the etching solution may include KOH or any other suitable material.

The result of the silicon etching is a plurality of separated dies 20, each of which includes silicon of thickness about 10–250 microns.

As seen in FIG. 3D, etched channels 32 are preferably coated with a dielectric material, such as epoxy, silicon oxide, silicon dioxide, solder mask, or any other suitable dielectric material, such as silicon nitride, silicon oxinitride, polyimide, BCB™, parylene, polynaphthalenes, fluorocarbons or accrylates. The resulting insulation layers 18 and 19 are preferably formed by spin coating, or may be formed by any suitable method, such as spray coating, curtain coating, liquid phase deposition, physical vapor deposition, chemical vapor deposition, low pressure chemical vapor deposition, plasma enhanced chemical vapor deposition, rapid thermal chemical vapor deposition or atmospheric pressure chemical vapor deposition.

Following the formation of insulation layers 18 and 19, as seen in FIG. 3E, an opening 36 is formed in the insulation layer 19 between each pair of adjacent dies 20, by any suitable method. Openings 36 extend through insulation layer 19, thereby exposing pads 16.

As seen in FIG. 3F, a conductive layer 38 is formed over the plurality of separated dies 20, through openings 36 to cover the exposed portions of pads 16 and the dielectric material defining insulation layers 18 and 19. Conductive layer 38 is preferably formed of aluminum, or may be formed of any suitable conductive material or combination of materials, such as aluminum, copper, titanium, titanium tungsten, or chrome.

Figure 3G:
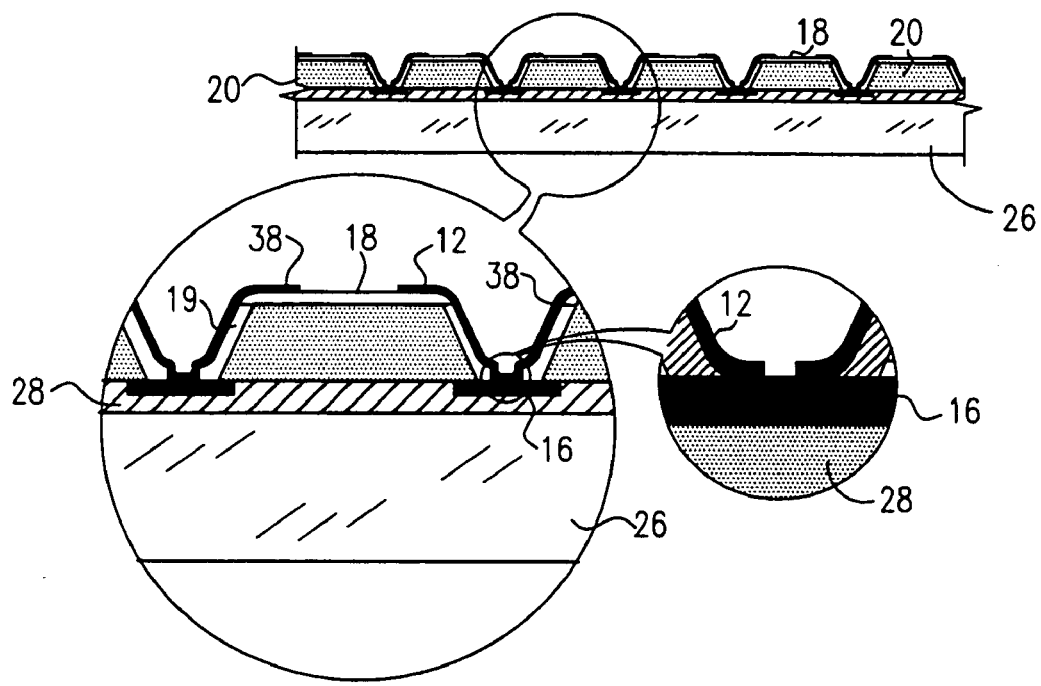

FIG. 3G shows patterning of the conductive layer 38, typically by conventional photolithographic techniques, to define a plurality of conductors 12 which electrically contact edges of one or more pads 16 on dies 20 and are appropriately plated.

Figure 3H:
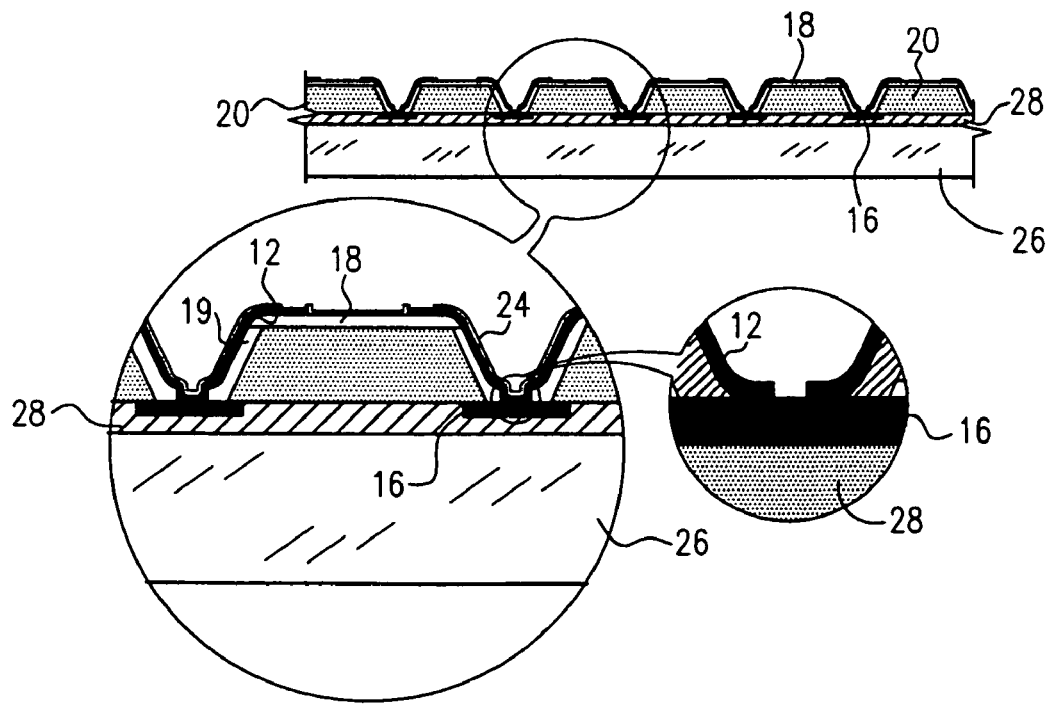
Figure 3I:
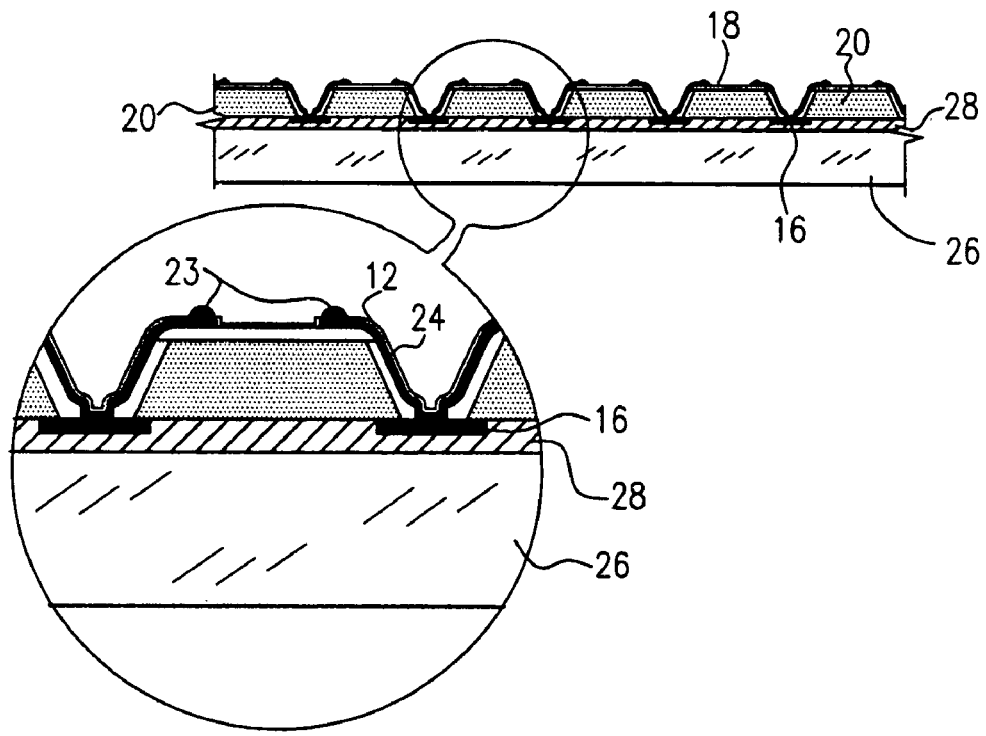

FIG. 3H shows the wafer being coated with a layer of protective material, preferably solder mask 24 or other protective material such as parylene, BCB™, or polyamide, which is patterned to define apertures therein communicating with conductors 12 through which are formed solder balls 23 in electrical contact with conductors 12 (FIG. 3I).

Figure 3J:
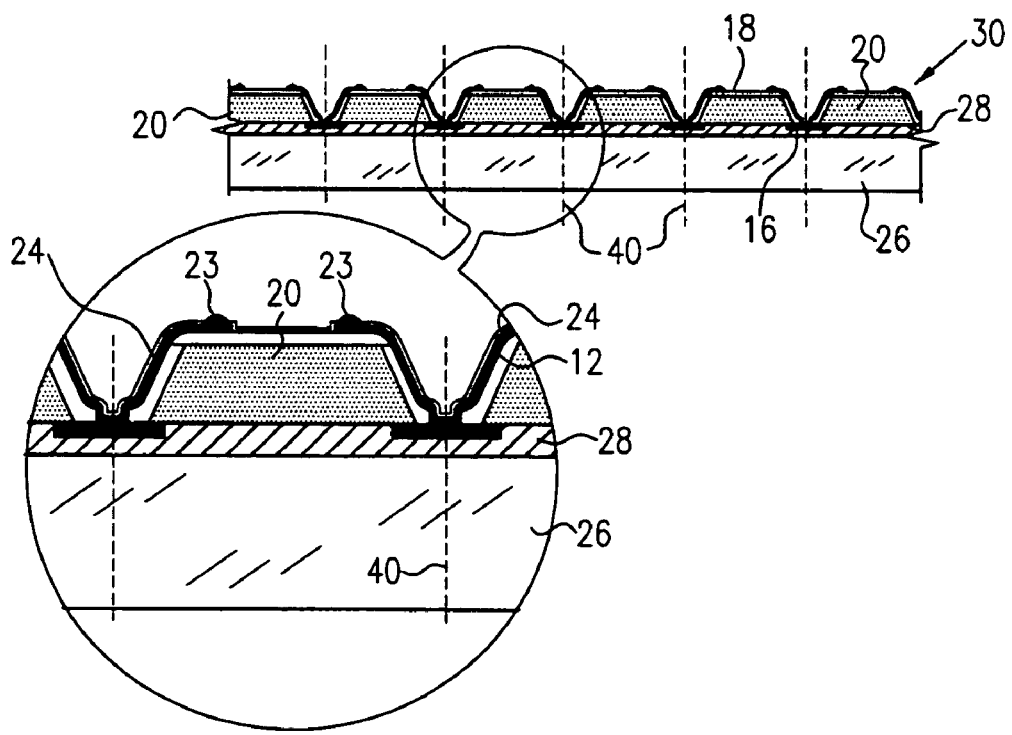

In accordance with a preferred embodiment of the present invention, the wafer is then diced, as shown in FIG. 3J, along lines 40, to provide individual integrated circuit packages, each similar to integrated circuit package 10 of FIGS. 1A and 1B.

Reference is now made to FIG. 4, which is a partially cut away, detailed, pictorial illustration of an integrally packaged optronic integrated circuit device produced from the wafer of FIG. 3J. As seen in FIG. 4, the integrated circuit package includes cover plate 26, joined by bonding layer 28 to die 20. Surfaces of pads 16 are in electrical contact with conductors 12, which are directly formed over dielectric insulation layers 18 and 19, as described hereinabove. It is appreciated that insulation layers 18 and 19 may each comprise multiple layers.

Reference is now made to FIGS. 5 and 6, which together illustrate apparatus for producing integrated circuit devices in accordance with a preferred embodiment of the present invention. A conventional wafer fabrication facility 180 provides wafers 30. Each individual wafer 30 is bonded on the side defining active surfaces to a protective layer, such as glass layers, forming cover plate 26, using bonding layer 28, by bonding apparatus 182, preferably having facilities for rotation of the wafer 30, the cover plate 26 and the bonding layer 28 so as to obtain even distribution of the bonding material.

The bonded wafer 31 (FIGS. 2B and 3A) is thinned at its non-active surface side as by grinding apparatus 184, such as model BFG 841, which is commercially available from Disco Ltd. of Japan. The bonded wafer 31 (FIG. 3B) is then etched at its non-active surface side, preferably by photolithography, such as by using conventional spin-coated photoresist, which is commercially available from Hoechst, under the brand designation AZ 4562.

The photoresist is preferably mask exposed by a suitable UV exposure system 185, such as a Suss MicrTech AG, model MA200, through a lithography mask 186.

The photoresist is then developed in a development bath (not shown), baked and the bonded wafer is then silicon etched typically by a dry etching process using $SF_6$, $C_4F_8$ or other suitable dry etching gasses. Commercially available equipment for this purpose include a dry etch machine 188 manufactured by Surface Technology Systems of England.

Alternatively, the etching is achieved using a silicon etch solution located in a temperature controlled bath (not shown). Commercially available equipment for this purpose includes a Chemkleen bath and a WHRV circulator both of which are manufactured by Wafab Inc. of the U.S.A. A suitable wet etching conventional silicon etching solution is Isoform Silicon etch, which is commercially available from Micro-Image Technology Ltd. of England.

The wafer is conventionally rinsed after etching and photoresist stripping is performed. The resulting etched wafer is shown in FIG. 3C.

The etched channels 32 in wafer 30 are preferably coated with a dielectric material, such as epoxy, silicon oxide, silicon dioxide, solder mask, or any other suitable dielectric material, such as silicon nitride, silicon oxinitride, polyimide, BCB™, parylene, polynaphthalenes, fluorocarbons or accrylates. The resulting insulation layers 18 and 19 are preferably formed by spin coating as seen in step 190, or may be formed by any suitable method, such as spray coating, curtain coating, liquid phase deposition, physical vapor deposition, chemical vapor deposition, low pressure chemical vapor deposition, plasma enhanced chemical vapor deposition, rapid thermal chemical vapor deposition or atmospheric pressure chemical vapor deposition. The resulting coated bonded wafer is shown in FIG. 3D.

Following the formation of insulation layers 18 and 19, as seen in FIG. 3E, an opening 36 is formed in the insulation layer 19 between each pair of adjacent dies 20, by any suitable method. Openings 36 extend through insulation layer 19, thereby exposing pads 16. Formation of openings by conventional photolithographic techniques is shown at step 192 and typically employs a mask 194. Following conventional developing (not shown), the wafer is optionally subjected to anti-corrosion treatment in a bath 196, containing a chromating solution 198, such as described in any of the following U.S. Pat. Nos. 2,507,956; 2,851,385 and 2,796,370, the disclosure of which is hereby incorporated by reference.

Conductive layer deposition apparatus 200, which operates by vacuum deposition techniques, such as a sputtering machine manufactured by Balzers AG of Liechtenstein, is employed to produce conductive layer 38 (FIG. 3F) on one or more surfaces of each die 20 of the wafer 30.

Configuration of conductors 12, as shown in FIG. 3G, is carried out preferably by using conventional electro-deposited photoresist, which is commercially available from DuPont under the brand name Primecoat or from Shipley, under the brand name Eagle. The photoresist is applied to the wafers in a photoresist bath assembly 202, which is commercially available from DuPont or Shipley.

The photoresist is preferably light configured by a UV exposure system 204, using a mask 205 to define suitable etching patterns. The photoresist is then developed in a development bath 206, and then etched in a metal etch solution 208 located in an etching bath 210, thus providing a conductor configuration such as that shown in FIGS. 1A and 1B.

The exposed conductive strips shown in FIG. 3G are then plated, preferably by an electroless plating apparatus 212, which is commercially available from Okuno of Japan.

Following plating of the conductive strips, the wafer is then coated with a solder mask as indicated at reference numeral 214 to define locations (FIG. 3H) of solder balls 23, which are then formed in a conventional manner, as indicated at reference numeral 215 (FIG. 3I). Alternatively, the balls 23 may not be required.

The wafer is then diced into individual pre-packaged integrated circuit devices by a dicing blade 216 (FIG. 3J). Preferably, dicing blade 216 is a diamond resinoid blade of thickness 2–12 mils. The resulting dies appear as illustrated generally in FIGS. 1A and 1B.

Figure 7A:
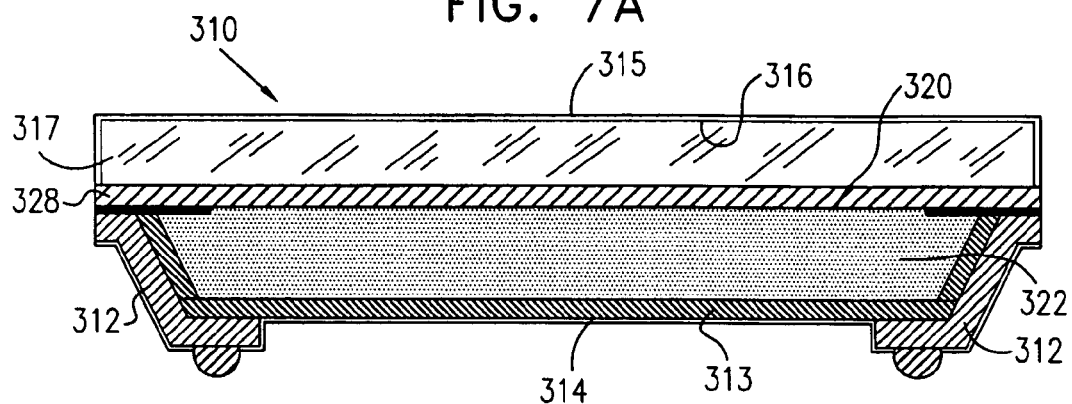
FIGS. 7A, 7B and 7C are simplified pictorial illustrations of three alternative embodiments of an integrally packaged optronic integrated circuit device constructed and operative in accordance with yet another preferred embodiment of the present invention and including spectral filters and/or anti-reflective coatings.
Figure 7B:
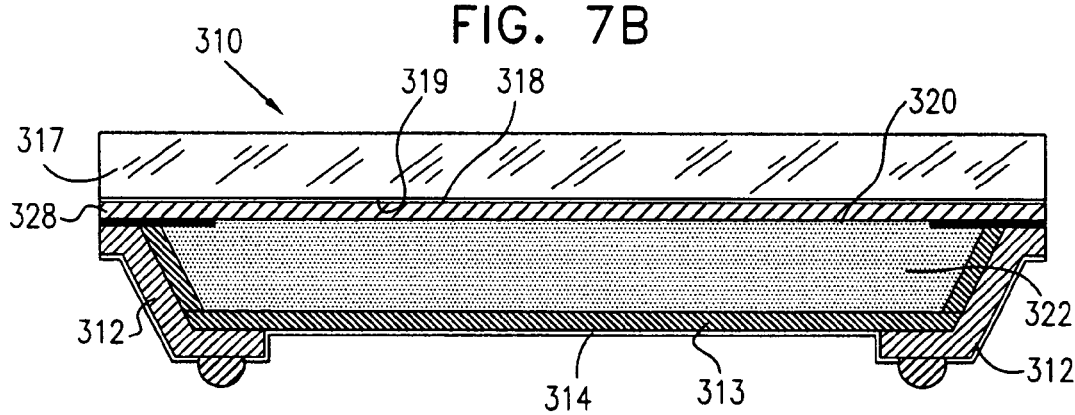
Figure 7C:
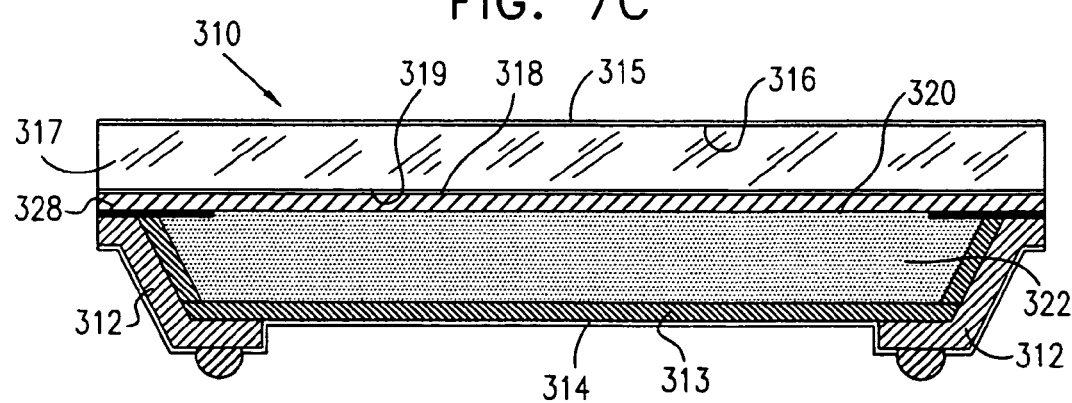

Reference is now made to FIGS. 7A–7C, which illustrate three alternative preferred embodiments of optronic integrated circuit devices, constructed and operative in accordance with a preferred embodiment of the present invention, including a relatively thin and compact, environmentally protected and mechanically strengthened optronic integrated circuit package 310 having a multiplicity of electrical conductors 312 plated directly over one or more insulation layers 313 without an intervening packaging layer. A solder mask 314 is preferably formed over conductors 312 and insulation layer 313 as shown.

FIG. 7A shows a dichroic filter and/or polarizer and/or anti-reflective coating and/or IR coating and/or color filter, such as an RGB or masking filter 315 formed on at least a portion of at least one outer facing surface 316 of a radiation transparent protective layer 317. Outer facing surface 316 may optionally include a top surface or an edge surface of radiation transparent protective layer 317. FIG. 7B illustrates a coating 318, which may be identical to coating 315, which is formed on at least a portion of an inner facing surface 319 of radiation transparent protective layer 317. FIG. 7C shows both coatings 315 and 318 on at least a portion of each of respective surfaces 316 and 319 of radiation transparent protective layer 317. In all three embodiments shown in FIGS. 7A–7C, optronic components are formed on a surface 320 of a silicon substrate 322 of conventional thickness, typically 10–250 microns. Surface 320 faces transparent protective layer 317. A radiation transparent epoxy layer 328 is used to attach protective layer 317 to the silicon substrate 322, as described hereinabove.

Figure 8:
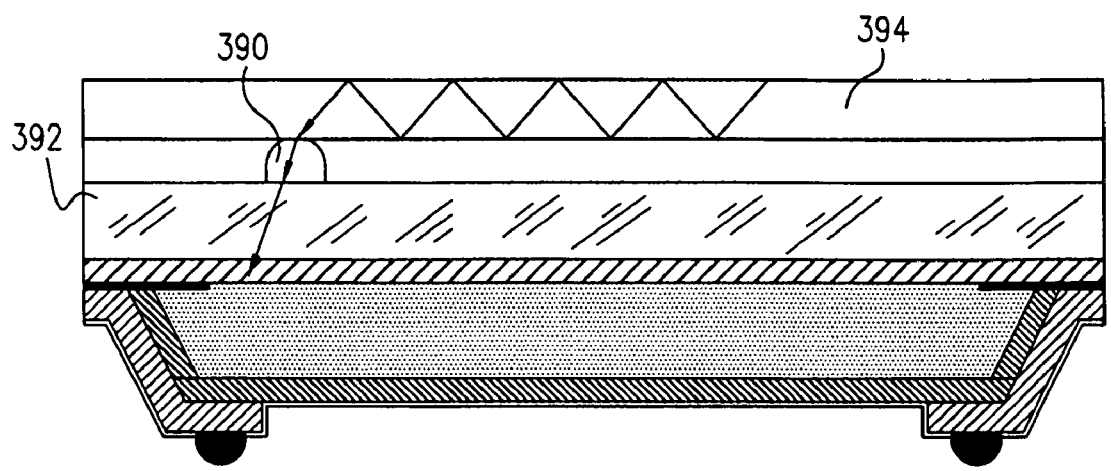
FIGS. 8 and 9 are simplified pictorial illustrations of two alternative embodiments of an integrally packaged optronic integrated circuit device constructed and operative in accordance with another preferred embodiment of the present invention having a waveguide and other optical components integrally formed on a transparent protective surface thereof.

Reference is now made to FIG. 8. The embodiment of FIG. 8 may be identical to that of FIG. 7A with or without the coating and is further distinguished therefrom in that it has a light coupling bump 390 formed on a radiation transparent protective layer 392. A waveguide 394 is shown optically coupled to the radiation transparent protective layer 392 via bump 390. Preferably the bump 390 is formed of a transparent organic material, which is somewhat conforming, such that mechanical pressure thereon produces a slight deformation thereof and enables an evanescent light wave to pass through an interface defined therewith.

Figure 9:
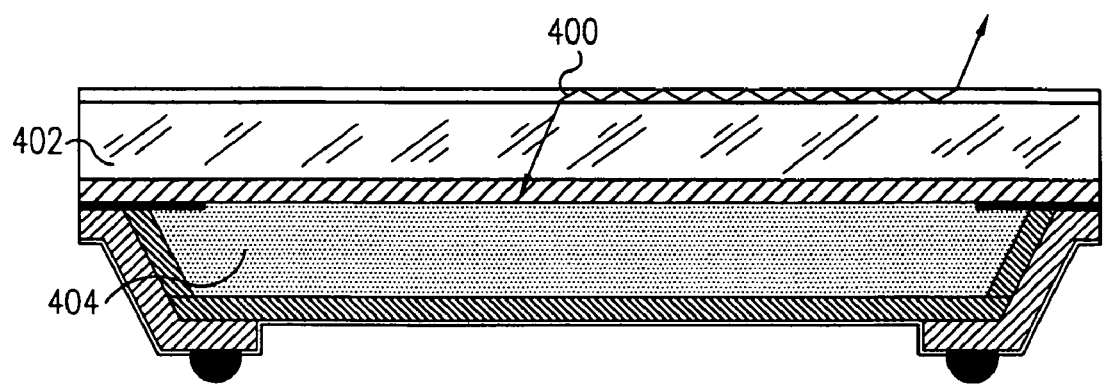

Reference is now made to FIG. 9. The embodiment of FIG. 9 may be identical to that of FIG. 7A with or without the coating and is distinguished therefrom in that it has a wave guide 400 and possibly other optical elements (not shown) formed on a radiation transparent protective layer 402, as by conventional integrated optics techniques. This arrangement enables optical communication between an optronic component formed on a silicon substrate 404 via the radiation transparent protective layer 402 and the wave guide 400.

Figure 10A:
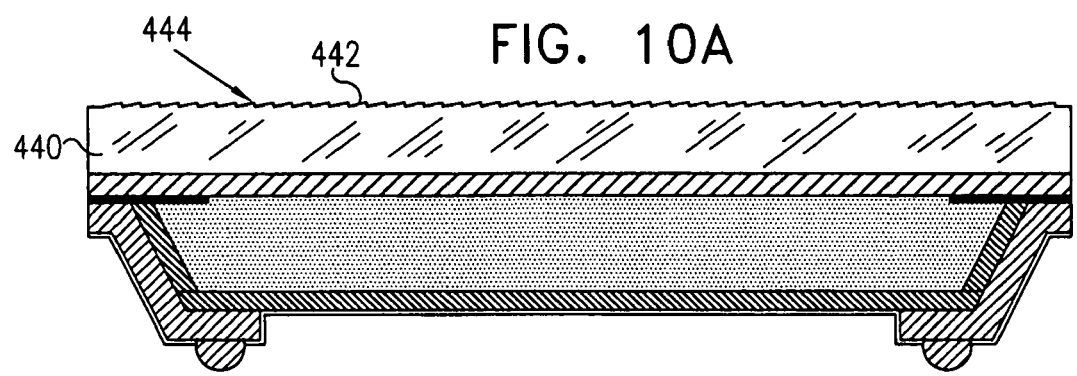
FIG. 10A is a simplified pictorial illustration of an embodiment of an integrally packaged optronic integrated circuit device constructed and operative in accordance with still another preferred embodiment of the present invention wherein an optical grating is integrated with the integrally packaged optronic integrated circuit device.

Reference is now made to FIG. 10A. The embodiment of FIG. 10A may be identical to that of FIG. 7A with or without the coating and is distinguished therefrom in that it has a radiation transparent protective layer 440 which is formed with an optical grating 442 on an outer facing surface 444 thereof.

Figure 10B:
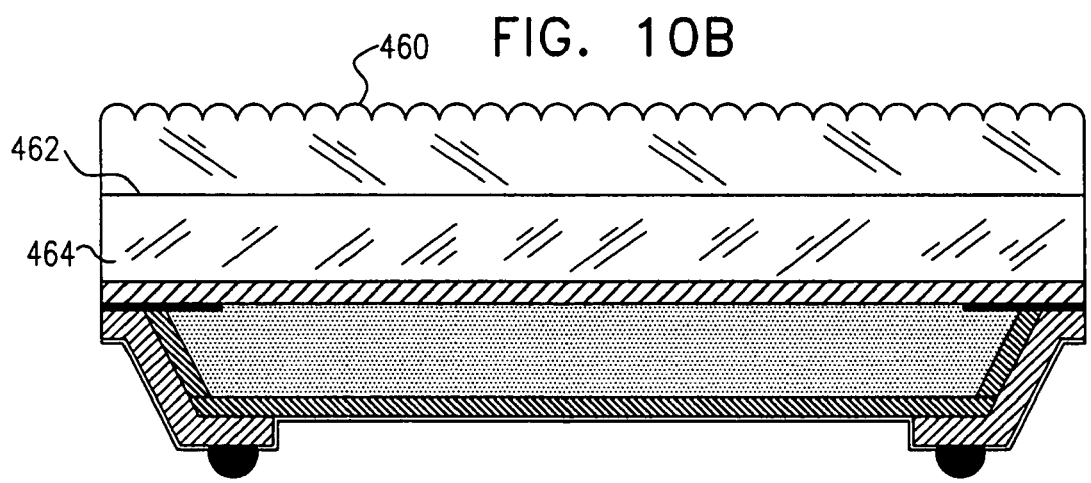
FIG. 10B is a simplified pictorial illustration of an embodiment of an integrally packaged optronic integrated circuit device constructed and operative in accordance with still another preferred embodiment of the present invention wherein at least one lens is integrated with the integrally packaged optronic integrated circuit device.

Reference is now made to FIG. 10B. The embodiment of FIG. 10B may be identical to that of FIG. 7A with or without the coating and is distinguished therefrom in that it has a substrate formed with at least one lens and preferably an array 460 of microlenses attached on an outer facing surface 462 of a radiation transparent protective layer 464. It is appreciated that the at least one lens may be attached to radiation transparent protective layer 464 before the radiation transparent protective layer is adhered to the substrate, or at any subsequent point in the process.

Figure 10C:
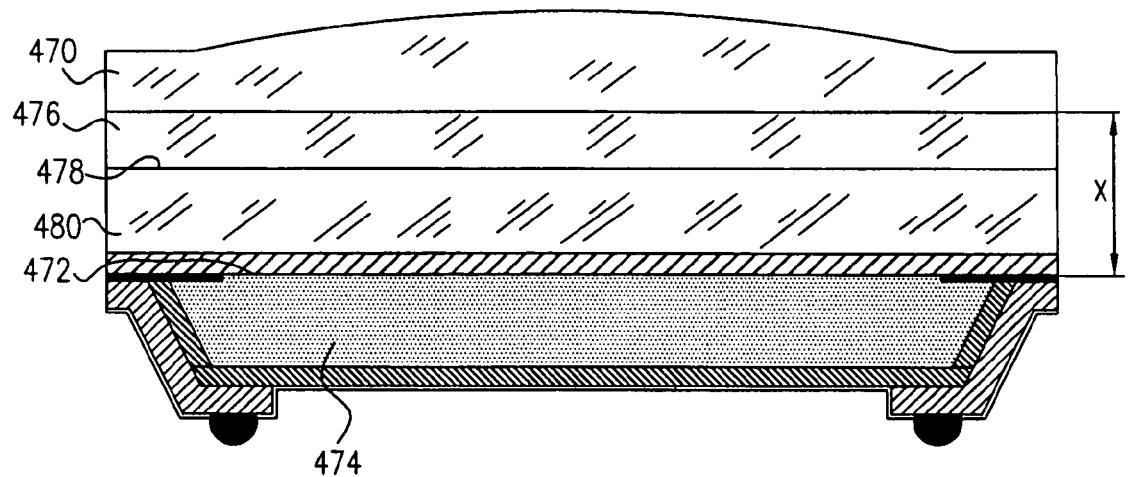
FIG. 10C is a simplified pictorial illustration of an embodiment of an integrally packaged optronic integrated circuit device constructed and operative in accordance with yet another preferred embodiment of the present invention wherein a lens is integrated with the integrally packaged optronic integrated circuit device at a fixed distance from the active surface thereof.

Reference is now made to FIG. 10C. The embodiment of FIG. 10C may be identical to that of FIG. 7A with or without the coating and is distinguished therefrom in that it has a substrate formed with at least one lens 470 which is maintained at a precisely fixed distance X with respect to an active surface 472 of a silicon substrate 474. The precisely fixed distance may be determined to an accuracy of 1–10 microns, preferably by precise machining of an intermediate light transmissive layer 476 which is fixed between lens 470 and an outer facing surface 478 of a radiation transparent protective layer 480. Alternatively intermediate layer 476 may be obviated. As a further alternative, the distance between the lens 470 and the active surface 472 need not be precisely fixed.

Figure 10D:
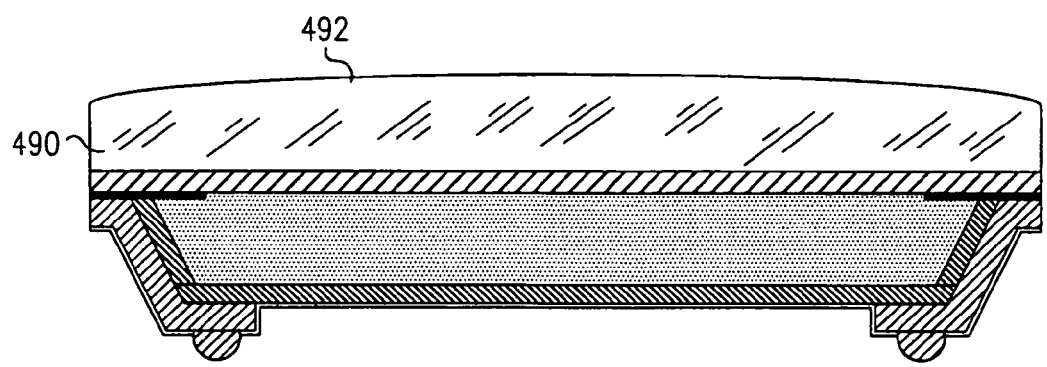
FIG. 10D is a simplified pictorial illustration of an embodiment of an integrally packaged optronic integrated circuit device constructed and operative in accordance with still another preferred embodiment of the present invention wherein at least one lens is integrated with the integrally packaged optronic integrated circuit device.

Reference is now made to FIG. 10D. The embodiment of FIG. 10D may be identical to that of FIG. 7A with or without the coating and is distinguished therefrom in that it has a radiation transparent protective layer 490 including an outer laying surface 492 which may comprise at least one lens.

Figure 11A:
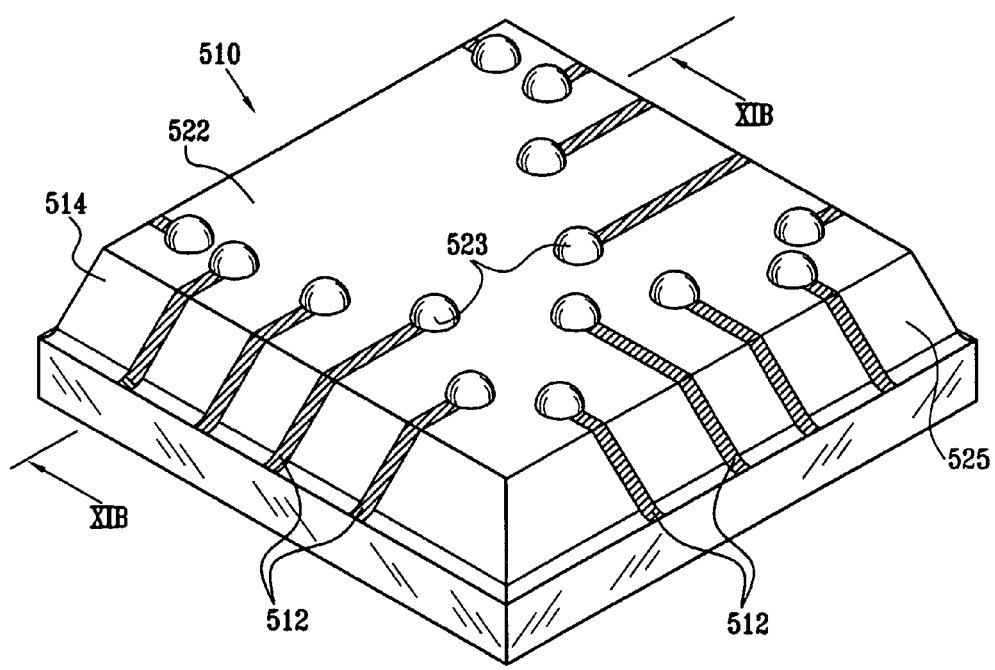
FIGS. 11A and 11B are, respectively, a simplified pictorial illustration and a simplified sectional illustration of an integrally packaged optronic integrated circuit device constructed and operative in accordance with a preferred embodiment of the present invention, the sectional illustration being taken along lines XIB—XIB in FIG. 11A.

Reference is now made to FIGS. 11A–13J, which illustrate integrated circuit devices, preferably optronic, integrated circuit devices, and the production thereof, in accordance with a preferred embodiment of the present invention. As seen in FIGS. 11A and 11B, an integrated circuit device includes a relatively thin and compact, environmentally protected and mechanically strengthened, integrated circuit package 510, preferably an optronic integrated circuit package, having a multiplicity of electrical conductors 512 plated along the edge surfaces 514 thereof.

It is a particular feature of the present invention that conductors 512 are electrically connected to pads 516, and preferably are formed directly over insulation layers 518 and 519 overlying a die 520, without there being an intervening packaging layer, such as a glass layer. Insulation layers 518 and 519 may each comprise one or more layers such as dielectric layers and/or passivation layers and may be different from each other in materials and/or thickness or alternatively may be identical. As a further alternative, insulation layers 518 and 519 may be obviated. The embodiments of FIGS. 11A–20C are all characterized additionally in that a planar portion of conductor 512 overlies in electrically conductive contact a planar portion of pad 516, as shown clearly in FIG. 11B.

Figure 11B:
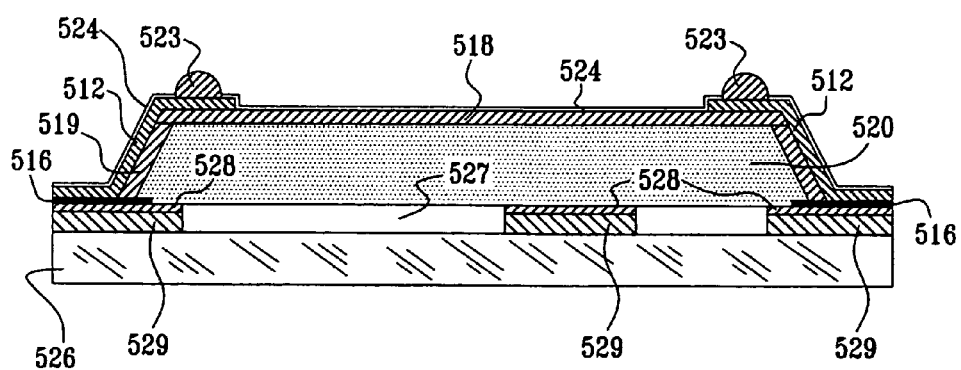

In accordance with a preferred embodiment of the invention, conductors 512 extend over edge surfaces 514 onto a planar surface 522 of the package 510. This contact arrangement permits flat surface mounting of package 510 onto a circuit board. It is noted that the integrated circuit package 510 may include one or more of the following elements (not shown): an integrally formed dichroic filter, color filter, antireflective coating, polarizer, optical grating, integrated wave guide and optical coupling bumps in an optronic embodiment. In a non-optronic embodiment, the above elements are normally not present. As seen in FIGS. 11A and 11B, optronic integrated circuit package 510 may also include contact bumps, such as solder balls 523 formed on electrical conductors 512, at apertures formed in a solder mask 524 however, solder balls 523 are not required.

Figure 11C:
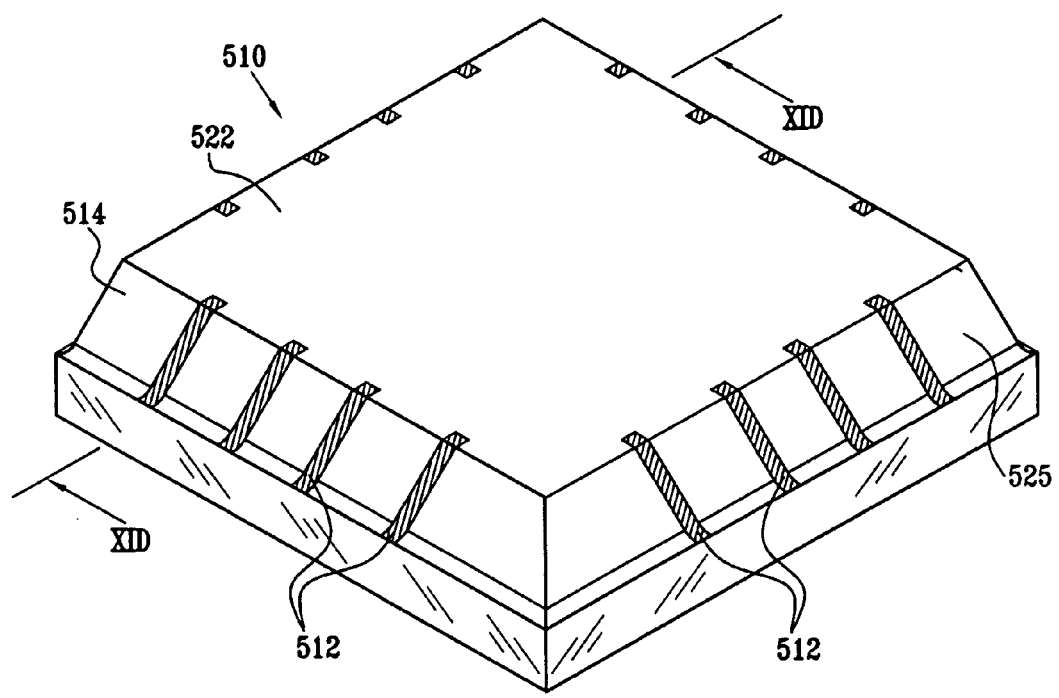
FIGS. 11C and 11D are, respectively, a simplified pictorial illustration and a simplified sectional illustration of an integrally packaged optronic integrated circuit device constructed and operative in accordance with another preferred embodiment of the present invention, the sectional illustration being taken along lines XID—XID in FIG. 11C.
Figure 11D:
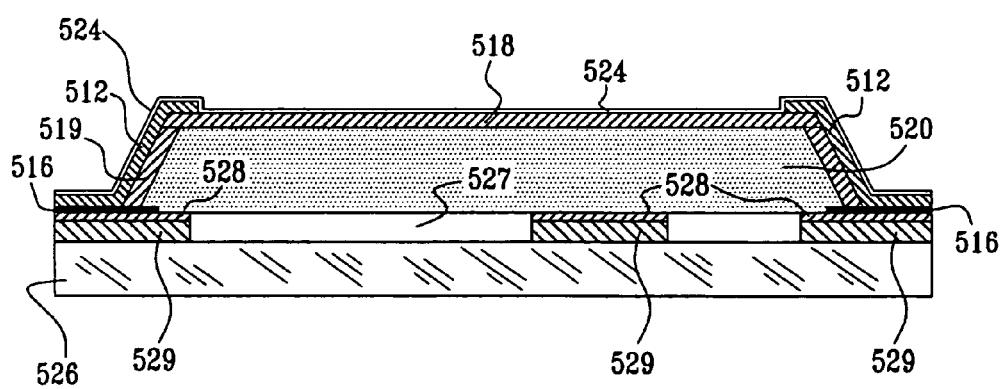

As a further alternative, as shown in FIGS. 11C and 11D, the conductors 512 do not extend beyond edge surfaces 514 onto planar surface 522 or extend onto planar surface 522 only to a limited extent, thereby defining peripheral contacts. In such a case, the solder mask 524 normally does not extend onto planar surface 522 or may be obviated entirely.

As an additional alternative, the solder balls 523 may be replaced by contacts suitable for ACF engagement, or may comprise Ball Grid Array (BGA) contacts.

Insulation layers 518 and 519 may operate as mechanically conforming layers which are adapted to compensate for differences in thermal expansion coefficients of conductors 512, solder balls 523 and die 520.

The preferably optronic integrated circuit package 510, shown in FIGS. 11A and 11B, also preferably includes a radiation transparent protective cover plate 526.

The optronic integrated circuit package 510, shown in FIGS. 11A and 11B, also includes at least one cavity 527 formed between die 520 and radiation transparent protective cover plate 526. Cavity 527 is formed by mounting with at least one bonding layer 528, such as an epoxy layer, at least one spacer 529 between die 520 and cover plate 526, when attaching die 520 to cover plate 526, as described hereinbelow. Alternatively, cavity 527 may be formed by inserting at least one spacer 529 between die 520 and cover plate 526, when attaching die 520 to cover plate 526, as described hereinbelow. It is appreciated that spacer elements 529 of any suitable thickness may be provided, by grinding or any other suitable method, such that cavity 527 is defined to produce a specific fixed distance between cover plate 526 and die 520.

It is appreciated that the methods described hereinbelow provide optronic integrated circuit packages 510 that are in the range defined as chip scale packages, typically no more than 20% larger in area than the size of the chip. It is also appreciated that the methods described hereinbelow provide optronic integrated circuit packages 510 in which the packaging process is carried out at wafer level up to dicing of a wafer-wise package into separate packaged dies.

Figure 12A:
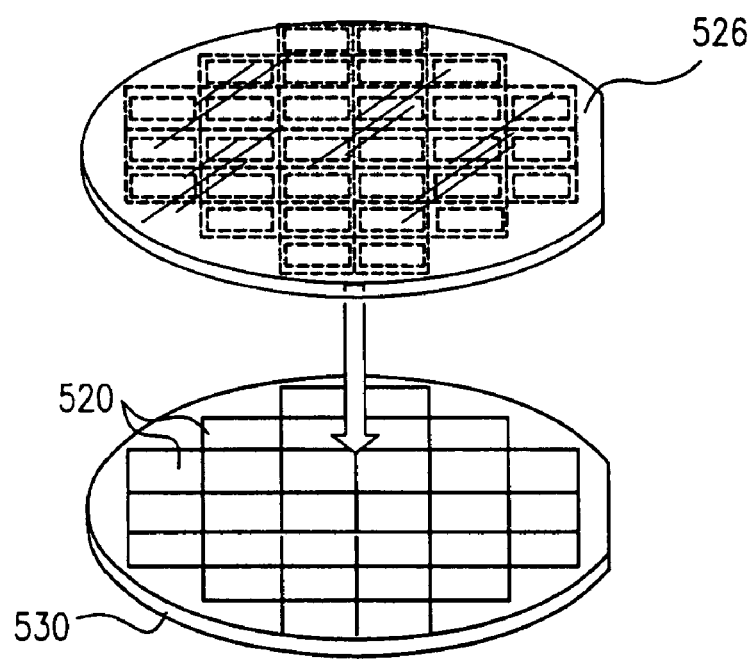
FIGS. 12A and 12B are simplified pictorial illustrations of the attachment of a transparent protective cover plate to a wafer containing a plurality of integrated circuit dies in accordance with a preferred embodiment of the present invention.
Figure 12B:
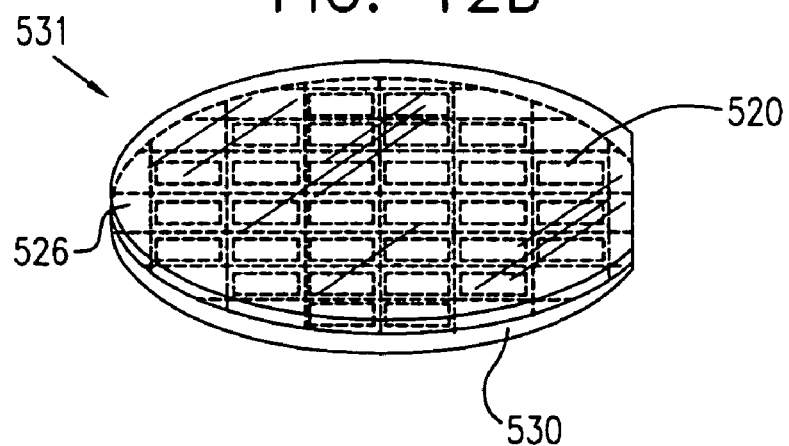

FIGS. 12A and 12B are simplified pictorial illustrations of the attachment of a transparent protective cover plate to a wafer containing a plurality of integrated circuit dies in accordance with the present invention. As seen in FIGS. 12A and 12B, a silicon wafer 530 includes a plurality of finished dies 520, having active surfaces formed thereon by conventional techniques, and is bonded at the active surfaces to cover plate 526, thereby defining a bonded wafer 531.

Figure 13A:
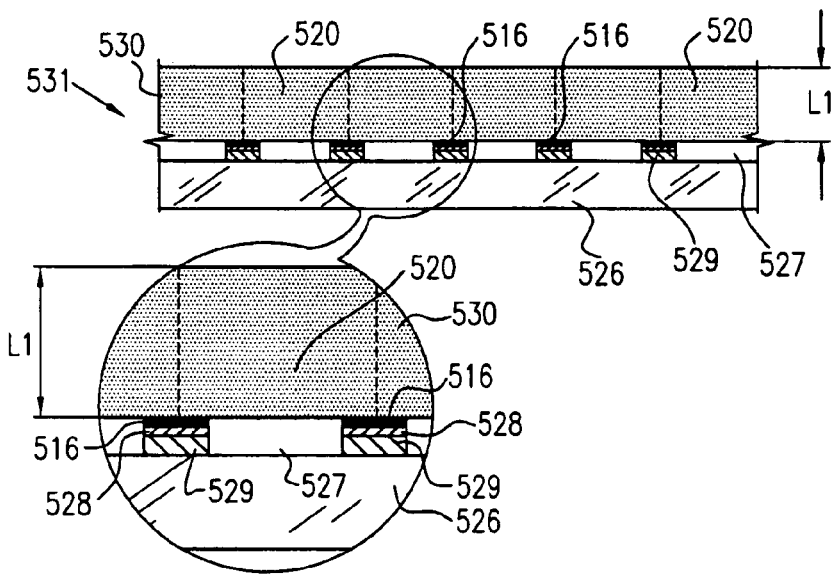

In accordance with a preferred embodiment of the present invention, as illustrated in FIG. 13A, wafer 530 includes a plurality of finished dies 520, having active surfaces formed thereon by conventional techniques, and is bonded at the active surfaces to cover plate 526, thereby defining bonded wafer 531. Cavities 527 are formed between the wafer 530 and the cover plate 526 by mounting spacers 529, by means of at least one bonding layer 528, such as an epoxy layer, between wafer 530 and cover plate 526.

The cover plate 526 typically comprises glass, quartz, sapphire or any other suitable radiation transparent substrate. As seen in FIG. 13A, electrical pads 516 are formed on the active surfaces of silicon wafer 530.

The cover plate 526 may be colored or tinted in order to operate as a spectral filter. Alternatively, a dichroic or colored spectral filter may be formed on at least one surface of the cover plate 526.

It is a particular feature of the present invention that cover plate 526 and bonding layer 528 are preferably transparent to radiation in a spectral region useful for optronic applications. Alternatively, the bonding layer 528 may also function as a spectral filter and may incorporate a suitable dye for this purpose.

It is appreciated that certain steps in the conventional fabrication of silicon wafer 530 may be eliminated when the wafer is used in accordance with the present invention. These steps include the provision of via openings above pads, wafer back grinding and wafer back metal coating.

The silicon wafer 530 may be formed with an integral color filter array by conventional lithography techniques at any suitable location therein. Prior to the bonding step of FIG. 13A, a filter may be formed and configured by conventional techniques over the cover plate 526, such that the filter plane lies between cover plate 526 and at least one cavity 527.

Figure 13B:
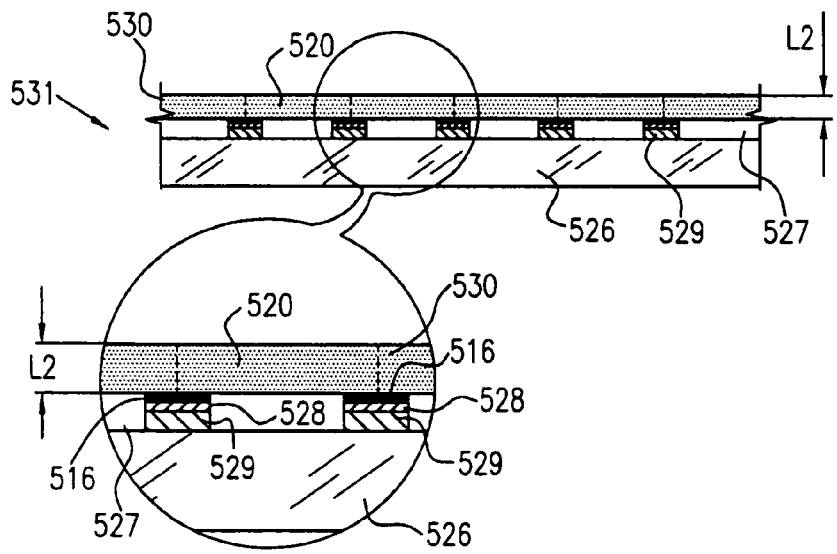

Following the bonding step described hereinabove, the silicon wafer 530 is preferably ground down from an original thickness L1, typically in the range of 400 to 1000 microns, to a decreased thickness L2, typically 10–250 microns, as shown in FIG. 13B. This reduction in wafer thickness is enabled by the additional mechanical strength provided by the bonding thereto of the cover plate 526.

Figure 13C:
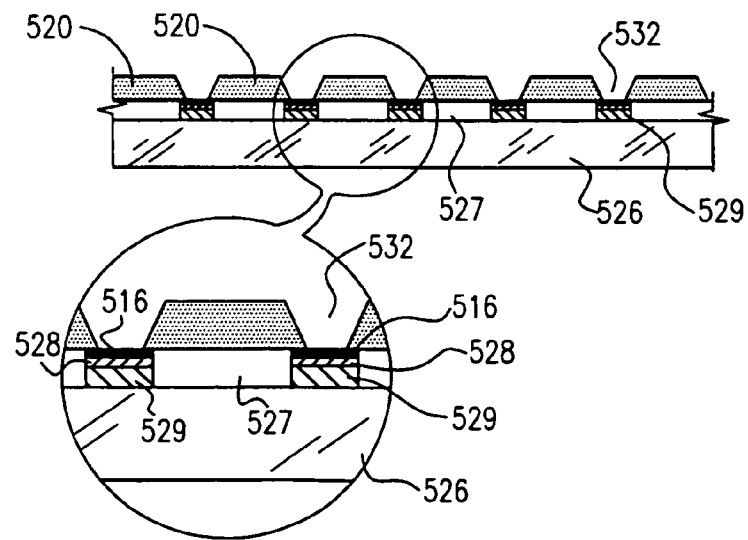

Following the reduction in thickness of the wafer, which is optional, the wafer is etched, using a photolithography process, along its back surface along predetermined dice lines that separate the individual dies 520. Etched channels 532 are thus produced, which extend entirely through the thickness of the silicon substrate, typically 10–250 microns. The etched wafer is shown in FIG. 13C.

The aforementioned etching typically is achieved by a dry etching process using $SF_6$, $C_4F_8$ or other suitable dry etching gasses. Alternatively, the etching takes place in conventional silicon etching solution, such as a combination of 2.5% hydrofluoric acid, 50% nitric acid, 10% acetic acid and 37.5% water, so as to etch the silicon down through any field oxide layer to expose pads 516, as shown in FIG. 13C. The result of the silicon etching is a plurality of separated dies 520, each of which includes silicon of thickness about 10–250 microns.

As seen in FIG. 13D, etched channels 532 are preferably coated with a dielectric material, such as epoxy, silicon oxide, solder mask, or any other suitable dielectric material, such as silicon nitride, silicon oxinitride, polyimide, BCB™, parylene, polynaphthalenes, fluorocarbons or accrylates. The resulting insulation layers 518 and 519 are preferably formed by spin coating, or may be formed by any suitable method, such as spray coating, curtain coating, liquid phase deposition, physical vapor deposition, chemical vapor deposition, low pressure chemical vapor deposition, plasma enhanced chemical vapor deposition, rapid thermal chemical vapor deposition or atmospheric pressure chemical vapor deposition.

Following the formation of insulation layers 518 and 519, as seen in FIG. 13E, an opening 536 is formed in the insulation layer 519 between each pair of adjacent dies 520, by any suitable method. Openings 536 extend through insulation layer 519, thereby exposing pads 516.

As seen in FIG. 13F, a conductive layer 538 is formed over the plurality of separated dies 520, through openings 536 to cover the exposed portions of pads 516 and the dielectric material defining insulation layers 518 and 519. Conductive layer 538 is preferably formed of aluminum, or may be formed of any suitable conductive material or combination of materials, such as aluminum, copper, titanium, titanium tungsten, or chrome.

Figure 13G:
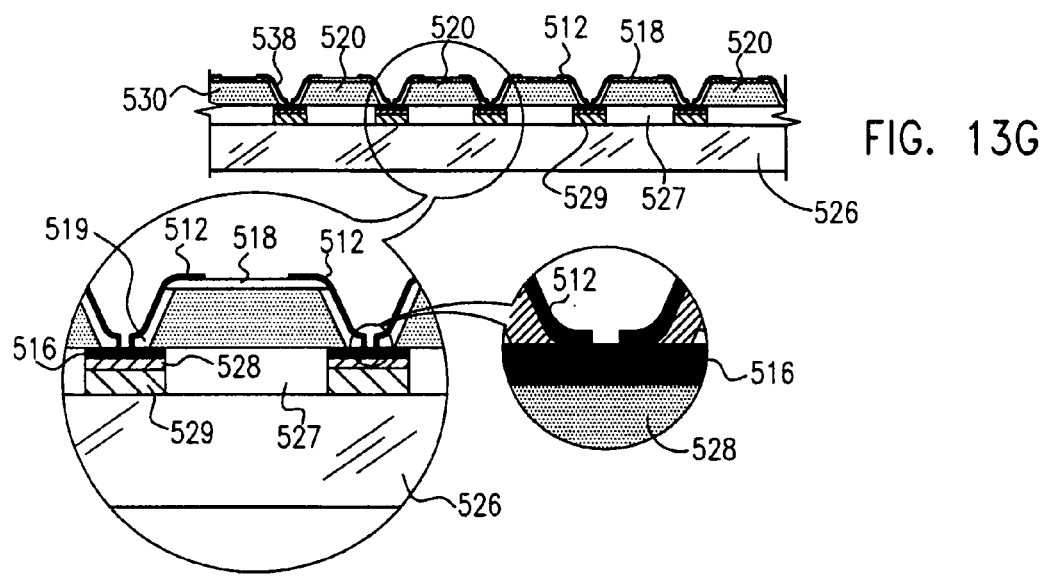

FIG. 13G shows patterning of the conductive layer 538, typically by conventional photolithographic techniques, to define a plurality of conductors 512 which electrically contact edges of one or more pads 516 on dies 520 and are appropriately plated.

Figure 13H:
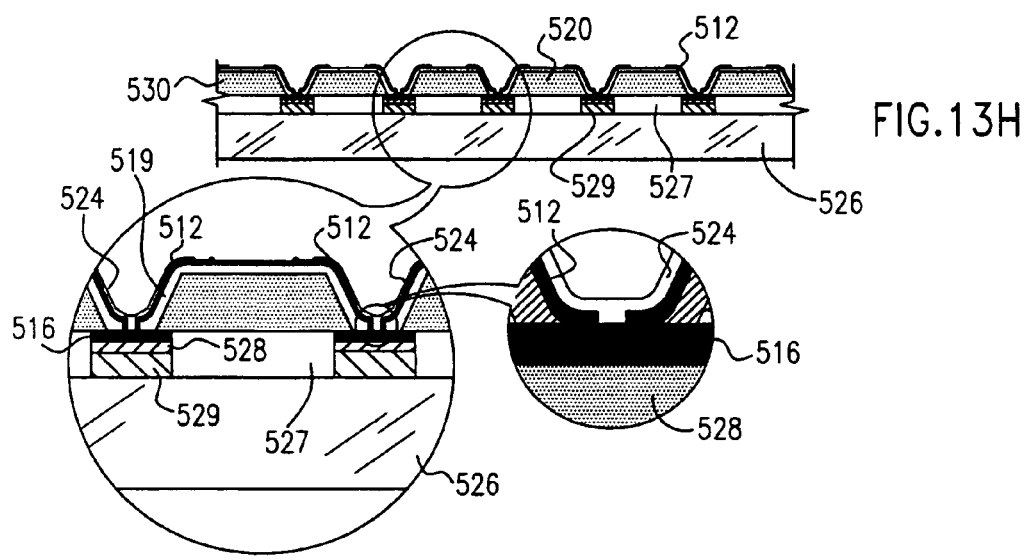
Figure 13I:
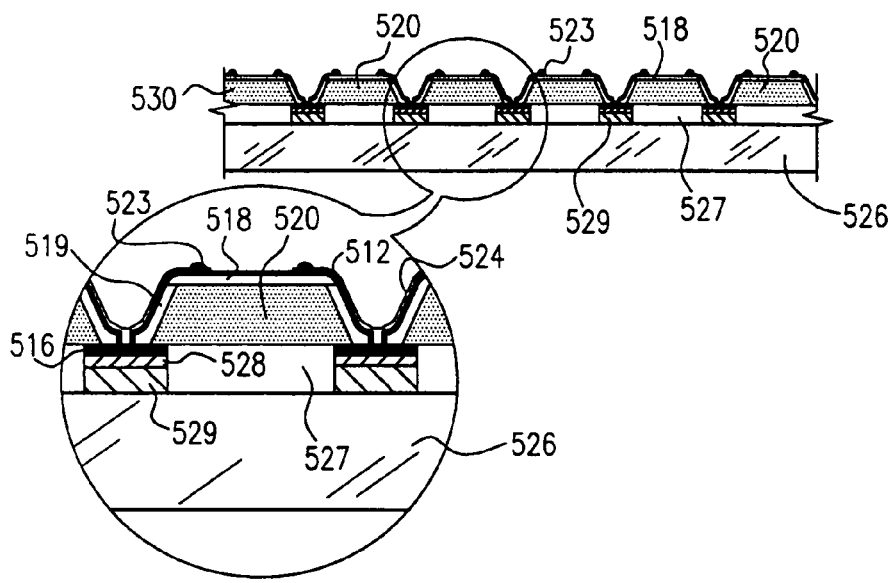

FIG. 13H shows the wafer being coated with a layer of protective material, preferably solder mask 524 or other protective material such as parylene, BCB™, or polyamide, which is patterned to define apertures therein communicating with conductors 512 through which are formed solder balls 523 in electrical contact with conductors 512 (FIG. 13I).

Figure 13J:
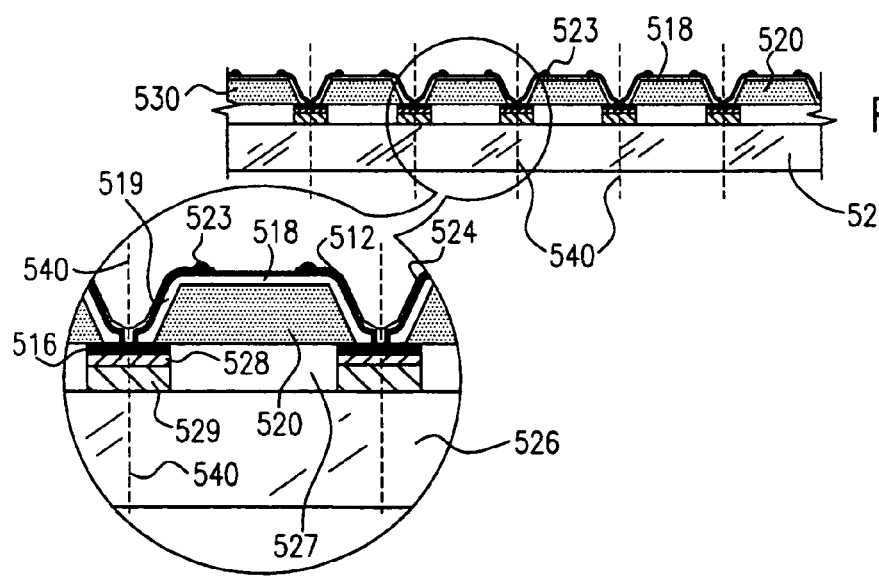

In accordance with a preferred embodiment of the present invention, the wafer is then diced, as shown in FIG. 13J, along lines 540, to provide individual integrated circuit packages, each similar to integrated circuit package 510 of FIGS. 11A and 11B.

Figure 14:
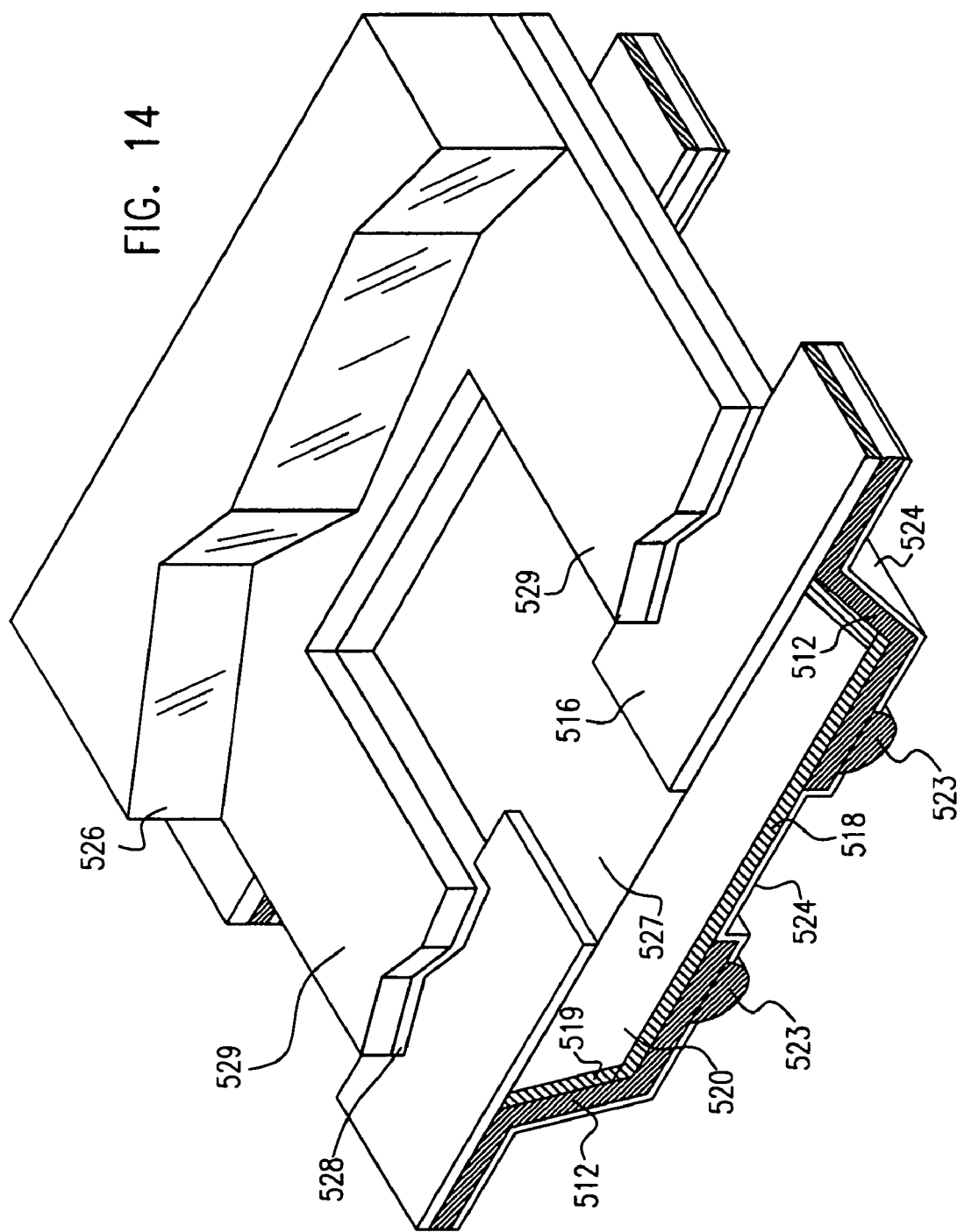
FIG. 14 is a partially cut away detailed pictorial illustration of an integrally packaged optronic integrated circuit device produced from the wafer of FIG. 13J.

Reference is now made to FIG. 14, which is a partially cut away, detailed, pictorial illustration of an integrally packaged optronic integrated circuit device produced from the wafer of FIG. 13J. As seen in FIG. 14, the integrated circuit package includes cover plate 526, joined by spacer 529 and bonding layer 528 to die 520 and defining at least one cavity 527. Surfaces of pads 516 are in electrical contact with conductors 512, which are preferably directly formed over dielectric insulation layers 518 and 519, as described hereinabove. It is appreciated that insulation layers 518 and 519 may each comprise multiple layers.

Figure 15:
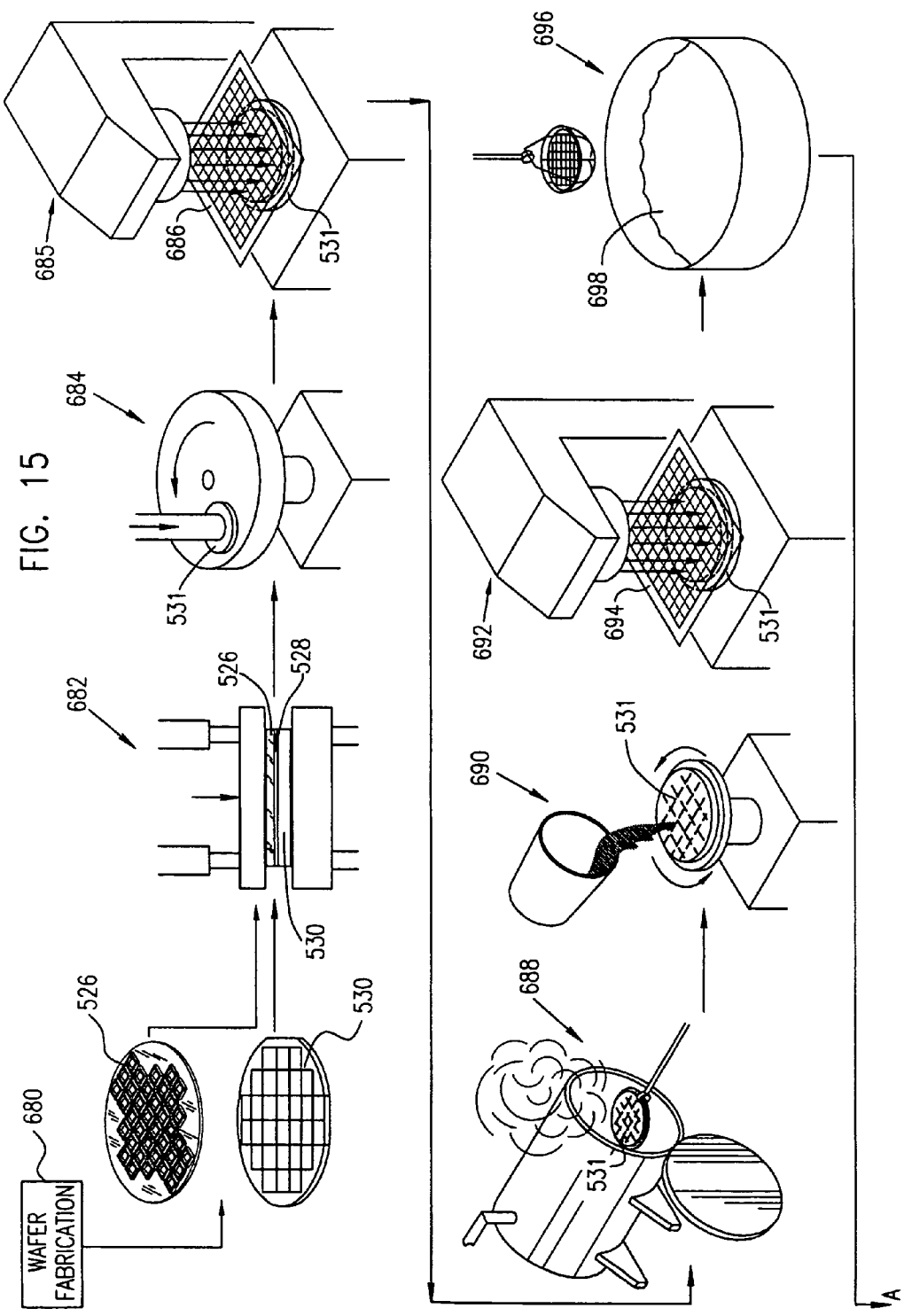

Reference is now made to FIGS. 15 and 16, which together illustrate apparatus for producing integrated circuit devices in accordance with a preferred embodiment of the present invention. A conventional wafer fabrication facility 680 provides wafers 530. Each individual wafer 530 is aligned and then bonded on the side defining active surfaces to a protective layer, such as glass layers, forming cover plate 526, via spacers 529 using bonding layer 528, by bonding apparatus 682, preferably having facilities for rotation of the wafer 530, the cover plate 526, the spacers 529 and the bonding layer 528 so as to obtain even distribution of the bonding material.

The bonded wafer 531 (FIGS. 12B and 13A) is thinned at its non-active surface side as by grinding apparatus 684, such as model BFG 841, which is commercially available from Disco Ltd. of Japan. The bonded wafer 531 (FIG. 13B) is then etched at its non-active surface side, preferably by photolithography, such as by using conventional spin-coated photoresist, which is commercially available from Hoechst, under the brand designation AZ 4562.

The photoresist is preferably mask exposed by a suitable UV exposure system 685, such as a Suss MicrTech AG, model MA200, through a lithography mask 686.

The photoresist is then developed in a development bath (not shown), baked and the bonded wafer is then silicon etched typically by a dry etching process using $SF_6$, $C_4F_8$ or other suitable dry etching gasses. Commercially available equipment for this purpose include a dry etch machine 688 manufactured by Surface Technology Systems of England.

Alternatively, the etching is achieved using a silicon etch solution located in a temperature controlled bath (not shown). Commercially available equipment for this purpose includes a Chemkleen bath and a WHRV circulator both of which are manufactured by Wafab Inc. of the U.S.A. A suitable wet etching conventional silicon etching solution is Isoform Silicon etch, which is commercially available from Micro-Image Technology Ltd. of England.

The bonded wafer is conventionally rinsed after etching and photoresist stripping is performed. The resulting etched bonded wafer is shown in FIG. 13C.

The etched channels 532 in wafer 530 are preferably coated with a dielectric material, such as epoxy, silicon oxide, solder mask, or any other suitable dielectric material, such as silicon nitride, silicon oxinitride, polyimide, BCB™, parylene, polynaphthalenes, fluorocarbons or accrylates. The resulting insulation layers 518 and 519 are preferably formed by spin coating as seen in step 690, or may be formed by any suitable method, such as spray coating, curtain coating, liquid phase deposition, physical vapor deposition, chemical vapor deposition, low pressure chemical vapor deposition, plasma enhanced chemical vapor deposition, rapid thermal chemical vapor deposition or atmospheric pressure chemical vapor deposition. The resulting coated bonded wafer is shown in FIG. 13D.

Following the formation of insulation layers 518 and 519, as seen in FIG. 13E, an opening 536 is formed in the insulation layer 519 between each pair of adjacent dies 520, by any suitable method. Openings 536 extend through insulation layer 519, thereby exposing pads 516. Formation of openings by conventional photolithographic techniques is shown at step 692 and typically employs a mask 694. Following conventional developing (not shown), the bonded wafer is optionally subjected to anti-corrosion treatment in a bath 696, containing a chromating solution 698, such as described in any of the following U.S. Pat. Nos.: 2,507,956; 2,851,385 and 2,796,370, the disclosure of which is hereby incorporated by reference.

Conductive layer deposition apparatus 700, which operates by vacuum deposition techniques, such as a sputtering machine manufactured by Balzers AG of Liechtenstein, is employed to produce conductive layer 538 (FIG. 13F) on one or more surfaces of each die 520 of the wafer 530.

Configuration of conductors 512, as shown in FIG. 13G, is carried out preferably by using conventional electrodeposited photoresist, which is commercially available from DuPont under the brand name Primecoat or from Shipley, under the brand name Eagle. The photoresist is applied to the wafers in a photoresist bath assembly 702, which is commercially available from DuPont or Shipley.

The photoresist is preferably light configured by a UV exposure system 704, using a mask 705 to define suitable etching patterns. The photoresist is then developed in a development bath 706, and then etched in a metal etch solution 708 located in an etching bath 710, thus providing a conductor configuration such as that shown in FIGS. 11A and 11B.

The exposed conductive strips shown in FIG. 13G are then plated, preferably by an electroless plating apparatus 712, which is commercially available from Okuno of Japan.

Following plating of the conductive strips, the bonded wafer is then coated with a solder mask as indicated at reference numeral 714 to define locations (FIG. 13H) of solder balls 523, which are then formed in a conventional manner, as indicated at reference numeral 715 (FIG. 13I). Alternatively, the balls 523 may not be required.

The bonded wafer is then diced into individual prepackaged integrated circuit devices by a dicing blade 716 (FIG. 13J). Preferably, dicing blade 716 is a diamond resinoid blade of thickness 2–12 mils. The resulting dies appear as illustrated generally in FIGS. 11A and 11B.

Figure 17A:
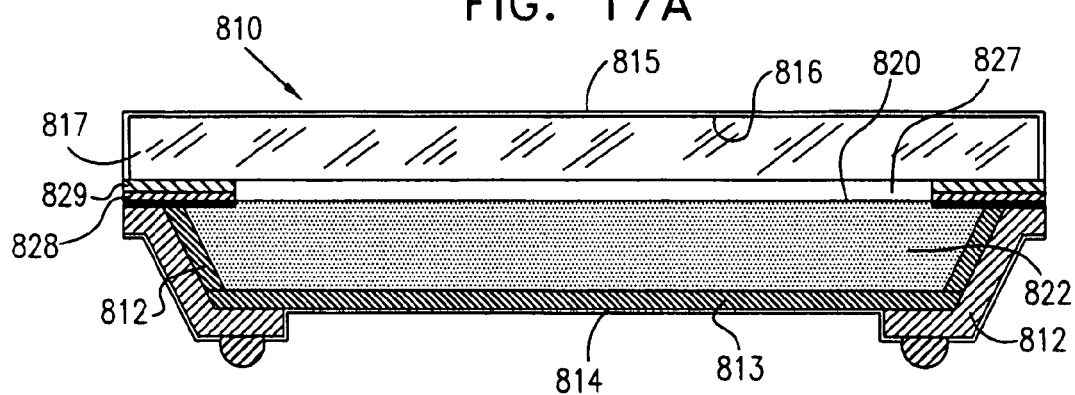
FIGS. 17A, 17B and 17C are simplified pictorial illustrations of three alternative embodiments of an integrally packaged optronic integrated circuit device constructed and operative in accordance with yet another preferred embodiment of the present invention and including spectral filters and/or anti-reflective coatings.
Figure 17B:
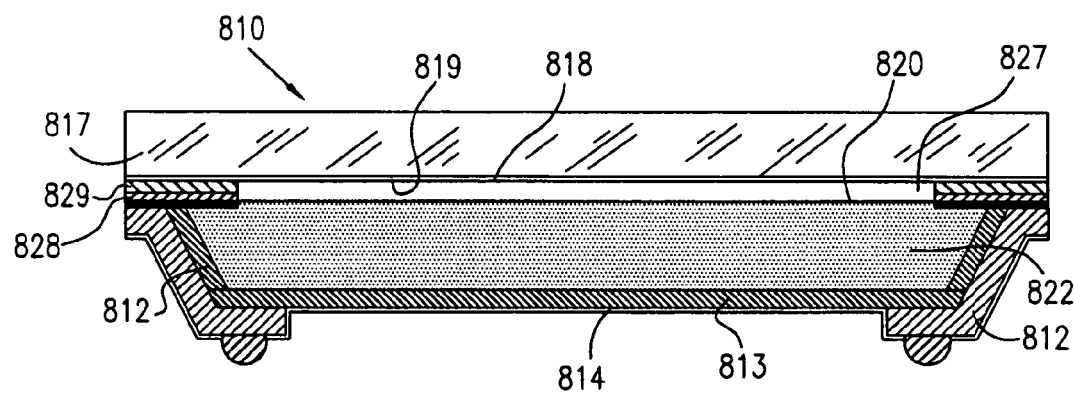
Figure 17C:
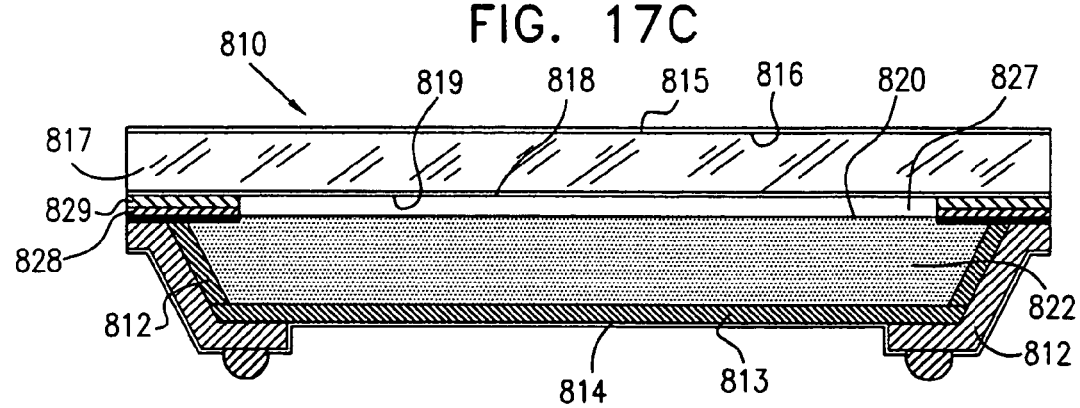

Reference is now made to FIGS. 17A–17C, which illustrate three alternative preferred embodiments of optronic integrated circuit devices, constructed and operative in accordance with a preferred embodiment of the present invention, including a relatively thin and compact, environmentally protected and mechanically strengthened optronic integrated circuit package 810 having a multiplicity of electrical conductors 812 plated directly over one or more insulation layers 813 without an intervening packaging layer. A solder mask 814 is preferably formed over conductors 812 and insulation layer 813 as shown.

FIG. 17A shows a dichroic filter and/or polarizer and/or anti-reflective coating and/or IR coating and/or color filter, such as an RGB or masking filter 815 formed on at least a portion of at least one outer facing surface 816 of a radiation transparent protective layer 817. Outer facing surface 816 may optionally include a top surface or an edge surface of radiation transparent protective layer 817. FIG. 17B illustrates a coating 818, which may be identical to coating 815, which is formed on at least a portion of an inner facing surface 819 of radiation transparent protective layer 817. FIG. 17C shows both coatings 815 and 818 on at least a portion of each of respective surfaces 816 and 819 of radiation transparent protective layer 817. In all three embodiments shown in FIGS. 17A–17C, optronic components are formed on a surface 820 of a silicon substrate 822 of conventional thickness, typically 10–250 microns. Surface 820 faces transparent protective layer 817. A bonding layer 828, such as an epoxy layer is used to attach protective layer 817 to the silicon substrate 822, as described hereinabove.

The optronic integrated circuit package 810, shown in FIGS. 17A, 17B and 17C, also includes at least one cavity 827 formed between silicone substrate 822 and radiation transparent protective layer 817. Cavity 827 is formed by mounting with at least one bonding layer 828, such as an epoxy layer, at least one spacer 829 between silicone substrate 822 and radiation transparent protective layer 817, when attaching silicone substrate 822 to radiation transparent protective layer 817, as described hereinbelow. Alternatively, cavity 827 may be formed by inserting at least one spacer 829 between silicone substrate 822 and radiation transparent protective layer 817, when attaching silicone substrate 822 to radiation transparent protective layer 817, as described hereinbelow. It is appreciated that spacer elements 829 of any suitable thickness may be provided, by grinding or any other suitable method, such that cavity 827 is defined to produce a specific fixed distance between radiation transparent protective layer 817 and silicone substrate 822.

Figure 18:
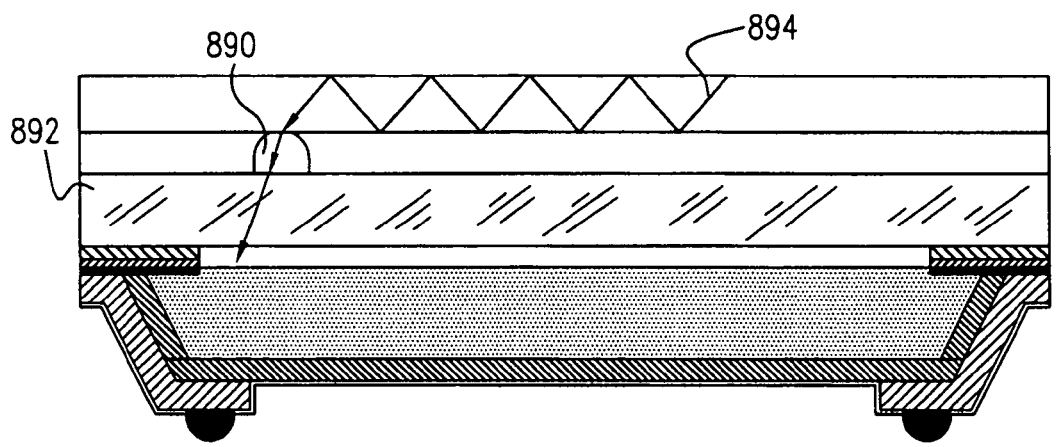
FIGS. 18 and 19 are simplified pictorial illustrations of two alternative embodiments of an integrally packaged optronic integrated circuit device constructed and operative in accordance with another preferred embodiment of the present invention having a waveguide and other optical components integrally formed on a transparent protective surface thereof.

Reference is now made to FIG. 18. The embodiment of FIG. 18 may be identical to that of FIG. 17A with or without the coating and is further distinguished therefrom in that it has a light coupling bump 890 formed on a radiation transparent protective layer 892. A waveguide 894 is shown optically coupled to the radiation transparent protective layer 892 via bump 890. Preferably the bump 890 is formed of a transparent organic material, which is somewhat conforming, such that mechanical pressure thereon produces a slight deformation thereof and enables an evanescent light wave to pass through an interface defined therewith.

Figure 19:
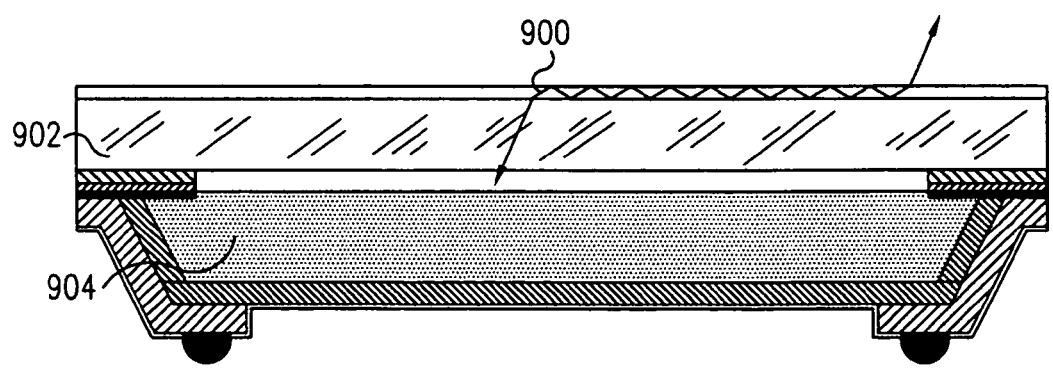

Reference is now made to FIG. 19. The embodiment of FIG. 19 may be identical to that of FIG. 17A with or without the coating and is distinguished therefrom in that it has a wave guide 900 and possibly other optical elements (not shown) formed on a radiation transparent protective layer 902, as by conventional integrated optics techniques. This arrangement enables optical communication between an optronic component formed on a silicon substrate 904 via the radiation transparent protective layer 902 and the wave guide 900.

Figure 20A:
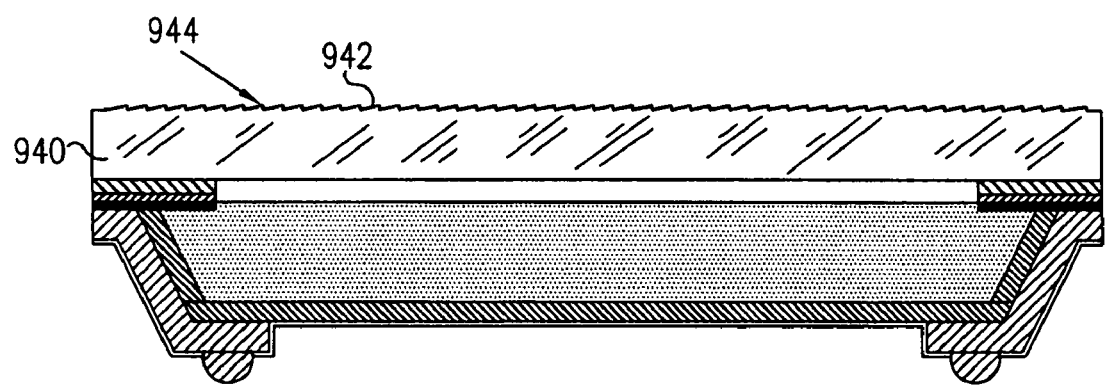
FIG. 20A is a simplified pictorial illustration of an embodiment of an integrally packaged optronic integrated circuit device constructed and operative in accordance with still another preferred embodiment of the present invention wherein an optical grating is integrated with the integrally packaged optronic integrated circuit device.

Reference is now made to FIG. 20A. The embodiment of FIG. 20A may be identical to that of FIG. 17A with or without the coating and is distinguished therefrom in that it has a radiation transparent protective layer 940 which is formed with an optical grating 942 on an outer facing surface 944 thereof.

Figure 20B:
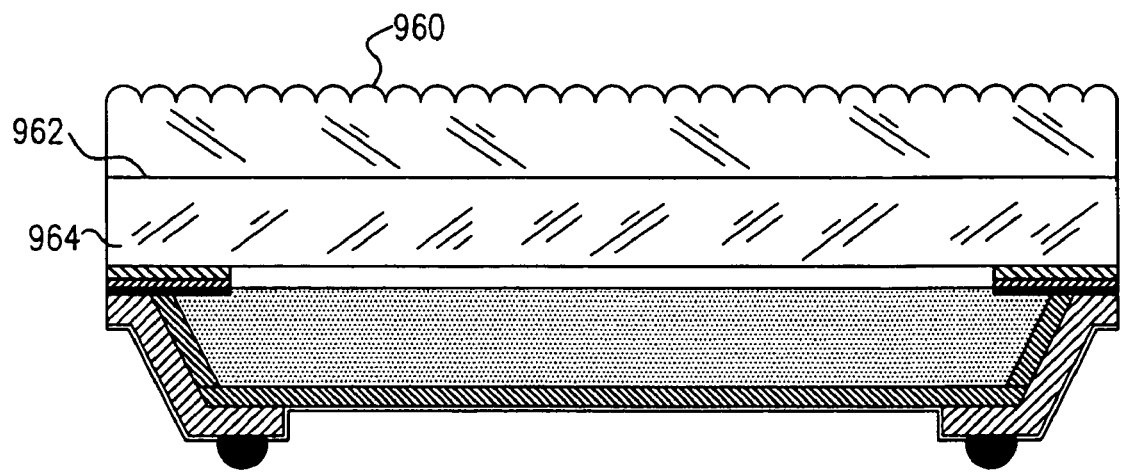
FIG. 20B is a simplified pictorial illustration of an embodiment of an integrally packaged optronic integrated circuit device constructed and operative in accordance with still another preferred embodiment of the present invention wherein at least one lens is integrated with the integrally packaged optronic integrated circuit device.

Reference is now made to FIG. 20B. The embodiment of FIG. 20B may be identical to that of FIG. 17A with or without the coating and is distinguished therefrom in that it has a substrate formed with at least one lens and preferably an array 960 of microlenses attached on an outer facing surface 962 of a radiation transparent protective layer 964. It is appreciated that the at least one lens may be attached to radiation transparent protective layer 964 before the radiation transparent protective layer is adhered to the substrate, or at any subsequent point in the process. As a further alternative, the outer surface 962 of radiation transparent protective layer 964 may comprise at least one lens.

Figure 20C:
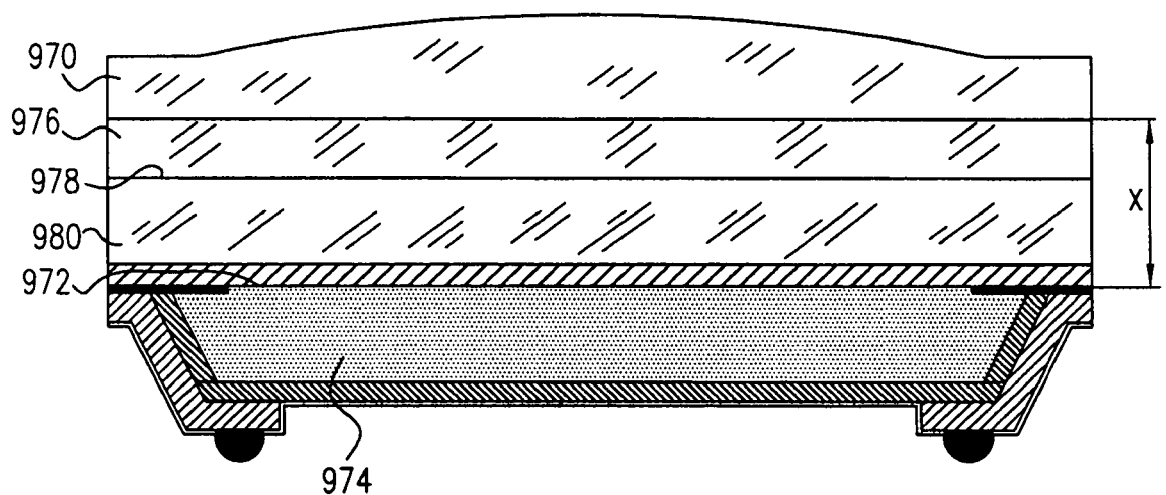
FIG. 20C is a simplified pictorial illustration of an embodiment of an integrally packaged optronic integrated circuit device constructed and operative in accordance with yet another preferred embodiment of the present invention wherein a lens is integrated with the integrally packaged optronic integrated circuit device at a fixed distance from the active surface thereof.

Reference is now made to FIG. 20C. The embodiment of FIG. 20C may be identical to that of FIG. 17A with or without the coating and is distinguished therefrom in that it has a substrate formed with at least one lens 970 which is maintained at a precisely fixed distance X with respect to an active surface 972 of a silicon substrate 974, preferably with respect to the optronic semiconductor circuitry. The precisely fixed distance may be determined to an accuracy of 1–10 microns, preferably by precise machining of spacer 529 and/or of an intermediate light transmissive layer 976 which is fixed between lens 970 and an outer facing surface 978 of a radiation transparent protective layer 980. Alternatively intermediate layer 976 may be obviated. As a further alternative, the distance between the lens 970 and the active surface 972 need not be precisely fixed.

Figure 20D:
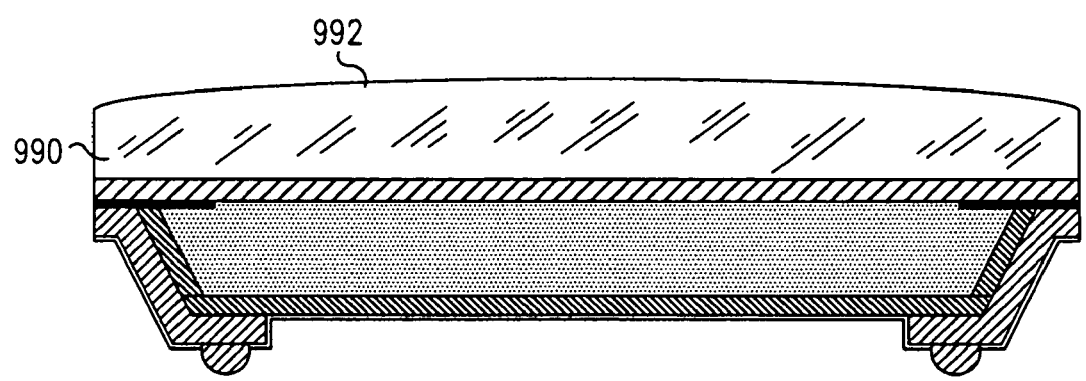
FIG. 20D is a simplified pictorial illustration of an embodiment of an integrally packaged optronic integrated circuit device constructed and operative in accordance with still another preferred embodiment of the present invention wherein at least one lens is integrated with the integrally packaged optronic integrated circuit device.

Reference is now made to FIG. 20D. The embodiment of FIG. 20D may be identical to that of FIG. 17A with or without the coating and is distinguished therefrom in that it has a radiation transparent protective layer 990 including an outer laying surface 992 which may comprise at least one lens.

Figure 21A:
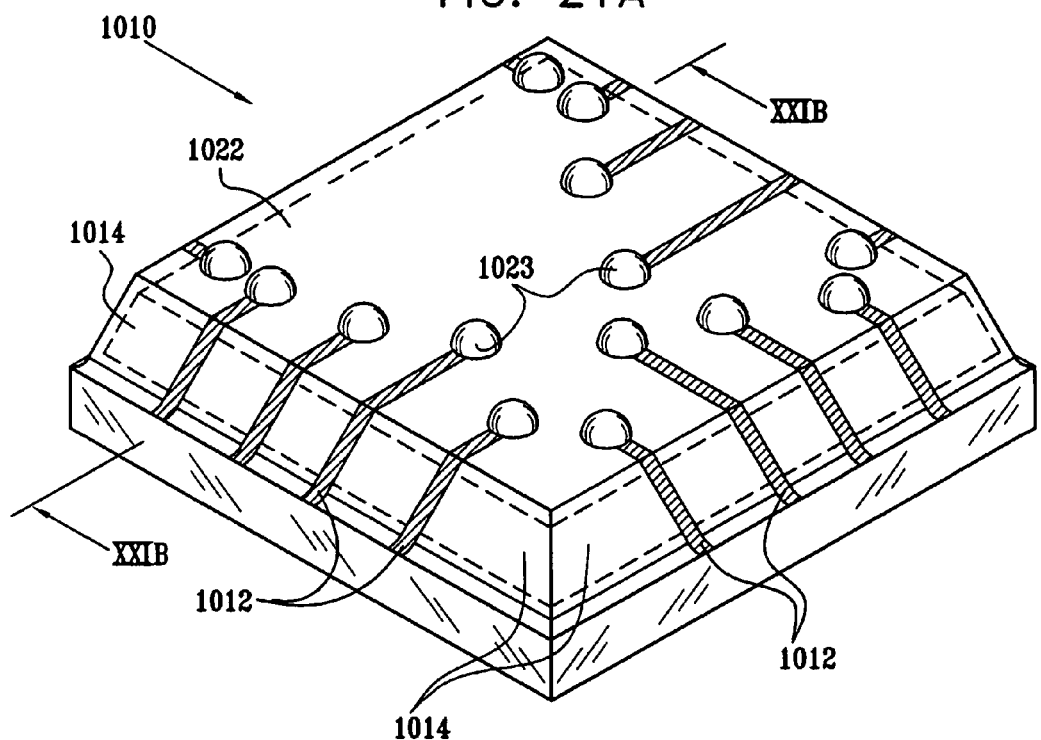
FIGS. 21A and 21B are, respectively, a simplified pictorial illustration and a simplified sectional illustration of an integrally packaged optronic integrated circuit device constructed and operative in accordance with a preferred embodiment of the present invention, the sectional illustration being taken along lines XXIB—XXIB in FIG. 21A.

Reference is now made to FIGS. 21A–23J, which illustrate integrated circuit devices, preferably optronic integrated circuit devices, and the production thereof, in accordance with a preferred embodiment of the present invention. As seen in FIGS. 21A and 21B, the integrated circuit device includes a relatively thin and compact, environmentally protected and mechanically strengthened, integrated circuit package 1010, preferably an optronic integrated circuit package, having a multiplicity of electrical conductors 1012 plated along the edge surfaces 1014 thereof.

It is a particular feature of the present invention that conductors 1012 are electrically connected to pads 1016 at edges thereof, and preferably are formed directly over insulation layers 1018 and 1019 overlying a die 1020, without there being an intervening packaging layer, such as a glass layer. Insulation layers 1018 and 1019 may each comprise one or more layers such as dielectric layers and/or passivation layers and may be different from each other in materials and/or thickness or alternatively may be identical. As a further alternative, insulation layers 1018 and 1019 may be obviated. The embodiments of FIGS. 21A–30C are all characterized additionally in that a portion of conductor 1012 is in electrically conductive contact with an edge of pad 1016, as shown clearly in FIG. 21B.

Figure 21B:
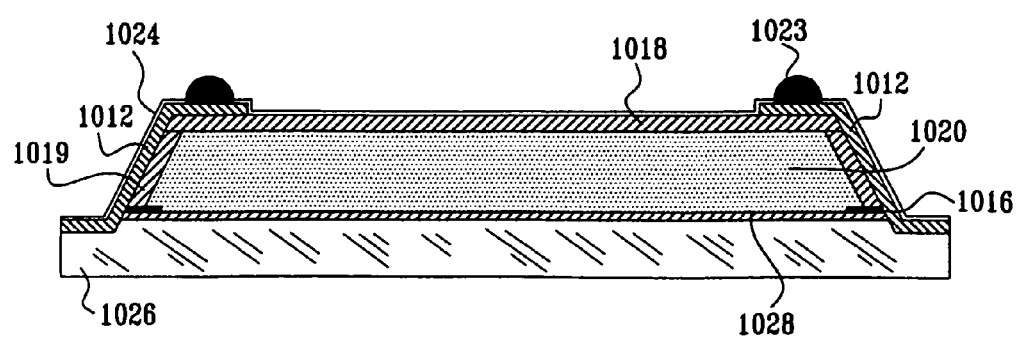

In accordance with a preferred embodiment of the invention, conductors 1012 extend over edge surfaces 1014 onto a planar surface 1022 of the package 1010. This contact arrangement permits flat surface mounting of package 1010 onto a circuit board. It is noted that the integrated circuit package 1010 may include one or more of the following elements (not shown): an integrally formed dichroic filter, color filter, antireflective coating, polarizer, optical grating, integrated wave guide and optical coupling bumps in an optronic embodiment. In a non-optronic embodiment, the above elements are normally not present. As seen in FIGS. 21A and 21B, optronic integrated circuit package 1010 may also include contact bumps, such as solder balls 1023 formed on electrical conductors 1012, at apertures formed in a solder mask 1024, however, solder balls 1023 are not required.

Figure 21C:
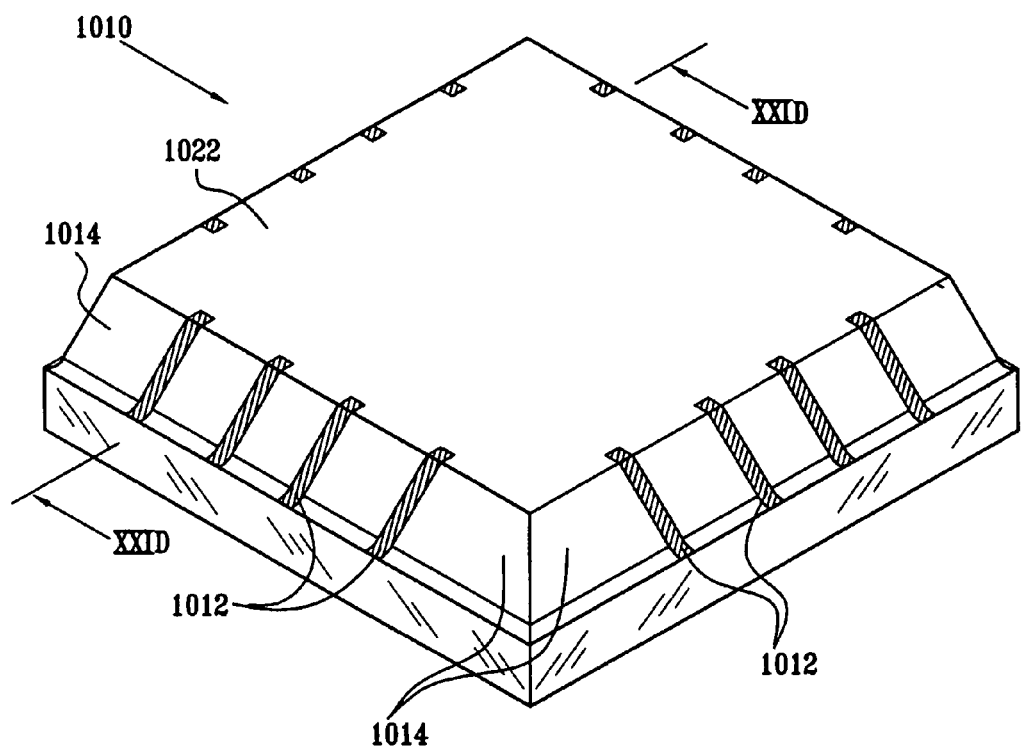
FIGS. 21C and 21D are, respectively, a simplified pictorial illustration and a simplified sectional illustration of an integrally packaged optronic integrated circuit device constructed and operative in accordance with another preferred embodiment of the present invention, the sectional illustration being taken along lines XXID—XXID in FIG. 21C.
Figure 21D:
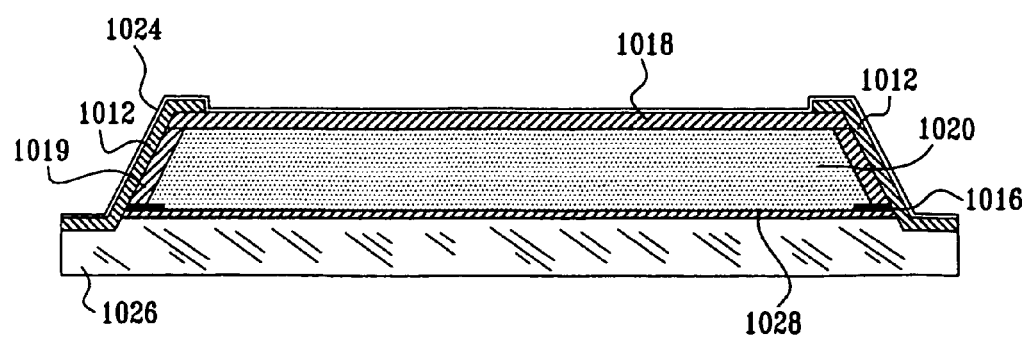

As a further alternative, as shown in FIGS. 21C and 21D, the conductors 1012 do not extend beyond edge surfaces 1014 onto planar surface 1022 or extend onto planar surface 1022 only to a limited extent, thereby defining peripheral contacts. In such a case, the solder mask 1024 normally does not extend onto planar surface 1022 or may be obviated entirely.

As an additional alternative, the solder balls 1023 may be replaced by contacts suitable for ACF engagement, or may comprise Ball Grid Array (BGA) contacts.

Insulation layers 1018 and 1019 may operate as mechanically conforming layers which are adapted to compensate for differences in thermal expansion coefficients of conductors 1012, solder balls 1023 and die 1020.

The integrated circuit package 1010, preferably an optronic integrated circuit package, shown in FIGS. 21A and 21B, also preferably includes a radiation transparent protective insulating cover plate 1026 and a bonding layer 1028, such as an epoxy layer, preferably a radiation transparent epoxy layer, used to attach cover plate 1026 to die 1020, as described hereinbelow.

It is appreciated that the methods described hereinbelow provide optronic integrated circuit packages 1010 that are in the range defined as chip scale packages, typically no more than 20% larger in area than the size of the chip. It is also appreciated that the methods described hereinbelow provide optronic integrated circuit packages 1010 in which the packaging process is carried out at wafer level up to dicing of a wafer-wise package into separate packaged dies.

Figure 22A:
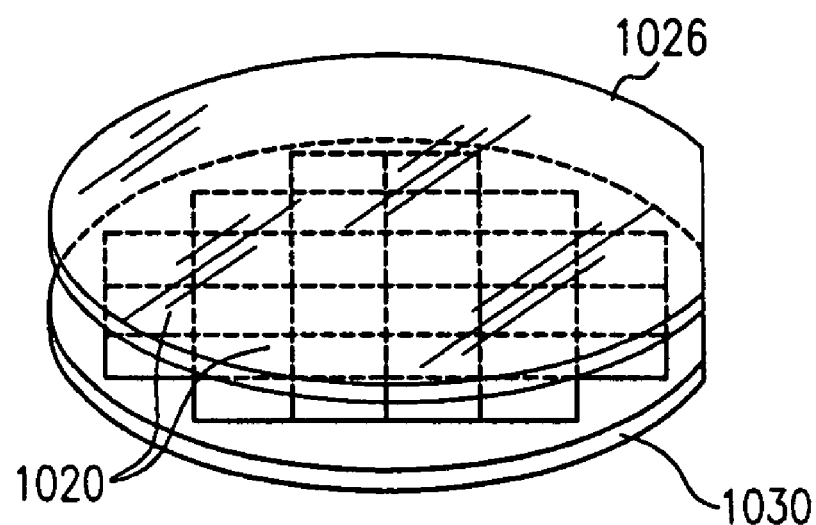
FIGS. 22A and 22B are simplified pictorial illustrations of the attachment of a transparent protective insulating cover plate to a wafer containing a plurality of integrated circuit dies in accordance with a preferred embodiment of the present invention.
Figure 22B:
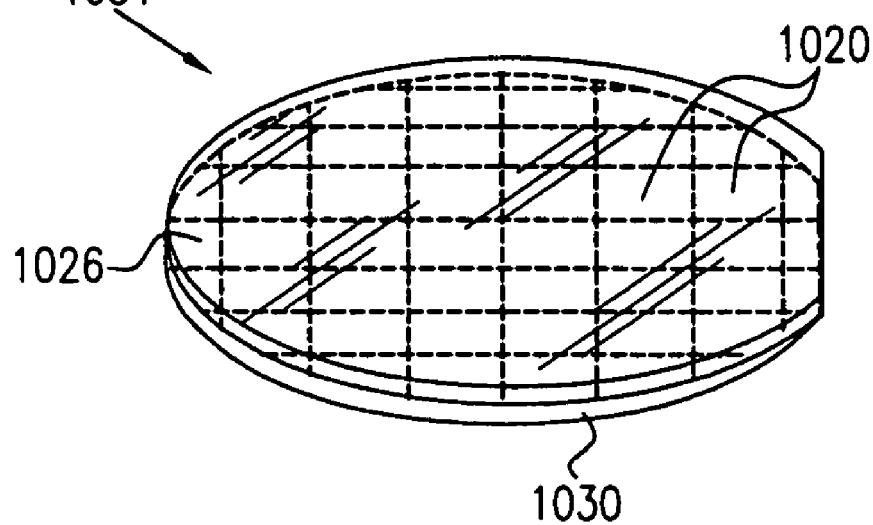

FIGS. 22A and 22B are simplified pictorial illustrations of the attachment of a transparent protective insulating cover plate to a wafer containing a plurality of integrated circuit dies in accordance with the present invention. As seen in FIGS. 22A and 22B, a silicon wafer 1030 includes a plurality of finished dies 1020, having active surfaces formed thereon by conventional techniques, and is bonded at the active surfaces to cover plate 1026, thereby defining a bonded wafer 1031.

In accordance with a preferred embodiment of the present invention, as illustrated in FIG. 23A, wafer 1030, includes a plurality of finished dies 1020, having active surfaces formed thereon by conventional techniques, and is bonded at the active surfaces to cover plate 1026 via bonding layer 1028. The insulating cover plate 1026 typically comprises glass, quartz, sapphire or any other suitable radiation transparent insulative substrate. As seen in FIG. 23A, electrical pads 1016 are formed on the active surfaces of silicon wafer 1030.

The cover plate 1026 may be colored or tinted in order to operate as a spectral filter. Alternatively, a dichroic or colored spectral filter may be formed on at least one surface of the cover plate 1026.

It is a particular feature of the present invention that cover plate 1026 and bonding layer 1028 are preferably transparent to radiation in a spectral region useful for optronic applications. Alternatively, the bonding layer 1028 may also function as a spectral filter and may incorporate a suitable dye for this purpose.

It is appreciated that certain steps in the conventional fabrication of silicon wafer 1030 may be eliminated when the wafer is used in accordance with the present invention. These steps include the provision of via openings above pads, wafer back grinding and wafer back metal coating.

The silicon wafer 1030 may be formed with an integral color filter array by conventional lithography techniques at any suitable location therein. Prior to the bonding step of FIG. 23A, a filter may be formed and configured by conventional techniques over the cover plate 1026, such that the filter plane lies between cover plate 1026 and the bonding layer 1028.

Following the bonding step described hereinabove, the silicon wafer 1030 is preferably ground down from an original thickness L1, typically in the range of 400 to 1000 microns, to a decreased thickness L2, typically 10–250 microns, as shown in FIG. 23B. This reduction in wafer thickness is enabled by the additional mechanical strength provided by the bonding thereto of the insulating cover plate 1026. As a further alternative, the silicon wafer 1030 may be removed nearly in its entirety. This is useful when using a silicon on isolator (SOI) fabrication technique.

Following the reduction in thickness of the wafer, which is optional, the wafer is etched, using a photolithography process, along its back surface along predetermined dice lines that separate the individual dies 1020. Etched channels 1032 are thus produced, which extend entirely through the thickness of the silicon substrate, typically 10–250 microns. The etched bonded wafer is shown in FIG. 23C.

The aforementioned etching typically is achieved by a dry etching process using $SF_6$, $C_4F_8$ or other suitable dry etching gasses. Alternatively, the etching takes place in conventional silicon etching solution, such as a combination of 2.5% hydrofluoric acid, 50% nitric acid, 10% acetic acid and 37.5% water, so as to etch the silicon down through any field oxide layer to expose pads 1016, as shown in FIG. 23C. The result of the silicon etching is a plurality of separated dies 1020, each of which includes silicon of thickness about 10–250 microns.

As seen in FIG. 23D, etched channels 1032 are preferably filled with an insulation material defining insulating layer 1019, such as epoxy, solder mask, or any other suitable dielectric material, such as polyimide, BCB™, polyurethanes, polynaphthalenes, fluorocarbons or accrylates. Following the formation of insulation layer 1019, as seen in FIG. 23E, the surface of bonded wafer 1031 is ground to define a flat surface. Insulating layer 1018 is then formed thereover as seen in FIG. 23F.

Figure 23G:
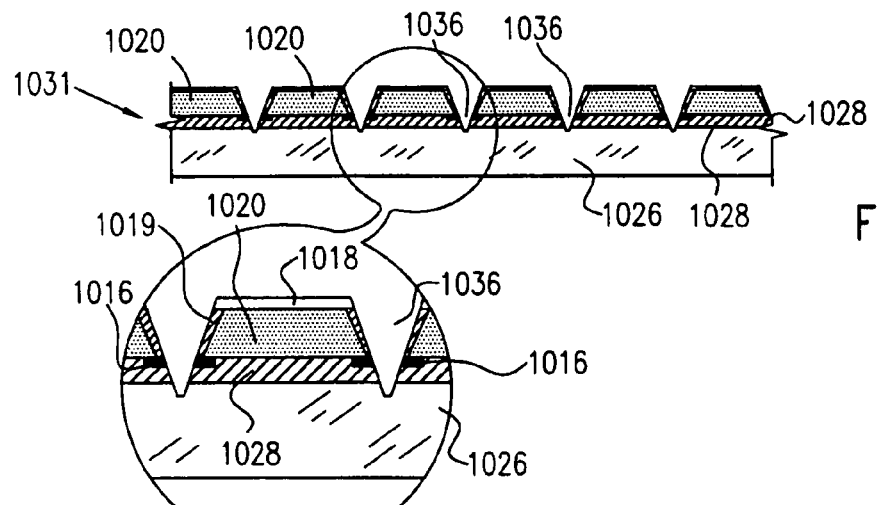

The bonded wafer 1031 is then notched at filled channels 1032 to define notches 1036 between each pair of adjacent dies 1020, by any suitable method. Notches 1036 extend through insulation layers 1018 and 1019, through pads 1016 thereby exposing edges of pads 1016 and through bonding layer 1028, as seen in FIG. 23G. Notches 1036 may extend partially into protective layer 1026.

Figure 23H:
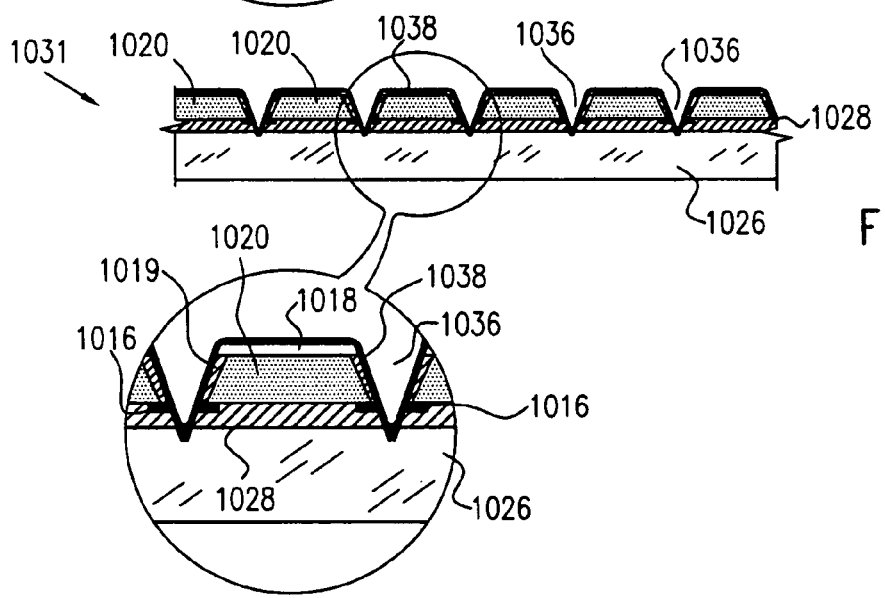

As seen in FIG. 23H, a conductive layer 1038 is formed over the plurality of separated dies 1020, through openings 1036 to cover the exposed portions of pads 1016 and the dielectric material defining insulation layers 1018 and 1019. Conductive layer 1038 is preferably formed of aluminum, or may be formed of any suitable conductive material or combination of materials, such as aluminum, copper, titanium, titanium tungsten, or chrome.

Figure 23I:
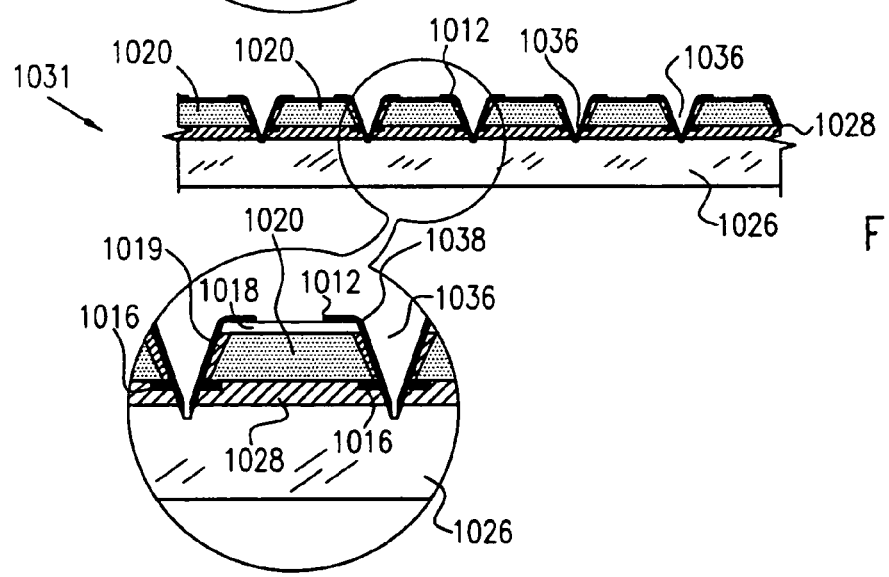

FIG. 23I shows patterning of the conductive layer 1038, typically by conventional photolithographic techniques, to define a plurality of conductors 1012 which electrically contact edges of one or more pads 1016 on dies 1020 and are appropriately plated.

Figure 23J:
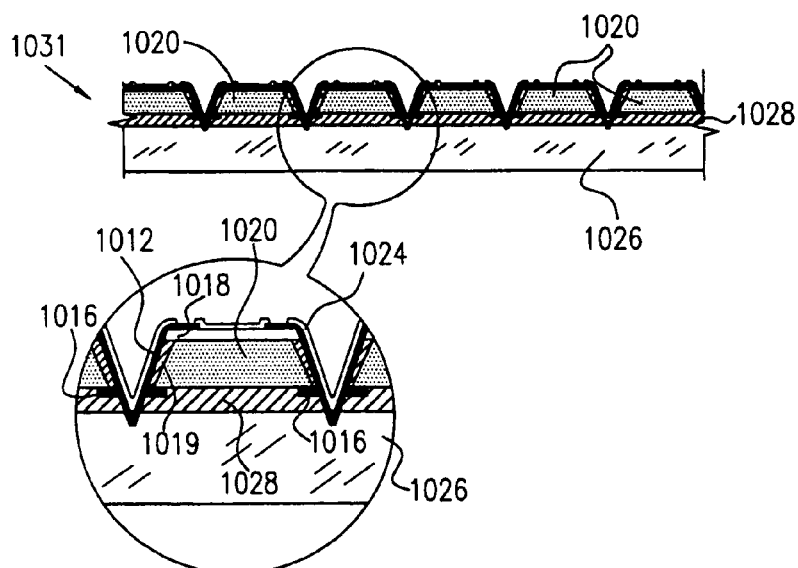
Figure 23K:
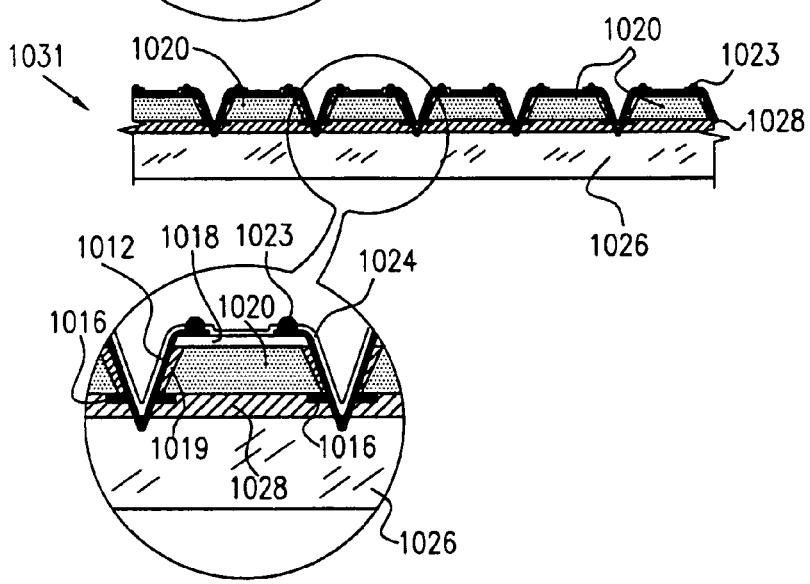

FIG. 23J shows the bonded wafer being coated with a layer of protective material, preferably solder mask 1024 or other protective material such as parylene, BCB™, or polyamide, which is patterned to define apertures therein communicating with conductors 1012 through which are formed solder balls 1023 in electrical contact with conductors 1012, as shown in FIG. 23K.

Figure 23L:
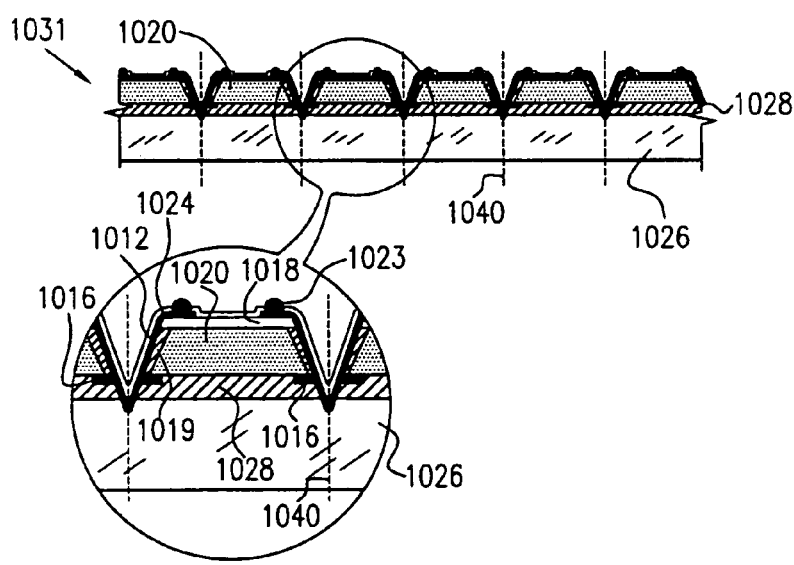

In accordance with a preferred embodiment of the present invention, the bonded wafer is then diced, as shown in FIG. 23L, along lines 1040, to provide individual integrated circuit packages, similar to integrated circuit package 1010 of FIGS. 21A and 21B.

Reference is now made to FIG. 24, which is a partially cut away, detailed, pictorial illustration of an integrally packaged optronic integrated circuit device produced from the bonded wafer of FIG. 23L. As seen in FIG. 24, the integrated circuit package includes insulating cover plate 1026, joined by bonding layer 1028 to die 1020. Edges of pads 1016 are in electrical contact with conductors 1012, which are directly formed over dielectric insulation layers 1018 and 1019, as described hereinabove. It is appreciated that insulation layers 1018 and 1019 may each comprise multiple layers.

Figure 25:
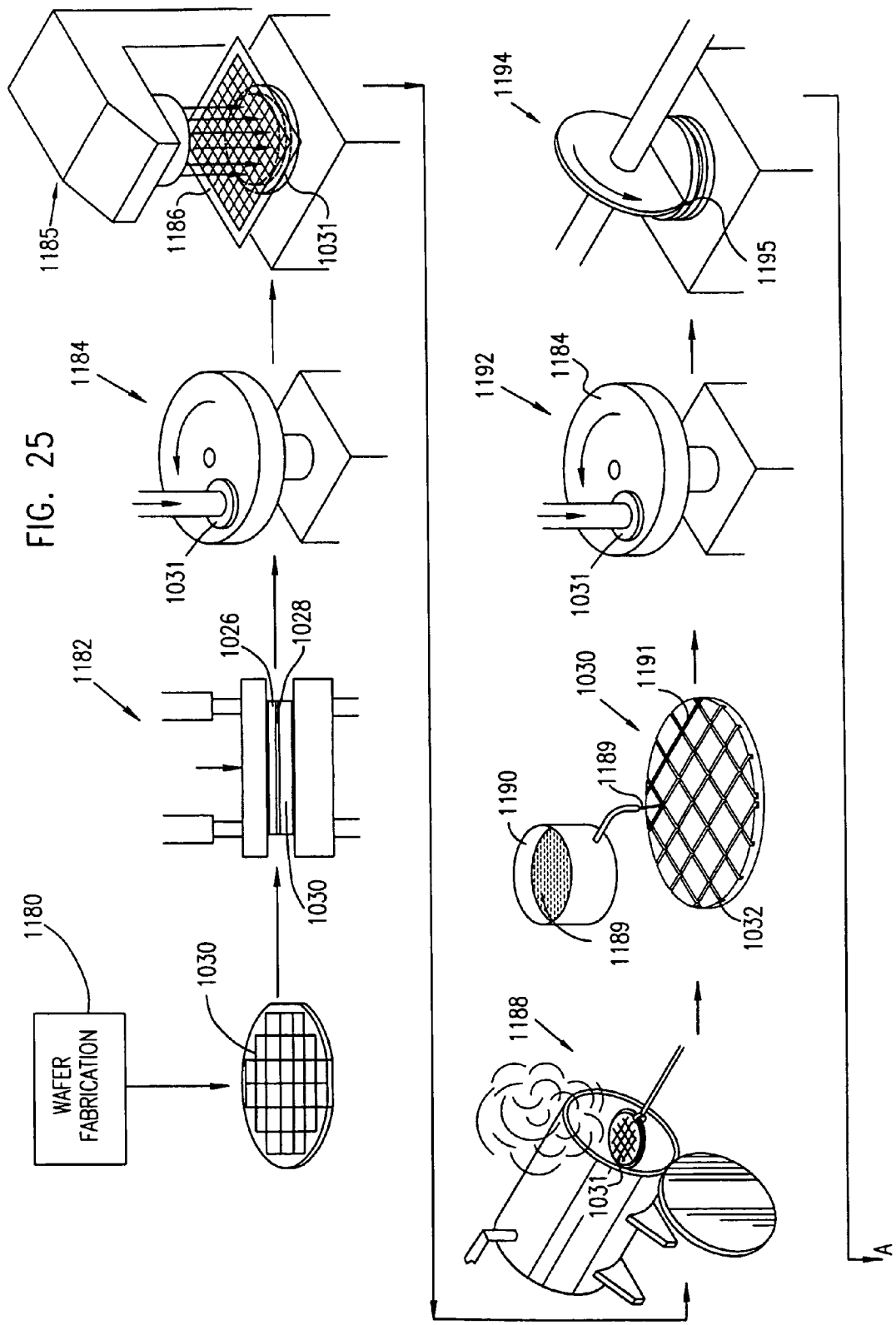

Reference is now made to FIGS. 25 and 26, which together illustrate apparatus for producing integrated circuit devices in accordance with a preferred embodiment of the present invention. A conventional wafer fabrication facility 1180 provides wafers 1030. Each individual wafer 1030 is bonded on the side defining active surfaces to a protective layer, such as glass layers, forming cover plate 1026, using bonding layer 1028, by bonding apparatus 1182, preferably having facilities for rotation of the bonded wafer 1030, the cover plate 1026 and the bonding layer 1028 so as to obtain even distribution of the bonding material.

The bonded wafer 1031 (FIGS. 22B and 23A) is thinned at its non-active surface side as by grinding apparatus 1184, such as model BFG 841, which is commercially available from Disco Ltd. of Japan. The bonded wafer 1031 (FIG. 23B) is then etched at its non-active surface side, preferably by photolithography, such as by using conventional spin-coated photoresist, which is commercially available from Hoechst, under the brand designation AZ 4562.

The photoresist is preferably mask exposed by a suitable UV exposure system 1185, such as a Suss MicrTech AG, model MA200, through a lithography mask 1186.

The photoresist is then developed in a development bath (not shown), baked and the bonded wafer is then silicon etched typically by a dry etching process using $SF_6$, $C_4F_8$ or other suitable dry etching gasses. Commercially available equipment for this purpose include a dry etch machine 1188 manufactured by Surface Technology Systems of England.

Alternatively, the etching is achieved using a silicon etch solution located in a temperature controlled bath (not shown). Commercially available equipment for this purpose includes a Chemkleen bath and a WHRV circulator both of which are manufactured by Wafab Inc. of the U.S.A. A suitable wet etching conventional silicon etching solution is Isoform Silicon etch, which is commercially available from Micro-Image Technology Ltd. of England.

The etched channels 1032 in wafer 1030 are preferably filled with insulation material 1189 (FIG. 23D), such as epoxy, solder mask, or any other suitable dielectric material, such as polyimide, BCB™, polyurethanes, polynaphthalenes, fluorocarbons or accrylates. The channels 1032 are filled using a dispenser 1190, to obtain filled channels 1191. Alternatively, any other suitable filling method may be used such as spin coating, spray coating or curtain coating. Subsequently, as seen in step 1192, the bonded wafer 1031 is once again ground to define a flat surface as by grinding apparatus 1184, such as model BFG 841, which is commercially available from Disco Ltd. of Japan (FIG. 23E).

As seen in step 1194, notching apparatus 1195, such as model 641 or 341, which is commercially available from Disco Ltd. of Japan partially cuts away the bonded wafer sandwich (FIG. 23G).

Following notching, the notched wafer is optionally subjected to anti-corrosion treatment in a bath 1196, containing a chromating solution 1198, such as described in any of the following U.S. Pat. Nos.: 2,507,956; 2,851,385 and 2,796,370, the disclosure of which is hereby incorporated by reference.

Conductive layer deposition apparatus 1200, which operates by vacuum deposition techniques, such as a sputtering machine manufactured by Balzers AG of Liechtenstein, is employed to produce conductive layer 1038 (FIG. 23H) on one or more surfaces of each die 1020 of the wafer 1030.

Configuration of conductors 1012, as shown in FIG. 23I, is carried out preferably by using conventional electrodeposited photoresist, which is commercially available from DuPont under the brand name Primecoat or from Shipley, under the brand name Eagle. The photoresist is applied to the bonded wafers in a photoresist bath assembly 1202, which is commercially available from DuPont or Shipley.

The photoresist is preferably light configured by a UV exposure system 1204, using a mask 1205 to define suitable etching patterns. The photoresist is then developed in a development bath 1206, and then etched in a metal etch solution 1208 located in an etching bath 1210, thus providing a conductor configuration such as that shown in FIGS. 21A and 21B.

The exposed conductive strips shown in FIG. 23I are then plated, preferably by an electroless plating apparatus 1212, which is commercially available from Okuno of Japan.

Following plating of the conductive strips, the bonded wafer is then coated with a solder mask as indicated at reference numeral 1214 to define locations (FIG. 23J) of solder balls 1023, which are then formed in a conventional manner, as indicated at reference numeral 1215 (FIG. 23K). Alternatively, the balls 1023 may not be required.

The bonded wafer is then diced into individual prepackaged integrated circuit devices by a dicing blade 1216 (FIG. 23L). Preferably, dicing blade 1216 is a diamond resinoid blade of thickness 2–12 mils. The resulting dies appear as illustrated generally in FIGS. 21A and 21B.

Figure 27A:
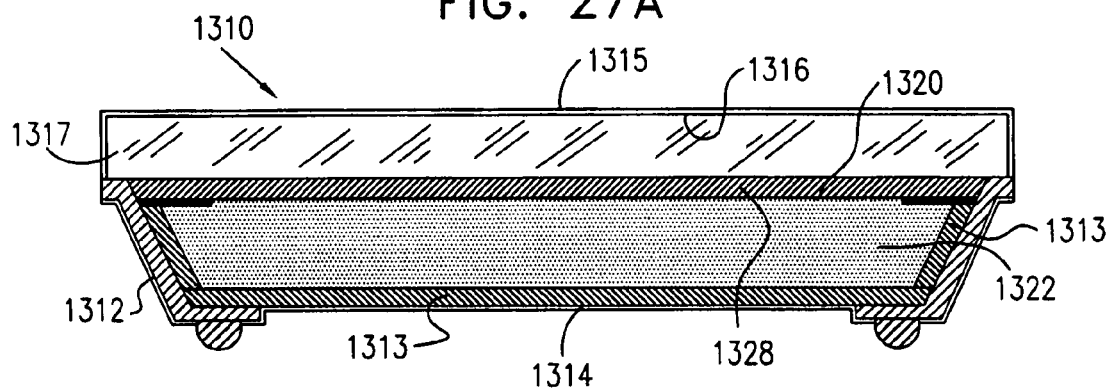
FIGS. 27A, 27B and 27C are simplified pictorial illustrations of three alternative embodiments of an integrally packaged optronic integrated circuit device constructed and operative in accordance with yet another preferred embodiment of the present invention and including spectral filters and/or anti-reflective coatings.
Figure 27B:
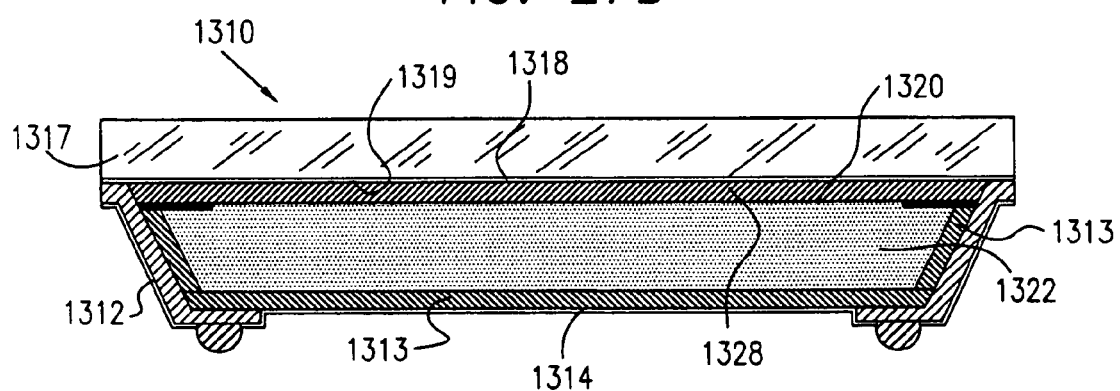
Figure 27C:
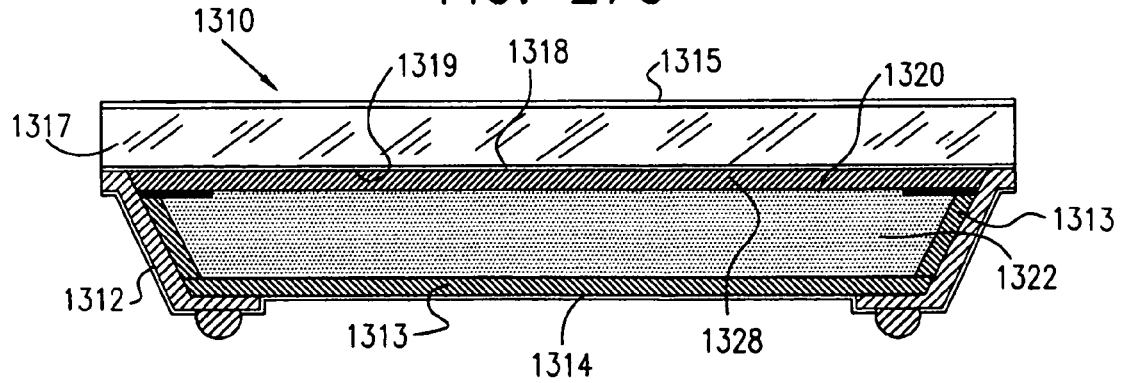

Reference is now made to FIGS. 27A–27C, which illustrate three alternative preferred embodiments of optronic integrated circuit devices, constructed and operative in accordance with a preferred embodiment of the present invention, including a relatively thin and compact, environmentally protected and mechanically strengthened optronic integrated circuit package 1310 having a multiplicity of electrical conductors 1312 plated directly over one or more insulation layers 1313 without an intervening packaging layer. A solder mask 1314 is preferably formed over conductors 1312 and insulation layer 1313 as shown.

FIG. 27A shows a dichroic filter and/or polarizer and/or anti-reflective coating and/or IR coating and/or color filter, such as an RGB or masking filter 1315 formed on at least a portion of at least one outer facing surface 1316 of a radiation transparent protective layer 1317. Outer facing surface 1316 may optionally include a top surface or an edge surface of radiation transparent protective layer 1317. FIG. 27B illustrates a coating 1318, which may be identical to coating 1315, which is formed on at least a portion of an inner facing surface 1319 of radiation transparent protective layer 1317. FIG. 27C shows both coatings 1315 and 1318 on at least a portion of each of respective surfaces 1316 and 1319 of radiation transparent protective layer 1317. In all three embodiments shown in FIGS. 27A–27C, optronic components are formed on a surface 1320 of a silicon substrate 1322 of conventional thickness, typically 10–250 microns. Surface 1320 faces transparent protective layer 1317. A radiation transparent bonding layer 1328, such as an epoxy layer, is used to attach protective layer 1317 to the silicon substrate 1322, as described hereinabove.

Figure 28:
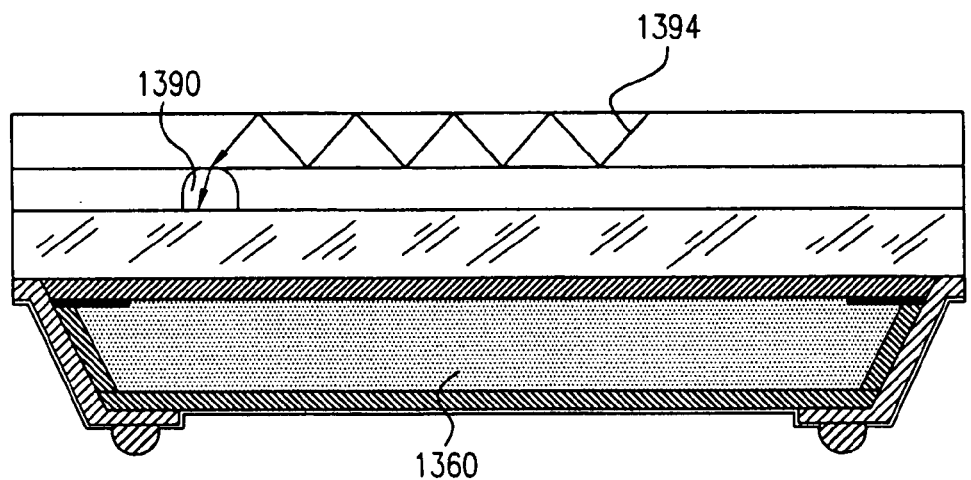
FIGS. 28 and 29 are simplified pictorial illustrations of two alternative embodiments of an integrally packaged optronic integrated circuit device constructed and operative in accordance with another preferred embodiment of the present invention having a waveguide and other optical components integrally formed on a transparent protective surface thereof.

Reference is now made to FIG. 28. The embodiment of FIG. 28 may be identical to that of FIG. 27A with or without the coating and is further distinguished therefrom in that it has a light coupling bump 1390 formed on a radiation transparent protective layer 1392. A waveguide 1394 is shown optically coupled to the radiation transparent protective layer 1392 via bump 1390. Preferably the bump 1390 is formed of a transparent organic material, which is somewhat conforming, such that mechanical pressure thereon produces a slight deformation thereof and enables an evanescent light wave to pass through an interface defined therewith.

Figure 29:
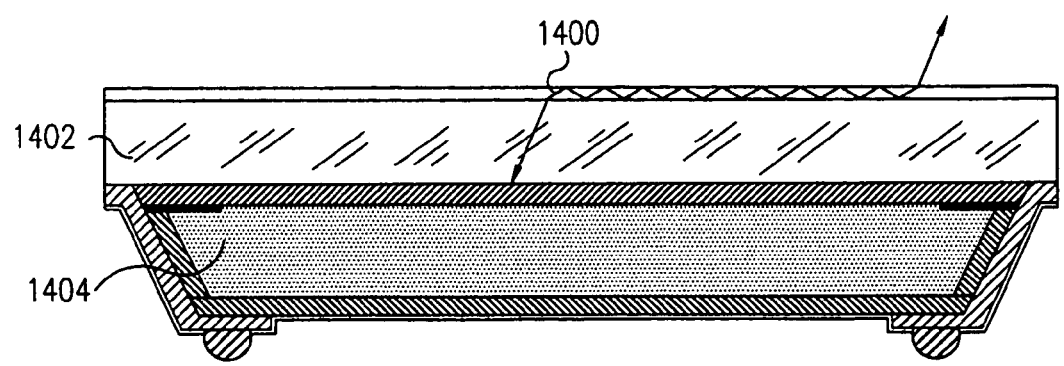

Reference is now made to FIG. 29. The embodiment of FIG. 29 may be identical to that of FIG. 27A with or without the coating and is distinguished therefrom in that it has a wave guide 1400 and possibly other optical elements (not shown) formed on a radiation transparent protective layer 1402, as by conventional integrated optics techniques. This arrangement enables optical communication between an optronic component formed on a silicon substrate 1404 via the radiation transparent protective layer 1402 and the wave guide 1400.

Figure 30A:
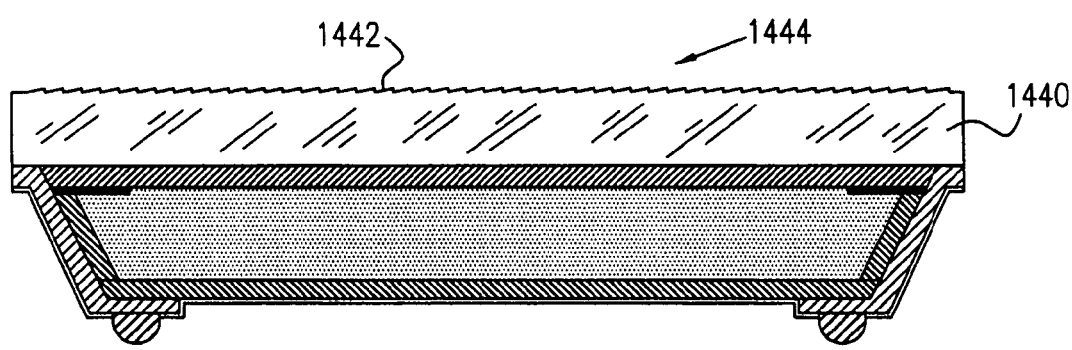
FIG. 30A is a simplified pictorial illustration of an embodiment of an integrally packaged optronic integrated circuit device constructed and operative in accordance with still another preferred embodiment of the present invention wherein an optical grating is integrated with the integrally packaged optronic integrated circuit device.

Reference is now made to FIG. 30A. The embodiment of FIG. 30A may be identical to that of FIG. 27A with or without the coating and is distinguished therefrom in that it has a radiation transparent protective layer 440 which is formed with an optical grating 1442 on an outer facing surface 1444 thereof.

Figure 30B:
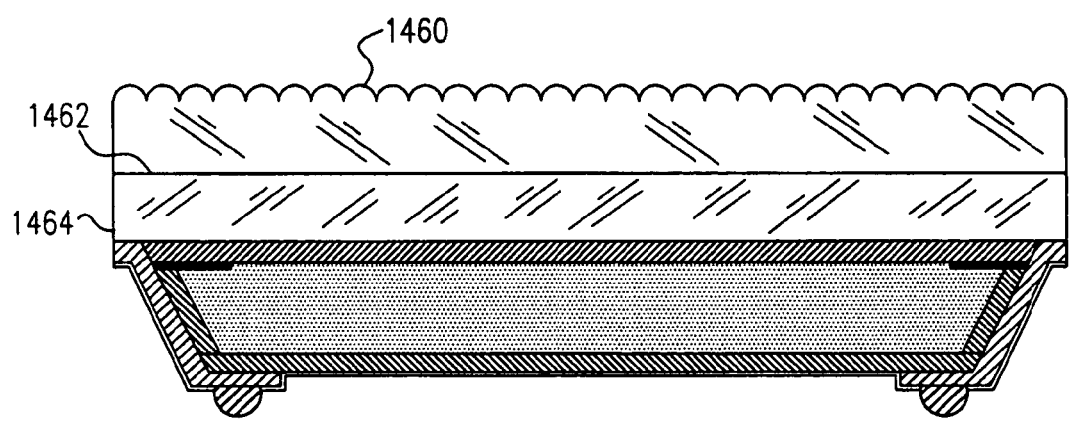
FIG. 30B is a simplified pictorial illustration of an embodiment of an integrally packaged optronic integrated circuit device constructed and operative in accordance with still another preferred embodiment of the present invention wherein at least one lens is integrated with the integrally packaged optronic integrated circuit device.

Reference is now made to FIG. 30B. The embodiment of FIG. 30B may be identical to that of FIG. 27A with or without the coating and is distinguished therefrom in that it has a substrate formed with at least one lens and preferably an array 1460 of microlenses attached on an outer facing surface 1462 of a radiation transparent protective layer 1464. It is appreciated that the at least one lens may be attached to radiation transparent protective layer 1464 before the radiation transparent protective layer is adhered to the substrate, or at any subsequent point in the process. As a further alternative, the outer surface 1462 of radiation transparent protective layer 1464 may comprise at least one lens.

Figure 30C:
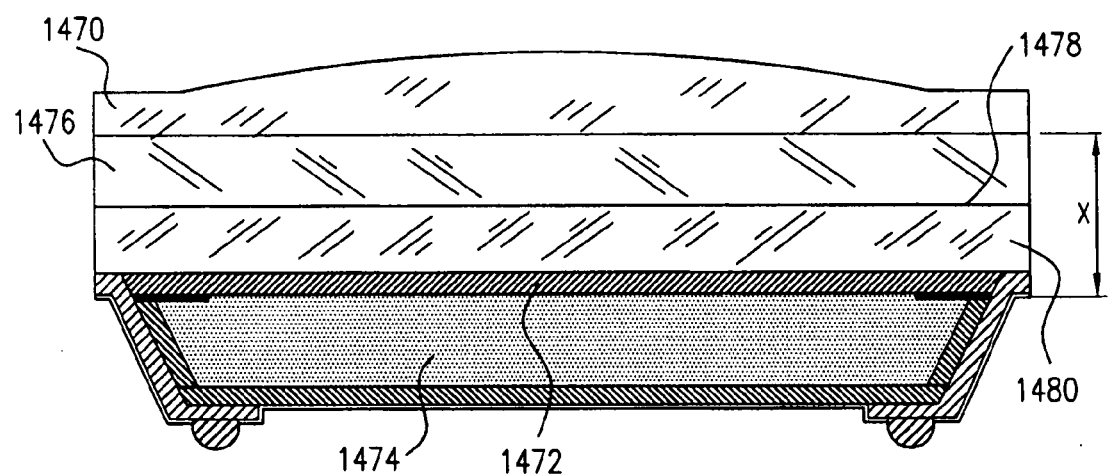
FIG. 30C is a simplified pictorial illustration of an embodiment of an integrally packaged optronic integrated circuit device constructed and operative in accordance with yet another preferred embodiment of the present invention wherein a lens is integrated with the integrally packaged optronic integrated circuit device at a fixed distance from the active surface thereof.

Reference is now made to FIG. 30C. The embodiment of FIG. 30C may be identical to that of FIG. 27A with or without the coating and is distinguished therefrom in that it has a substrate formed with at least one lens 1470 which is maintained at a precisely fixed distance X with respect to an active surface 1472 of a silicon substrate 1474. The precisely fixed distance may be determined to an accuracy of 1–10 microns, preferably by precise machining of an intermediate light transmissive layer 1476 which is fixed between lens 1470 and an outer facing surface 1478 of a radiation transparent protective layer 1480. Alternatively intermediate layer 1476 may be obviated. As a further alternative, the distance between the lens 1470 and the active surface 1472 need not be precisely fixed.

Figure 30D:
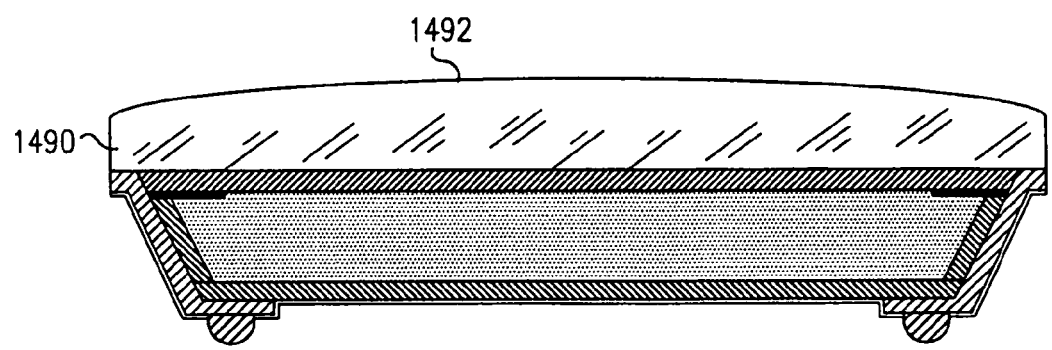
FIG. 30D is a simplified pictorial illustration of an embodiment of an integrally packaged optronic integrated circuit device constructed and operative in accordance with still another preferred embodiment of the present invention wherein at least one lens is integrated with the integrally packaged optronic integrated circuit device.

Reference is now made to FIG. 30D. The embodiment of FIG. 30D may be identical to that of FIG. 27A with or without the coating and is distinguished therefrom in that it has a radiation transparent protective layer 1490 including an outer laying surface 1492 which may comprise at least one lens.

Figure 31A:
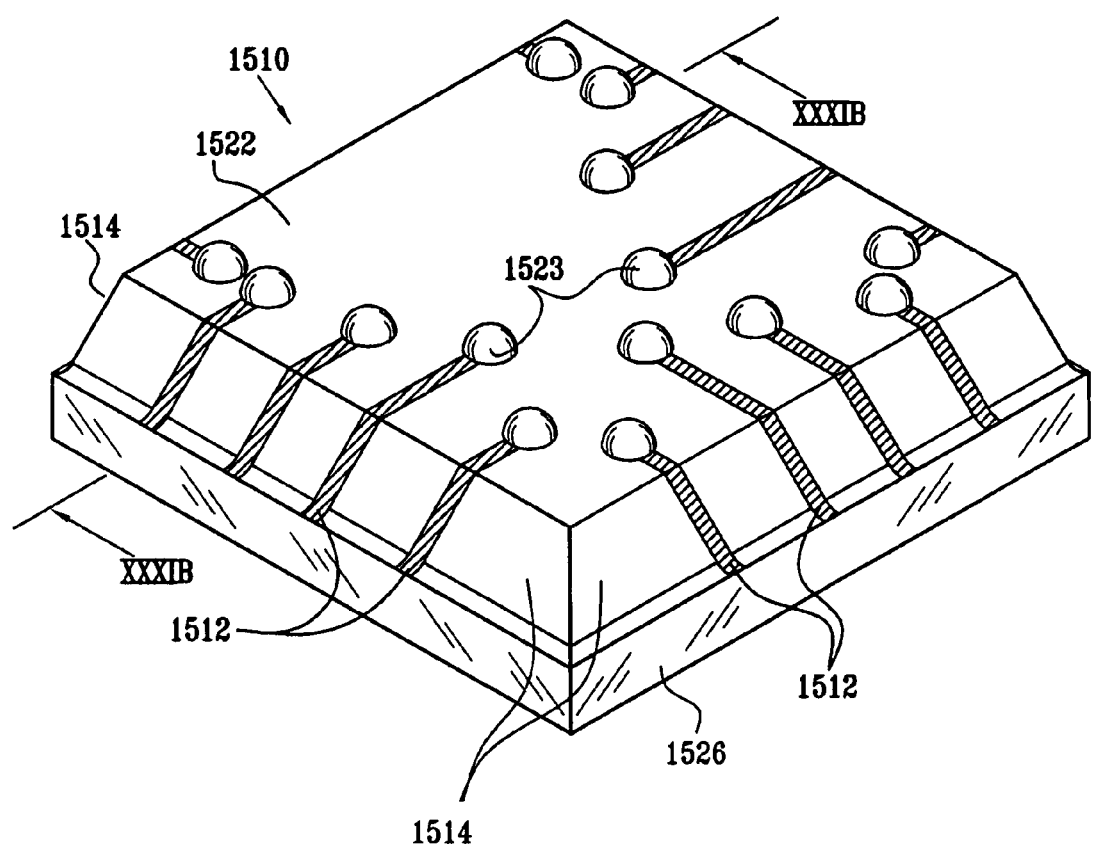
FIGS. 31A and 31B are, respectively, a simplified pictorial illustration and a simplified sectional illustration of an integrally packaged optronic integrated circuit device constructed and operative in accordance with a preferred embodiment of the present invention, the sectional illustration being taken along lines XXXIB—XXXIB in FIG. 31A.

Reference is now made to FIGS. 31A–33J, which illustrate integrated circuit devices, preferably optronic, integrated circuit devices, and the production thereof, in accordance with a preferred embodiment of the present invention. As seen in FIGS. 31A and 31B, the integrated circuit device includes a relatively thin and compact, environmentally protected and mechanically strengthened, integrated circuit package 1510, preferably an optronic integrated circuit package, having a multiplicity of electrical conductors 1512 plated along the edge surfaces 1514 thereof.

It is a particular feature of the present invention that conductors 1512 are electrically connected to pads 1516 at edges thereof and are formed directly over insulation layers 1518 and 1519 overlying a die 1520, without there being an intervening packaging layer, such as a glass layer. Insulation layers 1518 and 1519 may each comprise one or more layers and may be different from each other in materials and/or thickness or alternatively may be identical. As a further alternative, insulation layers 1518 and 1519 may be obviated. The embodiments of FIGS. 31A–40C are all characterized additionally in that a portion of conductor 1512 is in electrically conductive contact with an edge of pad 1516, as shown clearly in FIG. 31B.

Figure 31B:
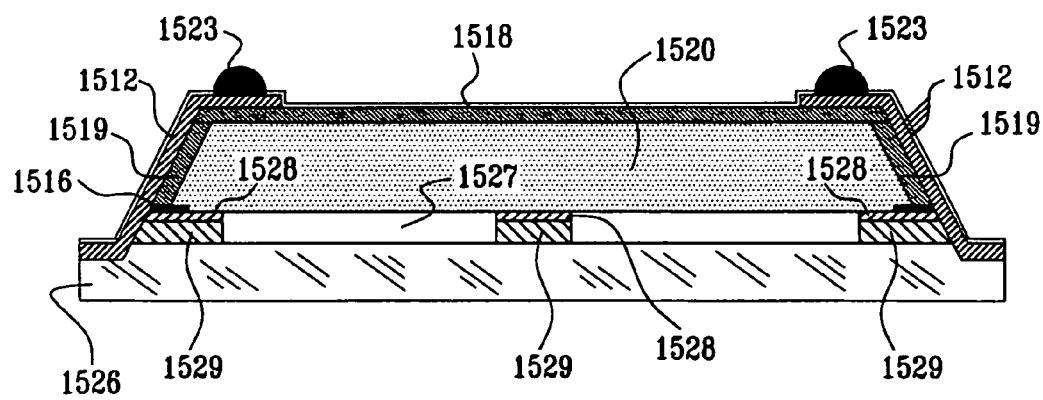

In accordance with a preferred embodiment of the invention, conductors 1512 extend over edge surfaces 1514 onto a planar surface 1522 of the package 1510. This contact arrangement permits flat surface mounting of package 1510 onto a circuit board. It is noted that the integrated circuit package 1510 may include one or more of the following elements (not shown): an integrally formed dichroic filter, color filter, antireflective coating, polarizer, optical grating, integrated wave guide and optical coupling bumps in an optronic embodiment. In a non-optronic embodiment, the above elements are normally not present. As seen in FIGS. 31A and 31B, optronic integrated circuit package 1510 may also include contact bumps, such as solder balls 1523 formed on electrical conductors 1512, at apertures formed in a solder mask 1524 however, solder balls 1523 are not required.

Figure 31C:
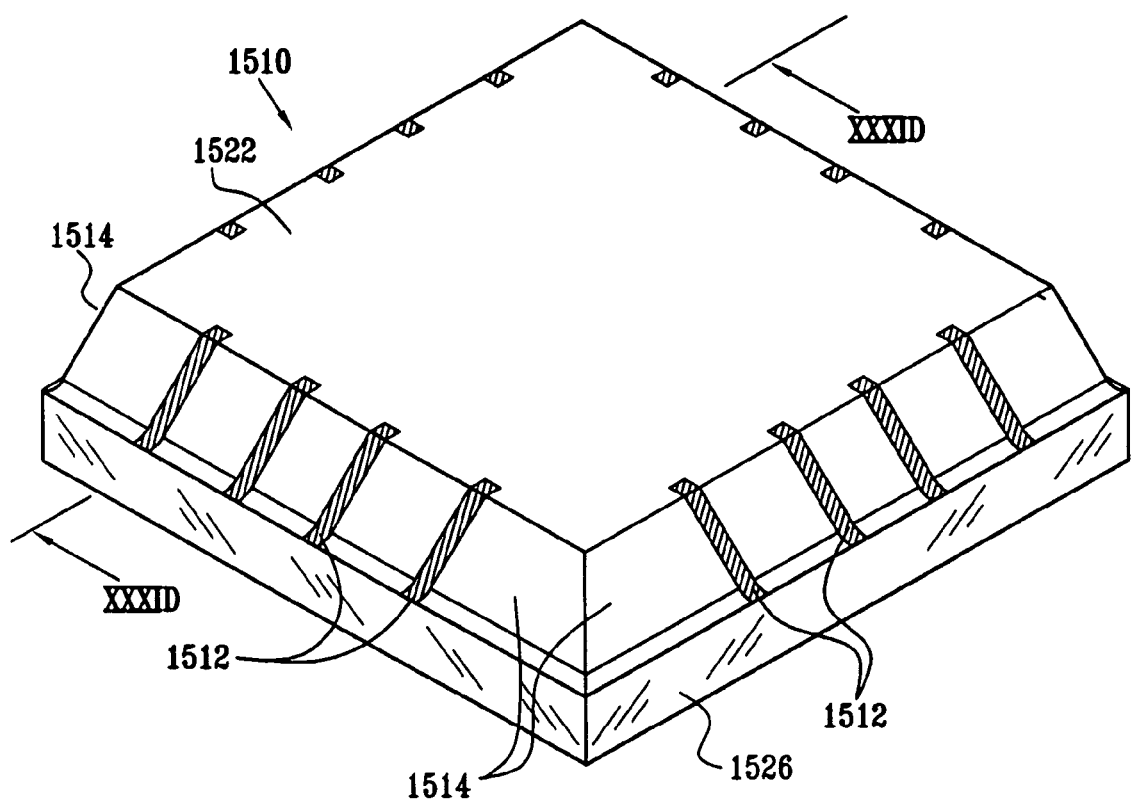
FIGS. 31C and 31D are, respectively, a simplified pictorial illustration and a simplified sectional illustration of an integrally packaged optronic integrated circuit device constructed and operative in accordance with another preferred embodiment of the present invention, the sectional illustration being taken along lines XXXID—XXXID in FIG.31C.
Figure 31D:
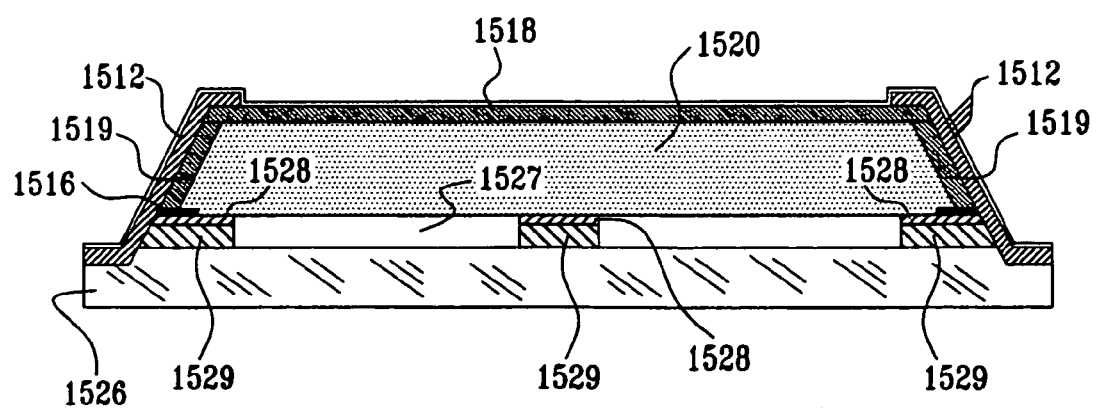

As a further alternative, as shown in FIGS. 31C and 31D, the conductors 1512 do not extend beyond edge surfaces 1514 onto planar surface 1522 or extend onto planar surface 1522 only to a limited extent, thereby defining peripheral contacts. In such a case, the solder mask 1524 normally does not extend onto planar surface 1522 or may be obviated entirely.

As an additional alternative, the solder balls 1523 may be replaced by contacts suitable for ACF engagement, or may comprise Ball Grid Array (BGA) contacts.

Insulation layers 1518 and 1519 may operate as mechanically conforming layers which are adapted to compensate for differences in thermal expansion coefficients of conductors 1512, solder balls 1523 and die 1520.

The preferably optronic integrated circuit package 1510, shown in FIGS. 31A and 31B, also preferably includes a radiation transparent protective insulating cover plate 1526.

The optronic integrated circuit package 1510, shown in FIGS. 31A and 31B, also includes at least one cavity 1527 formed between die 1520 and radiation transparent protective insulating cover plate 1526. Cavity 1527 is formed by mounting with at least one bonding layer 1528, such as an epoxy layer, at least one spacer 1529 between die 1520 and cover plate 1526, when attaching die 1520 to cover plate 1526, as described hereinbelow. Alternatively, cavity 1527 may be formed by inserting at least one attachable spacer element 1529 between die 1520 and cover plate 1526, when attaching die 1520 to cover plate 1526, as described hereinbelow. It is appreciated that spacer elements 1529 of any suitable thickness may be provided, by grinding or any other suitable method, such that cavity 1527 is defined to produce a specific fixed distance between cover plate 1526 and die 1520.

It is appreciated that the methods described hereinbelow provide optronic integrated circuit packages 1510 that are in the range defined as chip scale packages, typically no more than 20% larger in area than the size of the chip. It is also appreciated that the methods described hereinbelow provide optronic integrated circuit packages 1510 in which the packaging process is carried out at wafer level up to dicing of a wafer-wise package into separate packaged dies.

Figure 32A:
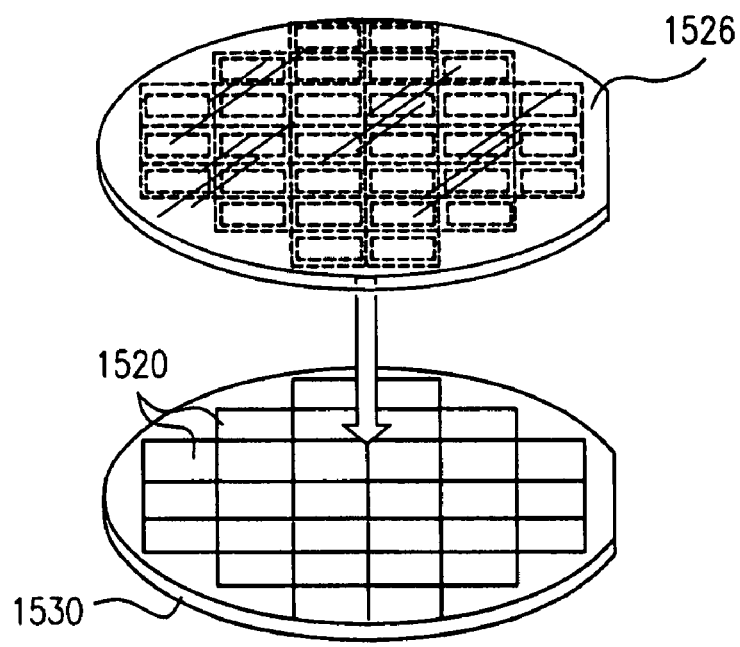
FIGS. 32A and 32B are simplified pictorial illustrations of the attachment of a transparent protective insulating cover plate to a wafer containing a plurality of integrated circuit dies in accordance with a preferred embodiment of the present invention.
Figure 32B:
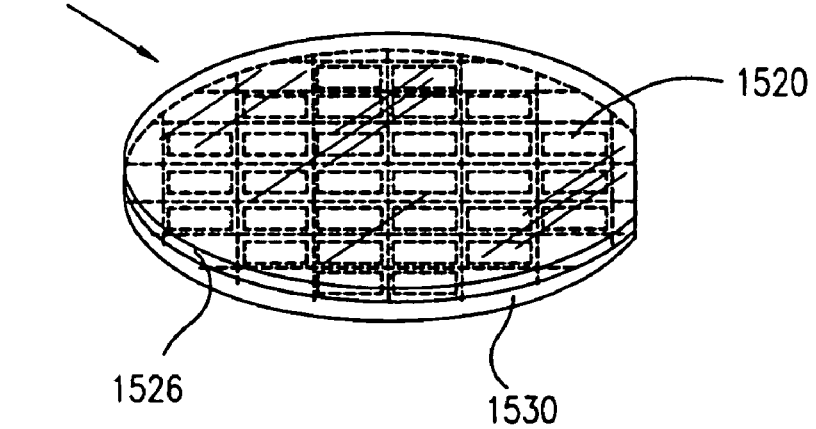
Figure 33A:
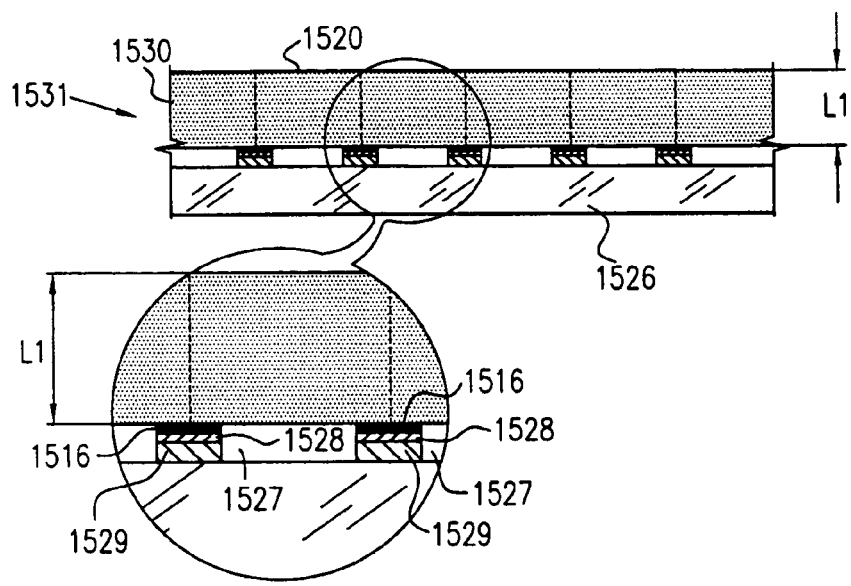

FIGS. 32A and 32B are simplified pictorial illustrations of the attachment of a transparent protective insulating cover plate to a wafer containing a plurality of integrated circuit dies in accordance with the present invention. As seen in FIGS. 32A and 32B, a silicon wafer 1530 includes a plurality of finished dies 1520, having active surfaces formed thereon by conventional techniques, and is bonded at the active surfaces to cover plate 1526, thereby defining a bonded wafer 1531. In accordance with a preferred embodiment of the present invention, as illustrated in FIG. 33A, wafer 1530, includes a plurality of finished dies, having active surfaces formed thereon by conventional techniques, and is bonded at the active surfaces to cover plate 1526 via bonding layer 1528, such as an epoxy layer. Cavities 1527 are formed between the wafer 1530 and the cover plate 1526 by mounting spacers 1529, by means of at least one bonding layer 1528, such as an epoxy layer, between wafer 1530 and cover plate 1526.

The insulating cover plate 1526 typically comprises glass, quartz, sapphire or any other suitable radiation transparent insulative substrate. As seen in FIG. 33A, electrical pads 1516 are formed on the active surfaces of silicon wafer 1530.

The cover plate 1526 may be colored or tinted in order to operate as a spectral filter. Alternatively, a dichroic or colored spectral filter may be formed on at least one surface of the cover plate 1526.

It is a particular feature of the present invention that cover plate 1526 and bonding layer 1528, such as an epoxy layer, are preferably transparent to radiation in a spectral region useful for optronic applications.

It is appreciated that certain steps in the conventional fabrication of silicon wafer 1530 may be eliminated when the wafer is used in accordance with the present invention. These steps include the provision of via openings above pads, wafer back grinding and wafer back metal coating.

The silicon wafer 1530 may be formed with an integral color filter array by conventional lithography techniques at any suitable location therein. Prior to the bonding step of FIG. 33A, a filter may be formed and configured by conventional techniques over the cover plate 1526, such that the filter plane lies between cover plate 1526 and at least one cavity 1527.

Figure 33B:
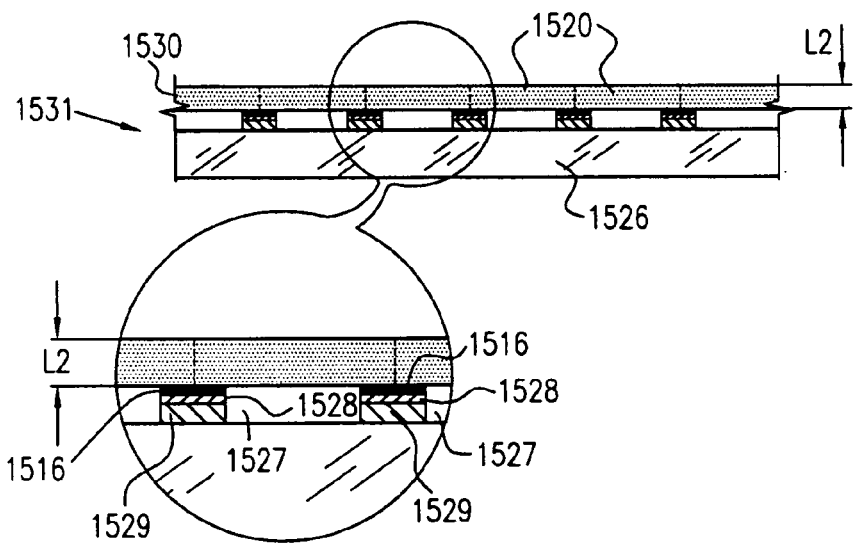

Following the bonding step described hereinabove, the silicon wafer 1530 is preferably ground down from an original thickness L1, typically in the range of 400 to 1000 microns, to a decreased thickness L2, typically 10–250 microns, as shown in FIG. 33B. This reduction in wafer thickness is enabled by the additional mechanical strength provided by the bonding thereto of the insulating cover plate 1526.

Figure 33C:
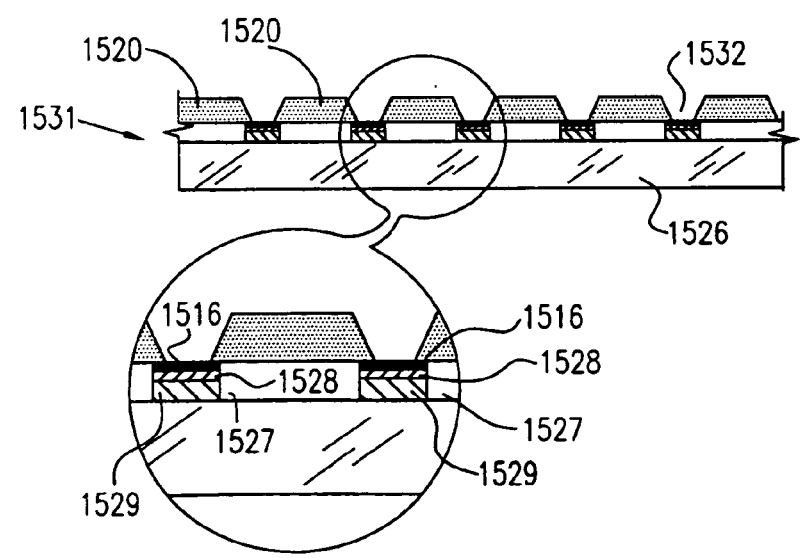

Following the reduction in thickness of the wafer, which is optional, the wafer is etched, using a photolithography process, along its back surface along predetermined dice lines that separate the individual dies 1520. Etched channels 1532 are thus produced, which extend entirely through the thickness of the silicon substrate, typically 10–250 microns. The etched bonded wafer is shown in FIG. 33C.

The aforementioned etching typically is achieved by a dry etching process using $SF_6$, $C_4F_8$ or other suitable dry etching gasses. Alternatively, the etching takes place in conventional silicon etching solution, such as a combination of 2.5% hydrofluoric acid, 50% nitric acid, 10% acetic acid and 37.5% water, so as to etch the silicon down through any field oxide layer to expose pads 1516, as shown in FIG. 33C. The result of the silicon etching is a plurality of separated dies 1520, each of which includes silicon of thickness about 10–250 microns.

As seen in FIG. 33D, etched channels 1532 are preferably filled with an insulation material defining insulating layer 1519, such as epoxy, solder mask, or any other suitable dielectric material, such as polyimide, BCB™, polyurethanes, polynaphthalenes, fluorocarbons or accrylates. Following the formation of insulation layer 1519, as seen in FIG. 33E, the surface of bonded wafer 1531 is ground to define a flat surface. Insulating layer 1518 is then formed thereover as seen in FIG. 33F.

The bonded wafer 1031 is then notched at filled channels 1532 to define notches 1536 between each pair of adjacent dies 1520, by any suitable method. Notches 1536 extend through insulation layers 1518 and 1519, through pads 1516 thereby exposing edges of pads 1516 and through bonding layer 1528, as seen in FIG. 33G. Notches 1536 may extend partially into protective layer 1526.

As seen in FIG. 33H, a conductive layer 1538 is formed over the plurality of separated dies 1520, through openings 1536 to cover the exposed portions of pads 1516 and the dielectric material defining insulation layers 1518 and 1519. Conductive layer 1538 is preferably formed of aluminum, or may be formed of any suitable conductive material or combination of materials, such as aluminum, copper, titanium, titanium tungsten, or chrome.

FIG. 33I shows patterning of the conductive layer 1538, typically by conventional photolithographic techniques, to define a plurality of conductors 1512 which electrically contact edges of one or more pads 1516 on dies 1520 and are appropriately plated.

FIG. 33J shows the bonded wafer being coated with a layer of protective material, preferably solder mask 1524 or other protective material such as parylene, BCB™, or polyamide, which is patterned to define apertures therein communicating with conductors 1512 through which are formed solder balls 1523 in electrical contact with conductors 1512, as shown in FIG. 33K.

In accordance with a preferred embodiment of the present invention, the bonded wafer is then diced, as shown in FIG. 33L, along lines 1540, to provide individual integrated circuit packages, similar to integrated circuit package 1510 of FIGS. 31A and 31B.

Reference is now made to FIG. 34, which is a partially cut away, detailed, pictorial illustration of an integrally packaged optronic integrated circuit device produced from the bonded wafer of FIG. 33L. As seen in FIG. 34, the integrated circuit package includes insulating cover plate 1526, joined by spacers 1529 and bonding layer 1528 to die 1520, and defining at least one cavity 1527. Edges of pads 1516 are in electrical contact with conductors 1512, which are directly formed over dielectric insulation layers 1518 and 1519, as described hereinabove. It is appreciated that insulation layers 1518 and 1519 may each comprise multiple layers.

Figure 35:
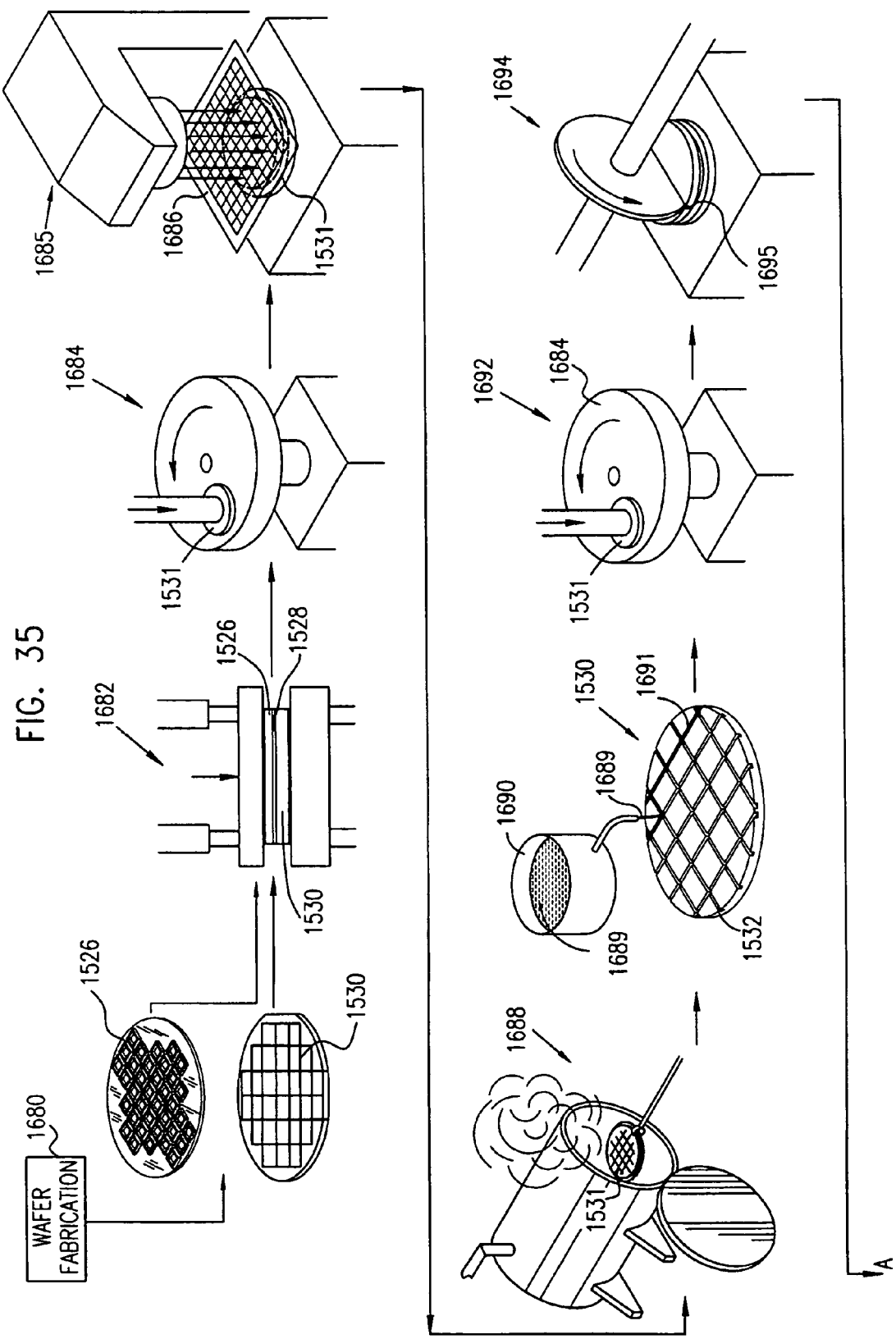

Reference is now made to FIGS. 35 and 36, which together illustrate apparatus for producing integrated circuit devices in accordance with a preferred embodiment of the present invention. A conventional wafer fabrication facility 680 provides wafers 1530. Each individual wafer 1530 is aligned and then bonded on the side defining active surfaces to a protective layer, such as glass layers, forming cover plate 1526, using bonding layer 1528, by bonding apparatus 1682, preferably having facilities for rotation of the wafer 1530, the cover plate 1526 and the bonding layer 1528 so as to obtain even distribution of the bonding material.

The bonded wafer (FIGS. 32B and 33A) is thinned at its non-active surface side as by grinding apparatus 1684, such as model BFG 841, which is commercially available from Disco Ltd. of Japan. The bonded wafer (FIG. 33B) is then etched at its non-active surface side, preferably by photolithography, such as by using conventional spin-coated photoresist, which is commercially available from Hoechst, under the brand designation AZ 4562.

The photoresist is preferably mask exposed by a suitable UV exposure system 1685, such as a Suss MicrTech AG, model MA200, through a lithography mask 1686.

The photoresist is then developed in a development bath (not shown), baked and the bonded wafer is then silicon etched typically by a dry etching process using $SF_6$, $C_4F_8$ or other suitable dry etching gasses. Commercially available equipment for this purpose include a dry etch machine 1688 manufactured by Surface Technology Systems of England.

Alternatively, the etching is achieved using a silicon etch solution located in a temperature controlled bath (not shown). Commercially available equipment for this purpose includes a Chemkleen bath and a WHRV circulator both of which are manufactured by Wafab Inc. of the U.S.A. A suitable wet etching conventional silicon etching solution is Isoform Silicon etch, which is commercially available from Micro-Image Technology Ltd. of England. The etched channels 1532 in wafer 1530 are preferably filled with insulation material 1689 (FIG. 33D), such as epoxy, solder mask, or any other suitable dielectric material, such as polyimide, BCB™, polyurethanes, polynaphthalenes, fluorocarbons or accrylates. The channels 1532 are filled using a dispenser 1690, to obtain filled channels 1691. Alternatively, any other suitable filling method may be used such as spin coating, spray coating or curtain coating. Subsequently, as seen in step 1692, the bonded wafer 1531 is once again ground to define a flat surface as by grinding apparatus 1684, such as model BFG 841, which is commercially available from Disco Ltd. of Japan (FIG. 33E).

As seen in step 1694, notching apparatus 1695, such as model 641 or 341, which is commercially available from Disco Ltd. of Japan, partially cuts away the bonded wafer sandwich (FIG. 33G).

Following notching, the notched wafer is optionally subjected to anti-corrosion treatment in a bath 1696, containing a chromating solution 1698, such as described in any of the following U.S. Pat. Nos. 2,507,956; 2,851,385 and 2,796,370, the disclosure of which is hereby incorporated by reference.

Conductive layer deposition apparatus 1700, which operates by vacuum deposition techniques, such as a sputtering machine manufactured by Balzers AG of Liechtenstein, is employed to produce conductive layer 1538 (FIG. 33H) on one or more surfaces of each die 1520 of the wafer 1530.

Configuration of conductors 1512, as shown in FIG. 33I, is carried out preferably by using conventional electro-deposited photoresist, which is commercially available from DuPont under the brand name Primecoat or from Shipley, under the brand name Eagle. The photoresist is applied to the bonded wafers in a photoresist bath assembly 1702, which is commercially available from DuPont or Shipley.

The photoresist is preferably light configured by a UV exposure system 1704, using a mask 1705 to define suitable etching patterns. The photoresist is then developed in a development bath 1706, and then etched in a metal etch solution 1708 located in an etching bath 1710, thus providing a conductor configuration such as that shown in FIGS. 31A and 31B.

The exposed conductive strips shown in FIG. 33I are then plated, preferably by an electroless plating apparatus 1712, which is commercially available from Okuno of Japan.

Following plating of the conductive strips, the bonded wafer is then coated with a solder mask as indicated at reference numeral 1714 to define locations (FIG. 33J) of solder balls 1523, which are then formed in a conventional manner, as indicated at reference numeral 1715 (FIG. 33K). Alternatively, the balls 1523 may not be required.

Figure 37A:
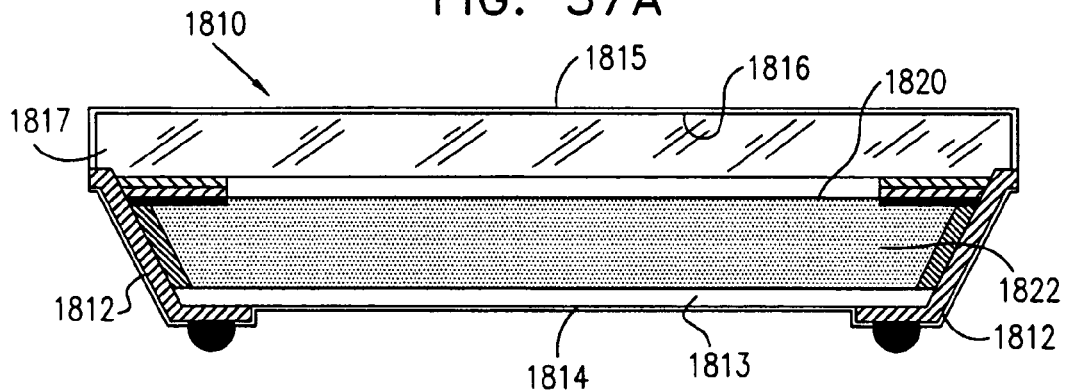
FIGS. 37A, 37B and 37C are simplified pictorial illustrations of three alternative embodiments of an integrally packaged optronic integrated circuit device constructed and operative in accordance with yet another preferred embodiment of the present invention and including spectral filters and/or anti-reflective coatings.
Figure 37B:
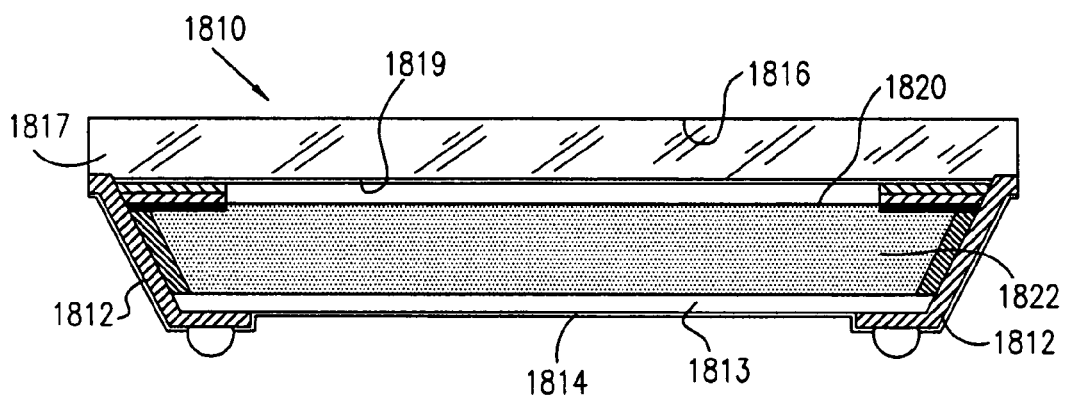
Figure 37C:
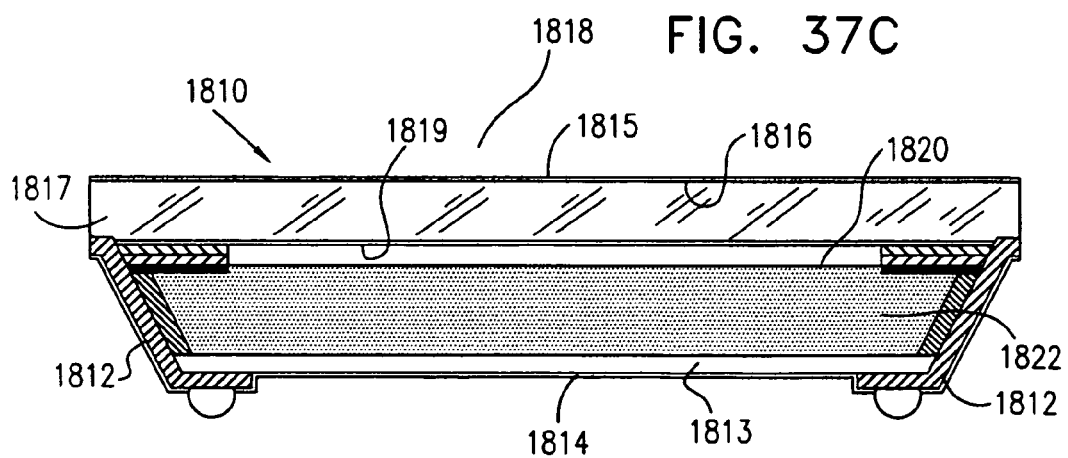

The bonded wafer is then diced into individual pre-packaged integrated circuit devices by a dicing blade 1716 (FIG. 33L). Preferably, dicing blade 1716 is a diamond resinoid blade of thickness 2–12 mils. The resulting dies appear as illustrated generally in FIGS. 31A and 31B. Reference is now made to FIGS. 37A–37C, which illustrate three alternative preferred embodiments of optronic integrated circuit devices, constructed and operative in accordance with a preferred embodiment of the present invention, including a relatively thin and compact, environmentally protected and mechanically strengthened optronic integrated circuit package 1810 having a multiplicity of electrical conductors 1812 plated directly over one or more insulation layers 1813 without an intervening packaging layer. A solder mask 1814 is preferably formed over conductors 1812 and insulation layer 1813 as shown. FIG. 37A shows a dichroic filter and/or polarizer and/or anti-reflective coating and/or IR coating and/or color filter, such as an RGB or masking filter 1815 formed on at least a portion of at least one outer facing surface 1816 of a radiation transparent protective layer 1817. Outer laying surface 1816 may optionally include a top surface or an edge surface of radiation transparent protective layer 1817. FIG. 37B illustrates a coating 1818, which may be identical to coating 1815, which is formed on at least a portion of an inner facing surface 1819 of radiation transparent protective layer 1817. FIG. 37C shows both coatings 1815 and 1818 on at least a portion of each of respective surfaces 1816 and 1819 of radiation transparent protective layer 1817. In all three embodiments shown in FIGS. 37A–37C, optronic components are formed on a surface 1820 of a silicon substrate 1822 of conventional thickness, typically 10–250 microns. Surface 1820 faces transparent protective layer 1817. A radiation transparent bonding layer 1828, such as an epoxy layer is used to attach protective layer 1817 to the silicon substrate 1822, as described hereinabove.

The optronic integrated circuit package 1810, shown in FIGS. 37A, 37B and 37C, also includes at least one cavity 1827 formed between silicone substrate 1822 and radiation transparent protective layer 1817. Cavity 1827 is formed by mounting with at least one bonding layer 1828, such as an epoxy layer, at least one spacer 1829 between silicone substrate 1822 and radiation transparent protective layer 1817, when attaching silicone substrate 1822 to radiation transparent protective layer 1817, as described hereinbelow. Alternatively, cavity 1827 may be formed by inserting at least one spacer 1829 between silicone substrate 1822 and radiation transparent protective layer 1817, when attaching silicone substrate 1822 to radiation transparent protective layer 1817, as described hereinbelow. It is appreciated that spacer elements 1829 of any suitable thickness may be provided, by grinding or any other suitable method, such that cavity 1827 is defined to produce a specific fixed distance between radiation transparent protective layer 1817 and silicone substrate 1822.

Figure 38:
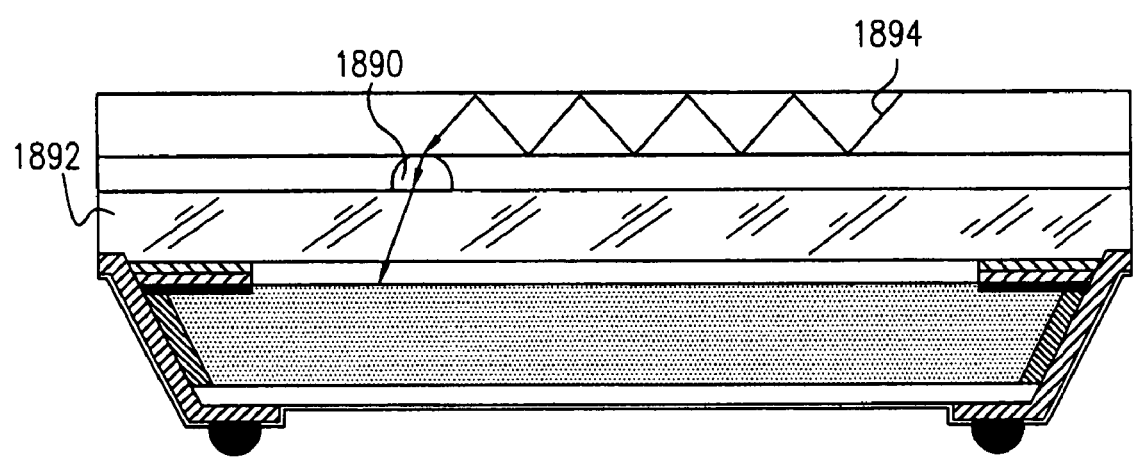
FIGS. 38 and 39 are simplified pictorial illustrations of two alternative embodiments of an integrally packaged optronic integrated circuit device constructed and operative in accordance with another preferred embodiment of the present invention having a waveguide and other optical components integrally formed on a transparent protective surface thereof.

Reference is now made to FIG. 38. The embodiment of FIG. 38 may be identical to that of FIG. 37A with or without the coating and is further distinguished therefrom in that it has a light coupling bump 1890 formed on a radiation transparent protective layer 1892. A waveguide 1894 is shown optically coupled to the radiation transparent protective layer 1892 via bump 1890. Preferably the bump 1890 is formed of a transparent organic material, which is somewhat conforming, such that mechanical pressure thereon produces a slight deformation thereof and enables an evanescent light wave to pass through an interface defined therewith.

Figure 39:
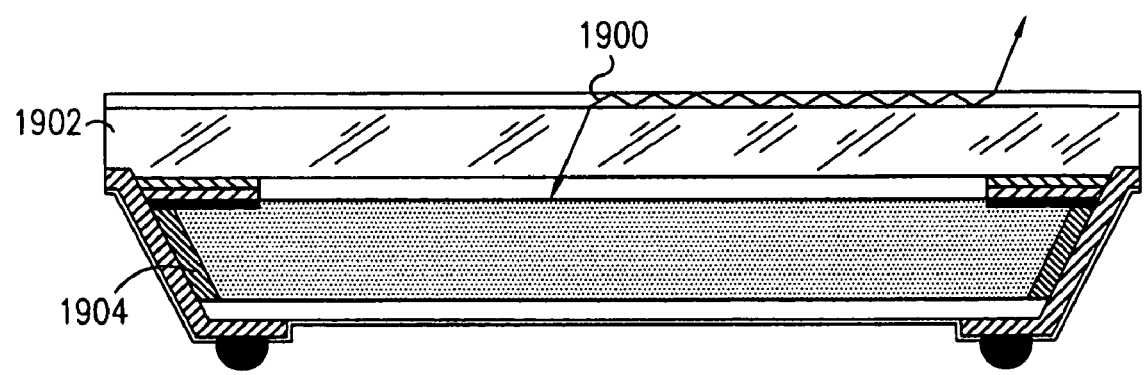

Reference is now made to FIG. 39. The embodiment of FIG. 39 may be identical to that of FIG. 37A with or without the coating and is distinguished therefrom in that it has a wave guide 1900 and possibly other optical elements (not shown) formed on a radiation transparent protective layer 1902, as by conventional integrated optics techniques. This arrangement enables optical communication between an optronic component formed on a silicon substrate 1904 via the radiation transparent protective layer 1902 and the wave guide 1900.

Figure 40A:
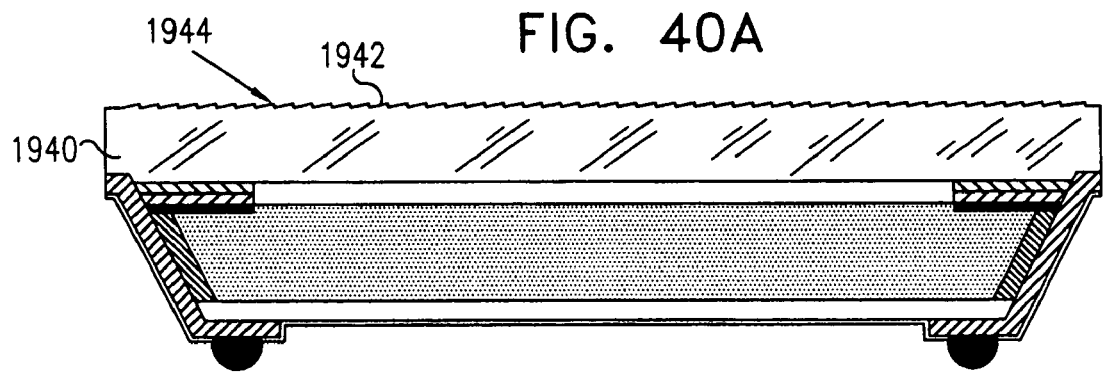
FIG. 40A is a simplified pictorial illustration of an embodiment of an integrally packaged optronic integrated circuit device constructed and operative in accordance with still another preferred embodiment of the present invention wherein an optical grating is integrated with the integrally packaged optronic integrated circuit device.

Reference is now made to FIG. 40A. The embodiment of FIG. 40A may be identical to that of FIG. 37A with or without the coating and is distinguished therefrom in that it has a radiation transparent protective layer 1940 which is formed with an optical grating 1942 on an outer facing surface 1944 thereof.

Figure 40B:
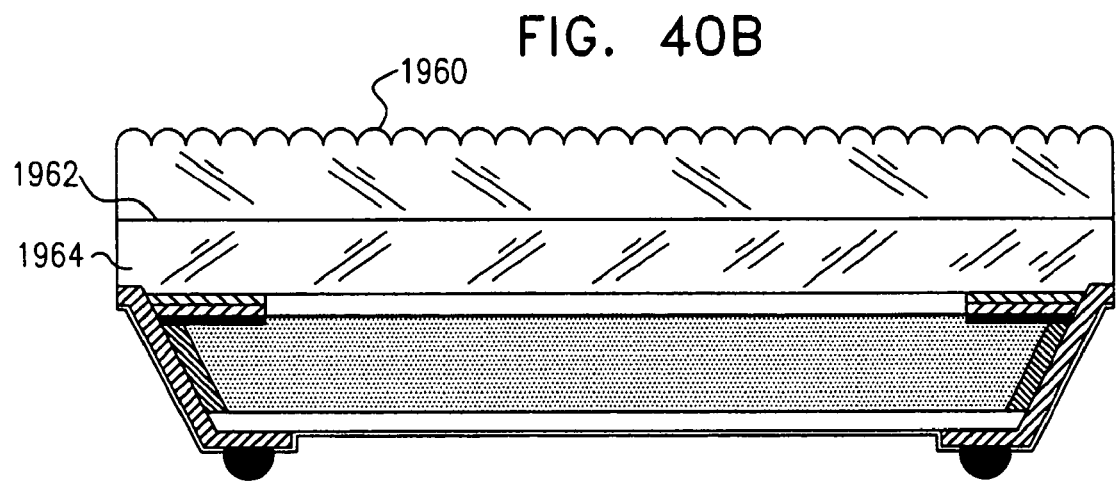
FIG. 40B is a simplified pictorial illustration of an embodiment of an integrally packaged optronic integrated circuit device constructed and operative in accordance with still another preferred embodiment of the present invention wherein at least one lens is integrated with the integrally packaged optronic integrated circuit device.

Reference is now made to FIG. 40B. The embodiment of FIG. 40B may be identical to that of FIG. 37A with or without the coating and is distinguished therefrom in that it has a substrate formed with at least one lens and preferably an array 1960 of microlenses attached on an outer facing surface 1962 of a radiation transparent protective layer 1964. It is appreciated that the at least one lens may be attached to radiation transparent protective layer 1964 before the radiation transparent protective layer is adhered to the substrate, or at any subsequent point in the process. As a further alternative, the outer surface 1962 of radiation transparent protective layer 1964 may comprise at least one lens.

Figure 40C:
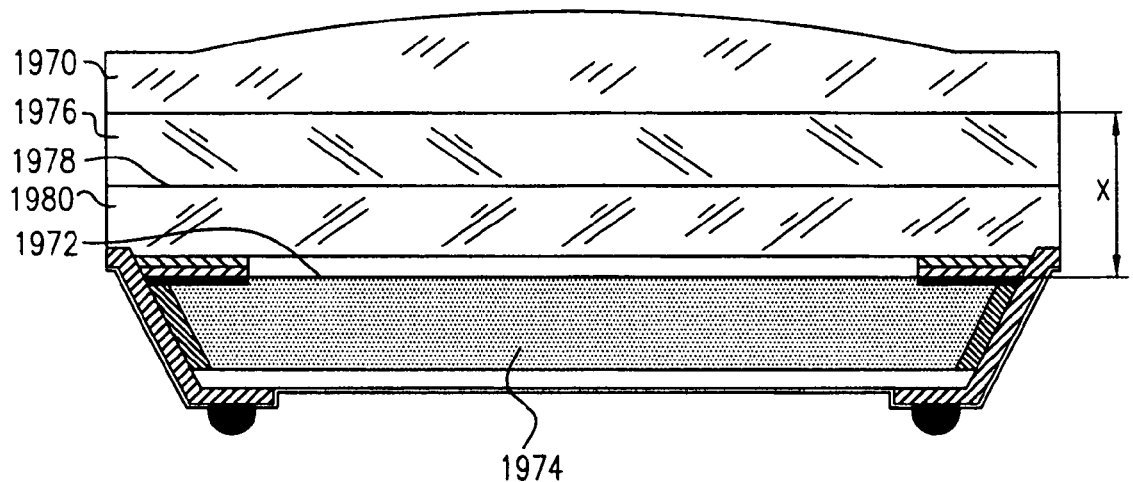
FIG. 40C is a simplified pictorial illustration of an embodiment of an integrally packaged optronic integrated circuit device constructed and operative in accordance with yet another preferred embodiment of the present invention wherein a lens is integrated with the integrally packaged optronic integrated circuit device at a fixed distance from the active surface thereof.

Reference is now made to FIG. 40C. The embodiment of FIG. 40C may be identical to that of FIG. 37A with or without the coating and is distinguished therefrom in that it has a substrate formed with at least one lens 1970 which is maintained at a precisely fixed distance X with respect to an active surface 1972 of a silicon substrate 1974, preferably with respect to the optronic semiconductor circuitry. The precisely fixed distance may be determined to an accuracy of 1–10 microns, preferably by precise machining of spacer 1529 and/or of an intermediate light transmissive layer 1976 which is fixed between lens 1970 and an outer facing surface 1978 of a radiation transparent protective layer 1980. Alternatively intermediate layer 1976 may be obviated. As a further alternative, the distance between the lens 1970 and the active surface 1972 need not be precisely fixed.

Figure 40D:
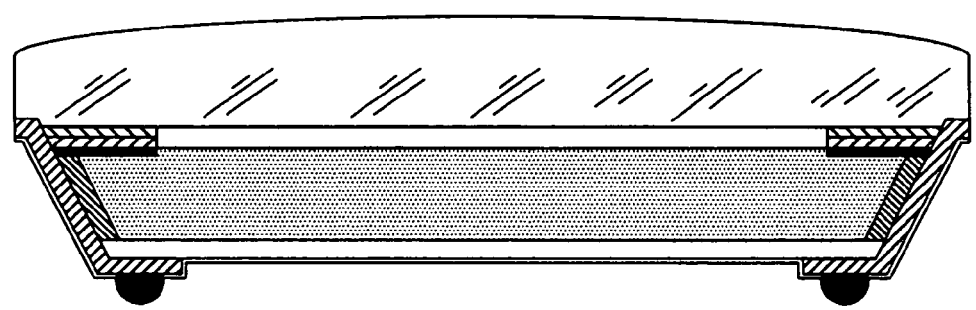
FIG. 40D is a simplified pictorial illustration of an embodiment of an integrally packaged optronic integrated circuit device constructed and operative in accordance with still another preferred embodiment of the present invention wherein at least one lens is integrated with the integrally packaged optronic integrated circuit device.

Reference is now made to FIG. 40D. The embodiment of FIG. 40D may be identical to that of FIG. 37A with or without the coating and is distinguished therefrom in that it has a radiation transparent protective layer 1990 including an outer laying surface 1992 which may comprise at least one lens.

Figure 41A:
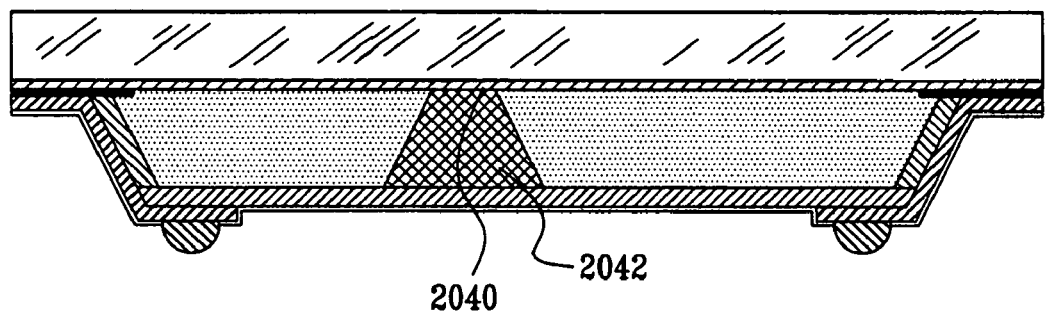
FIGS. 41A and 41B are simplified pictorial illustrations of integrally packaged optronic integrated circuit devices constructed and operative in accordance with still another preferred embodiment of the present invention, wherein a trench is created between different elements on the integrated circuit device.
Figure 41B:
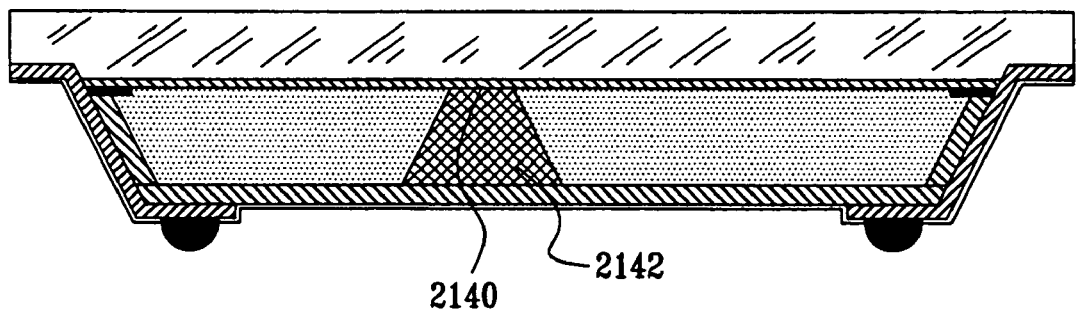

Reference is now made to FIGS. 41A and 41B, which are simplified illustrations of integrally packaged optronic integrated circuit devices constructed and operative in accordance with still another preferred embodiment of the present invention, wherein a trench 2040 or 2140 (in FIGS. 41A and 41B respectively) is created between different elements on the integrated circuit die.

In order to reduce cross talk between different elements on the silicon substrate it is necessary to make a physical separation between these elements. This separation could be done by total removal of the silicon creating a trench between these elements. This trench may be filled by any suitable material, such as epoxy 2042 or 2142 (in FIGS. 41A and 41B respectively). An example of such a separation is the separation between an analogue (radio) and digital (microprocessor) part of the integrated circuit.

It will be appreciated by persons skilled in the art that the present invention is not limited to what has been particularly shown and described hereinabove. Rather the scope of the present invention includes both combinations and subcombinations of the various features described hereinabove as well as modifications and variations thereof as would occur to a person of skill in the art upon reading the foregoing specification and which are not in the prior art.

The invention claimed is:

1. A method of producing integrally packaged optronic integrated circuit devices comprising:
   providing a plurality of integrated circuit dies formed on a wafer having first and second generally planar surfaces and optronic semiconductor circuitry formed over said first generally planar surface;
   forming at least one chip scale packaging layer over said semiconductor circuitry and said first generally planar surface;
   separating said integrated circuit dies from each other along dice lines defined in said second generally planar surface, so as to define edge surfaces of said dies while said dies remain attached to said packaging layer;
   forming at least one electrical conductor overlying said second generally planar surface, said at least one electrical conductor being connected to said circuitry by at least one pad formed directly on said first generally planar surface, wherein the at least one pad comprises a projecting portion that extends beyond a corresponding one of the edge surfaces and wherein the at least one electrical conductor contacts the projecting portion; and
   subsequently dicing said wafer to define a plurality of packaged optronic integrated circuit devices.

2. A method of producing integrally packaged optronic integrated circuit devices according to claim 1 and wherein said at least one chip scale packaging layer is formed of at least one of glass, quartz and sapphire.

3. A method of producing integrally packaged optronic integrated circuit devices according to claim 1 also comprising forming an insulation layer over said second generally planar surface and said edge surfaces and underlying said at least one electrical conductor.

4. A method of producing integrally packaged optronic integrated circuit devices according to claim 3 and wherein said insulation layer comprises a mechanically conforming layer.

5. A method of producing integrally packaged optronic integrated circuit devices according to claim 1 wherein said forming at least one electrical conductor comprises forming a portion of said at least one electrical conductor generally parallel to and in touching electrical engagement with a planar surface of said at least one pad.

6. A method of producing integrally packaged optronic integrated circuit devices according to claim 1 wherein said forming at least one electrical conductor comprises forming a portion of said at least one electrical conductor to be in touching electrical engagement with an edge of said at least one pad.

7. A method of producing integrally packaged optronic integrated circuit devices according to claim 1 wherein said forming at least one chip scale packaging layer comprises adhering said at least one chip scale packaging layer to said first generally planar surface using a bonding layer.

8. A method of producing integrally packaged optronic integrated circuit devices according to claim 7 and wherein said bonding layer has spectral filter functionality.

9. A method of producing integrally packaged optronic integrated circuit devices according to claim 1 and wherein said forming said chip scale packaging layer also comprises forming at least one spectral filter on at least a portion of a radiation transparent protective surface of said chip scale packaging layer.

10. A method of producing integrally packaged optronic integrated circuit devices according to claim 9 and wherein said radiation transparent protective surface comprises at least one of a top surface and an edge surface.

11. A method of producing integrally packaged optronic integrated circuit devices according to claim 1 and wherein said forming said chip scale packaging layer also comprises forming color array filters on said chip scale packaging layer.

12. A method of producing integrally packaged optronic integrated circuit devices according to claim 1 and wherein said forming said chip scale packaging layer also comprises integrally forming at least one lens on a radiation transparent protective surface of said chip scale packaging layer.

13. A method of producing integrally packaged optronic integrated circuit devices according to claim 1 and wherein said forming at least one chip scale packaging layer comprises forming at least one lens.

14. A method of producing integrally packaged optronic integrated circuit devices according to claim 1 and also comprising integrally forming at least one lens on a radiation transparent protective surface of said chip scale packaging layer.

15. A method of producing integrally packaged optronic integrated circuit devices according to claim 12 and wherein said forming said at least one lens comprises maintaining said at least one lens at a precisely fixed distance with respect to said optronic semiconductor circuitry.

16. A method of producing integrally packaged optronic integrated circuit devices according to claim 13 and wherein said forming said at least one lens comprises maintaining said at least one lens at a precisely fixed distance with respect to said optronic semiconductor circuitry.

17. A method of producing integrally packaged optronic integrated circuit devices according to claim 14 and wherein said forming said at least one lens comprises maintaining said at least one lens at a precisely fixed distance with respect to said optronic semiconductor circuitry.

18. A method of producing integrally packaged optronic integrated circuit devices according to claim 1 and wherein said forming said chip scale packaging layer also comprises forming light coupling bumps on a radiation transparent protective surface of said chip scale packaging layer.

19. A method of producing integrally packaged optronic integrated circuit devices according to claim 1 and wherein said forming said chip scale packaging layer also comprises forming a waveguide and other optical components on a radiation transparent protective surface of said chip scale packaging layer.

20. A method of producing integrally packaged optronic integrated circuit devices according to claim 1 and wherein said forming said chip scale packaging layer also comprises forming an optical grating on a radiation transparent protective surface of said chip scale packaging layer.

21. A method of producing integrally packaged optronic integrated circuit devices according to claim 1 and wherein said forming said chip scale packaging layer also comprises integrally forming a polarizer thereon.

22. A method of producing integrally packaged optronic integrated circuit devices according to claim 1 and also comprising forming a trench between different elements on the integrated circuit die.

23. A method of producing integrally packaged optronic integrated circuit devices according to claim 1 and also comprising inserting a spacer element over said semiconductor circuitry and said first generally planar surface prior to said forming said chip scale packaging layer.

* * * * *